United States Patent [19]
Kan et al.

[11] Patent Number: 5,574,438
[45] Date of Patent: Nov. 12, 1996

[54] METHOD FOR TRANSFERRING INFORMATION, AND IN PARTICULAR FOR PERFORMING A LOGIC OPERATION, USING ELECTRON BEAMS

[75] Inventors: Fumitaka Kan, Tokyo; Kenji Nakamura, Hadano; Masanori Takenouchi, Atsugi; Naoji Hayakawa, Yokohama; Isamu Shimoda, Zama; Masahiko Okunuki, Tokyo, all of Japan

[73] Assignee: Canon Kabushiki Kaisha, Tokyo, Japan

[21] Appl. No.: 242,236

[22] Filed: May 13, 1994

Related U.S. Application Data

[62] Division of Ser. No. 902,783, Jun. 24, 1992, Pat. No. 5,355,127, which is a continuation of Ser. No. 64,299, Jun. 19, 1987, abandoned.

[30] Foreign Application Priority Data

| Jun. 23, 1986 | [JP] | Japan | 61-144735 |
|---|---|---|---|
| Aug. 15, 1986 | [JP] | Japan | 61-191851 |
| Aug. 15, 1986 | [JP] | Japan | 61-191852 |
| Aug. 15, 1986 | [JP] | Japan | 61-191853 |
| Aug. 15, 1986 | [JP] | Japan | 61-191855 |
| Aug. 15, 1986 | [JP] | Japan | 61-191856 |
| Aug. 15, 1986 | [JP] | Japan | 61-191862 |
| Aug. 15, 1986 | [JP] | Japan | 61-191863 |
| Aug. 15, 1986 | [JP] | Japan | 61-191864 |

[51] Int. Cl.$^6$ .................................................. H04Q 1/00
[52] U.S. Cl. ............................... 340/825.97; 346/15 B; 365/118; 326/111
[58] Field of Search ..................... 340/825.97, 825.87; 326/111; 365/118, 217; 346/15 B

[56] References Cited

U.S. PATENT DOCUMENTS 3,001,712   9/1961   Horgan ............................ 326/111

*Primary Examiner*—Brian Zimmerman
*Attorney, Agent, or Firm*—Fitzpatrick, Cella, Harper & Scinto

[57] ABSTRACT

In a method for transferring information in a form of electron beam, an electron beam detector detects the electron beam, and emission of the electron beam from a predetermined electron beam source is controlled in accordance with a signal from the detector upon detection of the electron beam. A deflection electrode is also used to deflect the electron beams according to an electric or magnetic field to perform charge shifting, logical additions, logical multiplications, image formation, and the like.

2 Claims, 46 Drawing Sheets

METHOD FOR TRANSFERRING INFORMATION, AND IN PARTICULAR FOR PERFORMING A LOGIC OPERATION, USING ELECTRON BEAMS

This application is a division of application Ser. No. 07/902,783, filed Jun. 24, 1992, now U.S. Pat. No. 5,355,127, which is a continuation of application Ser. No. 07/064,299, filed Jun. 19, 1987, now abandoned.

BACKGROUND OF THE INVENTION

1. Field of the Invention

The present invention relates to a method and apparatus for transferring information utilizing an electron beam and applications thereof.

More particularly, the present invention relates to a method using a plurality of memory units each with a solid-state electron beam source to transfer information between the plurality of memory units, and an information transfer apparatus comprising the plurality of memory units.

Furthermore, the present invention relates to a method and apparatus for performing logical calculations, an information shift apparatus, a memory device, and an image forming apparatus, utilizing the method for transferring information.

2. Related Background Art

A conventional memory unit utilizing an electron beam is a so-called BEAMOS memory as described in, for example, Applied Physics Letters, G. W. Ellis et al., Vol. 24, No. 9, 1974, P. 419. In this memory, a write electron beam is incident on a capacitor of a MOS (Metal Oxide Semiconductor) structure to accumulate positive holes in an insulating layer, and some of the accumulated positive holes are put out with a read electron beam, thereby reading out information.

In the information read mode, information is partially destroyed, and repetitive read access cannot be performed. In order to perform repetitive read access, rewriting is required. However, in order to obtain necessary information, it takes a long period of time. In addition, the stored information may be lost over a long period of time. Furthermore, when information is to be transferred between the memory units utilizing electron beams, or when a so-called shift register function for shifting information and a serial/parallel information conversion function is to be obtained, the pieces of information must be sequentially read out and written again, thus resulting in time-consuming, cumbersome operations. Therefore, a long operation time is required.

In the field of image processing which has been recently developed and applied in practice, identical calculations between the adjacent pixels must be performed for all pixels. In conventional calculation techniques, information must be read out from an image memory by units of pixels in the same manner as in logical calculations. The calculated results are stored again in the image memory, thus performing time-serial operations which require a long calculation time. Therefore, strong demand has arisen for a method of performing high-speed, parallel processing of all adjacent pixels.

In addition, in high-level two-dimensional parallel processing, logical operations between any two pieces of information in a two-dimensional information matrix are required. Demand has also arisen for a method of performing the above calculations.

SUMMARY OF THE INVENTION

The present invention has been made in consideration of the above situations, and has as its object to provide a high-speed method and apparatus for performing parallel information transfer.

It is another object of the present invention to provide an information transfer apparatus capable of performing various information conversion operations and information processing.

It is still another object of the present invention to provide a logic operation method and an apparatus using the same, and various apparatuses such as a logic operation apparatus, a memory device, and an image forming apparatus, all of which utilize a new and improved information transfer method.

In order to achieve the above objects of the present invention, there is provided a method of transferring information, comprising the steps of causing a detecting means to detect an electron beam and emitting the electron beam in a predetermined direction in response to a signal from the detecting means after the detection step is completed.

An information transfer apparatus according to the present invention includes an electron beam detecting means for detecting an electron beam, an electron beam source for supplying the electron beam, and a control means for controlling and driving the electron beam source on the basis of a signal from the detecting means.

In an embodiment to be described later, an apparatus having the electron beam detecting means, the electron beam source, and the driving means is used as a unit element. An apparatus having a plurality of unit elements is called a memory unit. The memory unit has an information transmission/reception function and a memory function.

A plurality of memory units are used, and electron beam information transfer is performed between the plurality of memory units, thereby performing high-speed information shift, logical operations and parallel transfer between a plurality of pieces of information.

BRIEF DESCRIPTION OF THE DRAWINGS

FIGS. 20A and 20B to FIGS. 22A and 22B are views for explaining the operations of the memory device shown in FIGS. 19A and 19B;

FIGS. 25A and 25B to FIGS. 27A and 27B are views for explaining the operations of the memory unit shown in FIG. 23;

FIGS. 30A and 30B to FIGS. 33A and 33B are views for explaining the operations of the memory device shown in FIGS. 29A and 29B;

DETAILED DESCRIPTION OF THE PREFERRED EMBODIMENTS

Figure 1A:
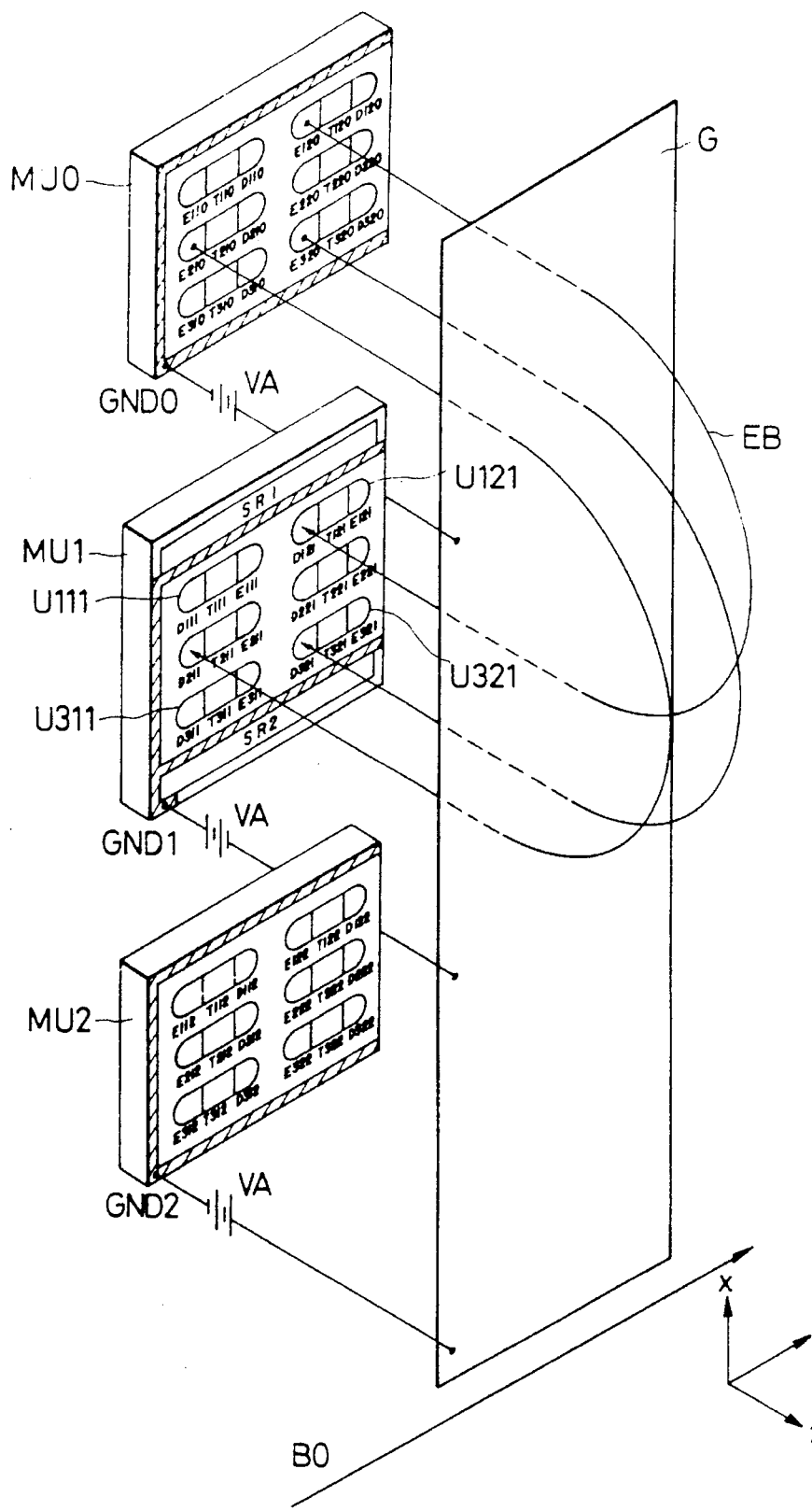
FIGS. 1A and 1B are schematic views showing an information transfer apparatus so as to explain an information transfer method according to an embodiment of the present invention.
Figure 1B:
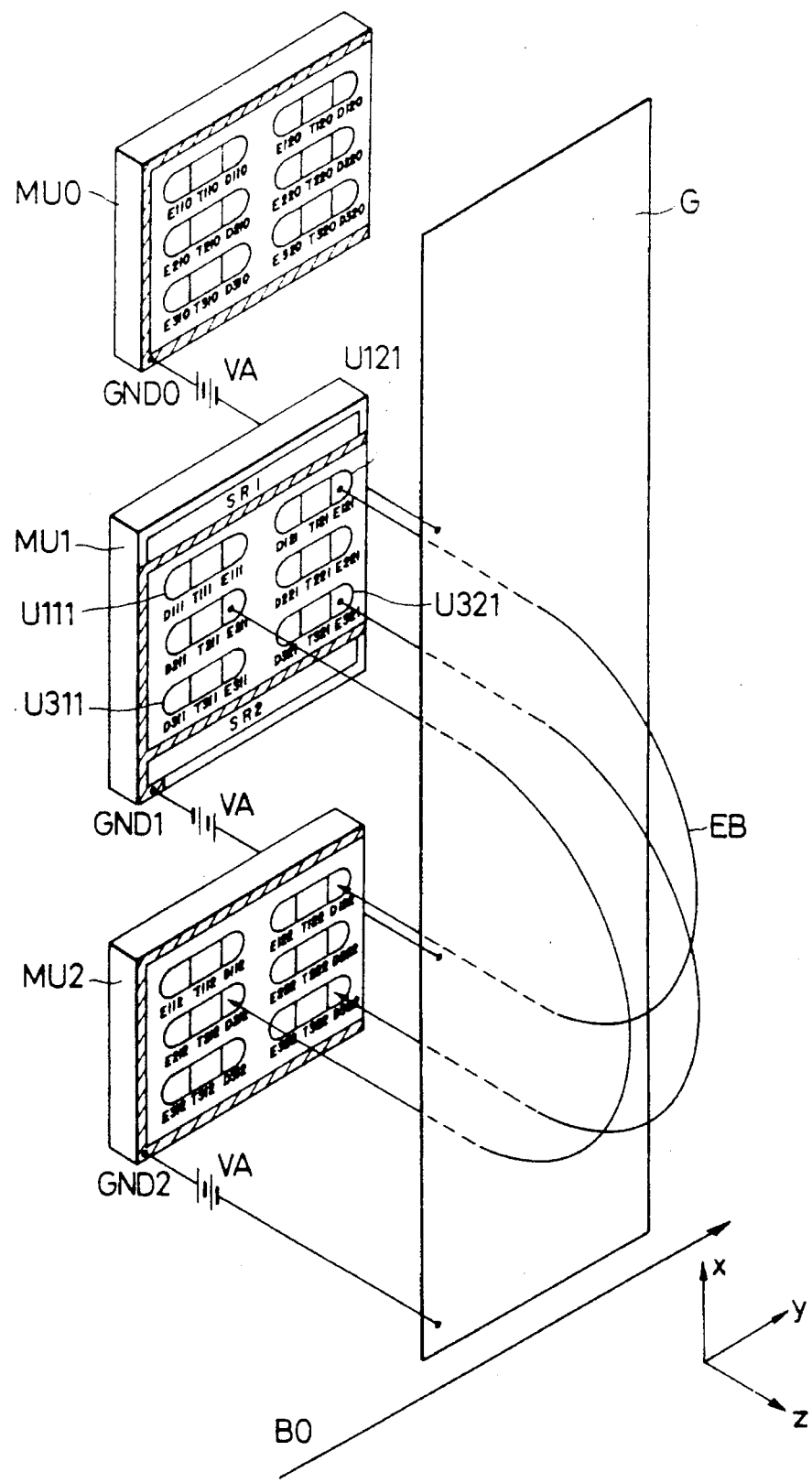

FIGS. 1A and 1B show an arrangement of an information transfer apparatus utilizing an electron beam according to an embodiment of a method of transferring information of the present invention.

Referring to FIGS. 1A and 1B, memory units MU0, MU1, and MU2 are sequentially arranged from the top to the bottom of the drawing while the units are spaced apart by predetermined distances.

Each of the memory units MU0, MU1, and MU2 comprise a plurality of unit elements U each consisting of an electron beam detecting means D, a driving means T, and an electron beam source E. For the sake of simplicity, each of the memory units MU0, MU1, and MU2 has a 3 (row)×2 (column) matrix. Each unit element U can be formed by semiconductor techniques such as epitaxial growth and photolithography and can be formed in a very high density. A shift register SR1 is arranged in the upper portion of the memory unit MU1, and a shift register SR2 is arranged in the lower portion of the memory unit MU1. A grid G having a large number of apertures is arranged to oppose the memory units MU0, MU1, and MU2 so that the electron beams EB can easily pass through the grid G. Power sources VA are respectively connected between the grid G and an acceleration electrode GND0 of the memory unit MU0, between the grid G and an acceleration electrode GND1 of the memory unit MU1 and between the grid G and an acceleration electrode GND2 of the memory unit MU2. A magnetic field generating means (not shown) is arranged to apply a magnetic field B0 in a y direction, i.e., in a direction perpendicular to the memory units MU0 to MU2, the grid G, and the electron beams EB passing from the memory unit MU0, MU1, and MU2 to the grid G.

Figure 2:
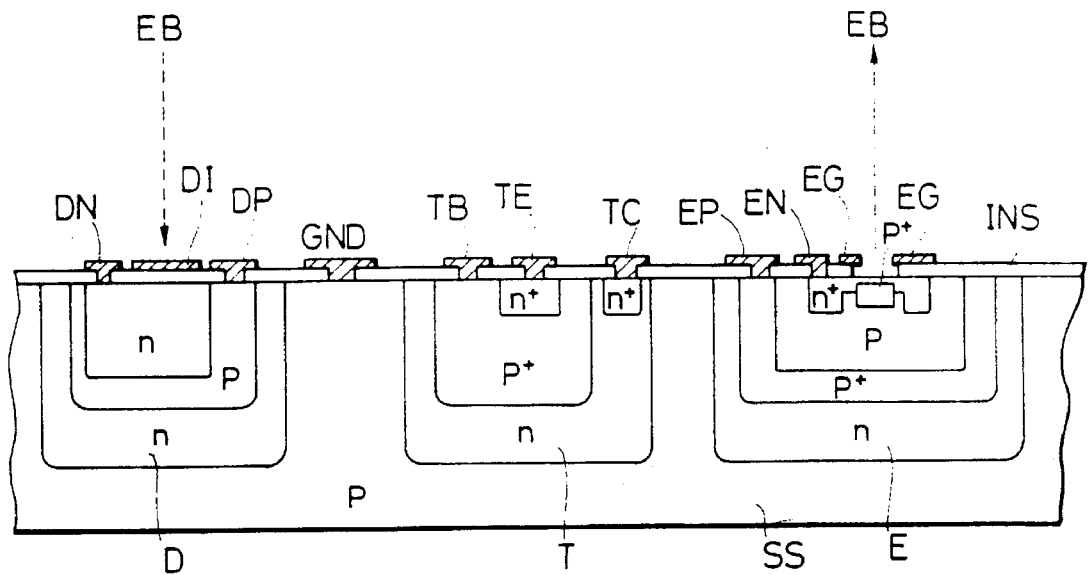
FIG. 2 is a sectional view showing a unit element of a memory unit in the apparatus shown in FIG. 1.

The unit element U arranged in the memory units MU0 to MU2 shown in FIGS. 1A and 1B will be described with reference to FIGS. 2 and 3. FIG. 2 is a sectional view of the unit element U. The unit element comprises the electron beam detecting means D, the driving means T, and the electron beam source E, all of which are constituted by p-n junctions. An insulating layer INS is formed on the surface of a substrate SS of a p-type semiconductor. Various electrodes are formed on the substrate SS through the insulating layer INS. A reference voltage electrode DN, a positive bias electrode DI, and a reverse bias electrode DP are formed in the electron beam detecting means D constituted by an n-p-n (an order named from the lower surface of the substrate SS) junction. An acceleration electrode GND (corresponding to GND0, GND1, or GND2 in FIGS. 1A and 1B) is formed on the substrate SS through an opening of the insulating layer INS. The driving means T formed in the substrate SS by an n-p$^+$-n$^+$ (an order named from the lower surface of the substrate SS) junction in the vicinity of the electron beam detecting means D. Electrodes TB, TE, and TC are formed in the driving means T. In addition, the electron beam source E constituted by an n-p$^+$-p-n$^+$ (an order named from the lower surface of the substrate SS) junction is formed next to the driving means T. Typical examples of the electron beam source E are solid-state electron beam sources disclosed in Japanese Patent Laid-Open Application No. 30274/1979, Japanese Patent Laid-Open Application No. 111272/1979 (U.S. Pat. Nos. 4,259,678 and 4,325,084), Japanese Patent Laid-Open Application No. 15529/1981 (U.S. Pat. No. 4,303,930), and Japanese Patent Laid-Open Application No. 38528/1982. The electron beam source E sets an electrode EN at a positive potential with respect to an electrode EP, i.e., applies a reverse-biased voltage to cause an avalanche effect, thereby generating electrons. A lead electrode EG is arranged such that the electrons are emitted in a vacuum from the opening upon an application of the positive voltage. Examples of the solid-state electron beam source utilizing the p-n junction are a negative work function type source, and other so-called field emission type sources, and a thermionic emission type source.

Figure 3:
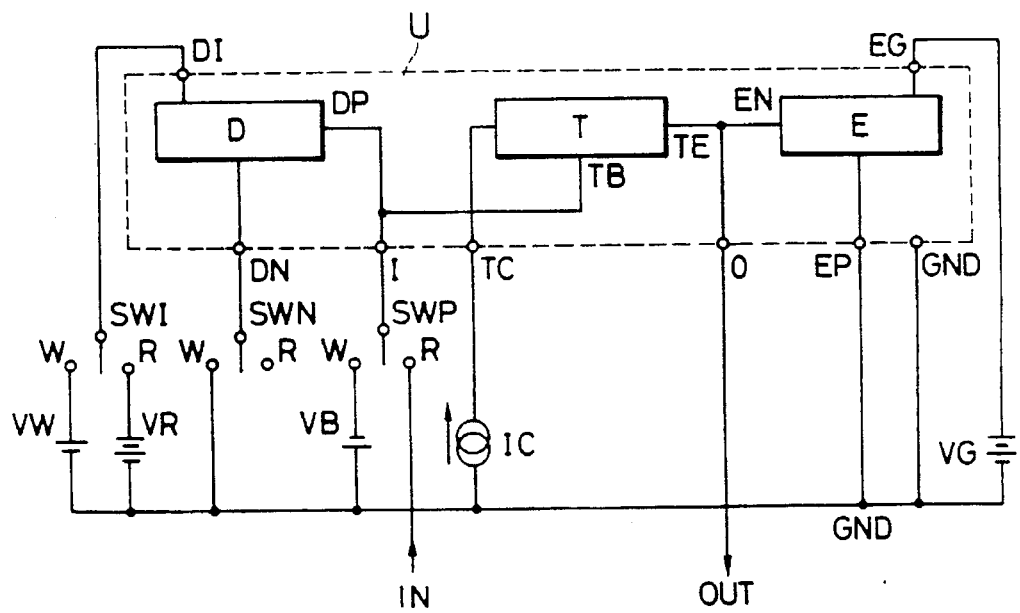
FIG. 3 is a block diagram of a drive unit for driving the element shown in FIG. 2.

FIG. 3 is a block diagram of a drive unit for driving the element described above. Switches SWI, SWN, and SWP are respectively connected to the electrodes DI, DN, and DP of the electron beam detecting means D. The write mode (to be referred to as a W mode herein-after) is set when the electron beam EB is incident on the electron beam detecting means D. The read mode (to be referred to as an R mode hereinafter) is set when the electron beam EB is emitted from the electron beam source E. In this case, write switch W and a read switch R are respectively arranged for each of the switches SWI, SWN, and SWP. A voltage VW is applied to the switch W corresponding to the switch SWI, and a voltage VR is applied to the switch R. The switches W and R corresponding to the switch SWN are not applied with a voltage. A negative voltage VB is applied to the switch W corresponding to the switch SWP. External information is input to the switch R corresponding to the switch SWP through an input terminal IN. The electrode TB in the driving means T is connected to the electrode DP in the electron beam detecting means D and can be connected to the switch W or R through the switch SWP. A current source IC is connected to the electrode TC in the driving means T. The electrode TE is connected to the electrode EN of the electron beam source E. Information can be extracted by the electrodes TE and EN at an output terminal OUT. The lead electrode EG of the electron beam source E is connected to a power source VG through a variable resistor RV (not shown). The electrode EP is connected to the acceleration electrode GND.

The W mode will be taken into consideration. The switches SWI, SWN, and SWP are set on the switch W sides. The positive voltage VW is applied as a bias voltage to the electrode DI using the voltage at the electrode DN as a reference voltage in the electron beam detecting means D. In this case, a reverse-biased voltage VB is applied to the electrode DP. No current is supplied in the path between the electrodes DN and DP since this path is reverse-biased.

The electron beam EB passes through the electrode DI to cause generation of electron-positive-hole pairs in the insulating layer INS. The positive holes in the electron-hole pairs are accumulated in the insulating layer INS near the interface between the insulating layer INS and the n-type layer. The charge accumulated as the positive holes is reserved relatively stably even if the electron beam EB is not emitted thereon. Since the reverse-biased voltage VB is applied to the electrode TB in the driving means T through the electrode DP in the same manner as in the electrode DP. The driving means T is maintained in the cutoff state, and the electron beam source E is kept inoperative.

In the R mode, the switches SWI, SWN, and SWP are connected to the switch R sides. In this case, a preferable method of detecting a state of the electron beam detecting means D is one utilizing a phenomenon wherein a breakdown voltage obtained upon an application of a reverse-biased voltage across the electrodes DI and DP varies depending on the presence/absence of charge accumulated in the insulating layer INS. If charge is not accumulated in the insulating layer INS, a positive voltage having a magnitude higher than that in the W mode is applied to the electrode DI without causing breakdown. However, if charge is accumulated in the insulating layer INS at a level higher than a given threshold value, the above-mentioned positive voltage is applied to the electrode DI to cause breakdown, thereby performing reading. By utilizing the breakdown effect, high-sensitivity electron beam detecting means D can be obtained.

When the electron beam detecting means D is subjected to breakdown, a current is supplied from the electrode DI to the electrode DP. Since the forward-biased current is supplied from the electrode TB to the electrode TE, the driving means T is turned on. The electron beam source E is driven by the driving means T. When the electron beam detecting means D is not subjected to breakdown, a current is not supplied from the electrode DI to the electrode DP and the driving means T is kept OFF. As a result, the electron beam EB is not emitted from the electron beam source E.

Two types of modes as follows can be set. The first mode is an RD mode wherein a substantial amount of the charge accumulated in the electron beam detecting means D is read out to perform perfect destructive readout; and the second mode is an RN mode wherein the accumulated voltage is partially read out to leave a charge component whose level exceeds the threshold value, thereby performing partial destructive readout. For example, the RD mode is set to read out information for a period of time enough to completely read out the accumulated charge. The RN mode is set to read out information for a relatively shorter period of time than that of the RD mode.

Referring to FIG. 3, in the R mode, the presence/absence of information can be electrically read out from the output terminal OUT. In the W mode, a voltage is forcibly applied to the input terminal IN.

The operation of the information transfer apparatus using the memory units MU constituted by the above unit elements U will be described with reference to FIGS. 1A and 1B. Referring to FIGS. 1A and 1B, the shift registers SR1 and SR2 are arranged to input information to or output it from the memory units. As described above, the shift registers SR1 and SR2 can be formed by conventional electrical circuits on the semiconductor substrate. As shown in FIGS. 1A and 1B, the shift register SR1 writes information in the input terminals IN of unit elements U111 and U121. The shift register SR2 reads out information from the output terminals OUT of unit elements U311 and U321. The grid G is designed to accelerate the electron beam EB. The grid G has the same effect as the lead electrode EG of the electron beam source E. When a relatively large acceleration voltage is applied, the grid G is preferably used. The intensity of the magnetic field B0 is appropriately set such that the electron beam EB emitted from an electron beam source E120 is incident on an electron beam detecting means D121.

FIG. 1A shows a case wherein information as charges is stored in the electron beam source E120 and electron beam sources E210 and E320 in the memory unit MU0, and no charge is accumulated in other electron beam sources. The memory units MU0 and MU2 are set in the R mode, and the memory unit MU1 is set in the W mode. The electron beams EB emitted from the electron beam sources E120, E210, and E320 and corresponding to the information stored in the memory unit MU0 are accelerated by the voltage VA applied between the grid G and the acceleration electrode GND0. The accelerated beams pass through the grid and are rotated by the magnetic field B0. The rotated beams EB pass through the grid G again. The passed beams are accelerated by the voltage VA applied between the acceleration electrode GND1 and the grid G. The accelerated beams EB are respectively incident on the electron beam detecting means D121, D211, and D321. An electric field is not substantially present on the side of the grid G which is opposite to the memory units MU0 to MU2. A correspondence between the electron beam source E and the electron beam detecting means D is mainly dominated by the electric field B0.

As shown in FIG. 1B, the voltage VA applied between the grid G and the memory units MU0 to MU2 is reversed to set the memory unit MU1 in the R mode and the memory units MU0 and MU2 in the W mode. The electron beams EB emitted from electron beam sources E121, E211, and E321 are respectively incident on electron beam detecting means D122, D212, and D322. In this manner, information signals of the memory unit MU0 are simultaneously transferred to the memory unit MU2 through the memory unit MU1 by the above two steps. In this case, if the RD mode as the perfect destructive read mode is employed as the R mode, information is reserved in only the unit MU2. However, in the RN mode as the partial destructive read mode, identical information is stored in the memory units MU0 to MU2.

Figure 4:
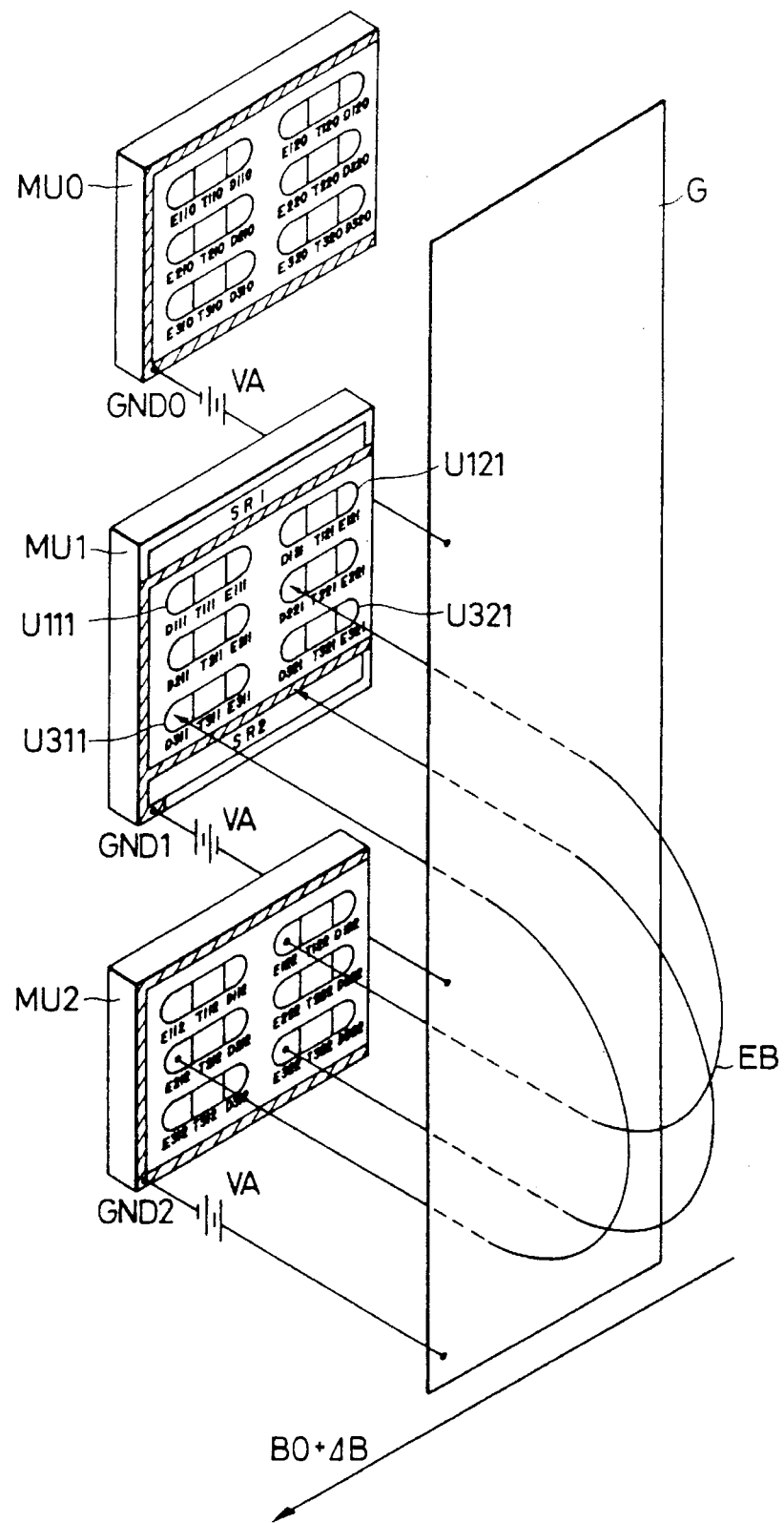
FIG. 4 is a schematic view showing a modification of the embodiment of FIGS. 1A and 1B so as to transfer information while it is being shifted.

By slightly increasing or decreasing the intensity of the magnetic field B0 determined by the size or the like of the memory unit MU, information can be shifted. Shifting will be described with reference to FIG. 4. When information is to be transferred from the memory unit MU2 to the memory unit MU1, the electron beams EB emitted from the electron beam sources E122, E212, and E322 are respectively incident on the electron beam detecting means D121, D211, and D321 upon an application of the magnetic field B0 having the same intensity but a direction opposite to that in FIG. 3. As is illustrated, when the magnetic field B0 is properly selected to obtain B0+ΔB, the electron beams EB are incident on electron beam detecting means D221 and D311 which are shifted by one row, thereby shifting the information. In the case shown in FIG. 4, the electron beam EB emitted from the electron beam source E322 is lost since it is incident on the acceleration electrode GND1.

By using such a shift function, external information signals are sequentially input from the shift register SR1 and are shifted to two-dimensionally expand the information in the memory units MU0 to MU2. For example, information signals are sequentially fetched as parallel data from the shift register SR1 in the unit elements U111 and U121, and the shift function is utilized to transfer 3 (row)×2 (column) information to the memory unit MU2. This information is kept unchanged. Another 3 (row)×2 (column) information is fetched from the shift register SR1 and is transferred to the memory unit MU0. All information of the memory unit MU2 is transferred to the memory unit MU1. In this case, the information stored in the memory unit MU2 is kept unchanged. The above operations can be repeated.

Figure 5:
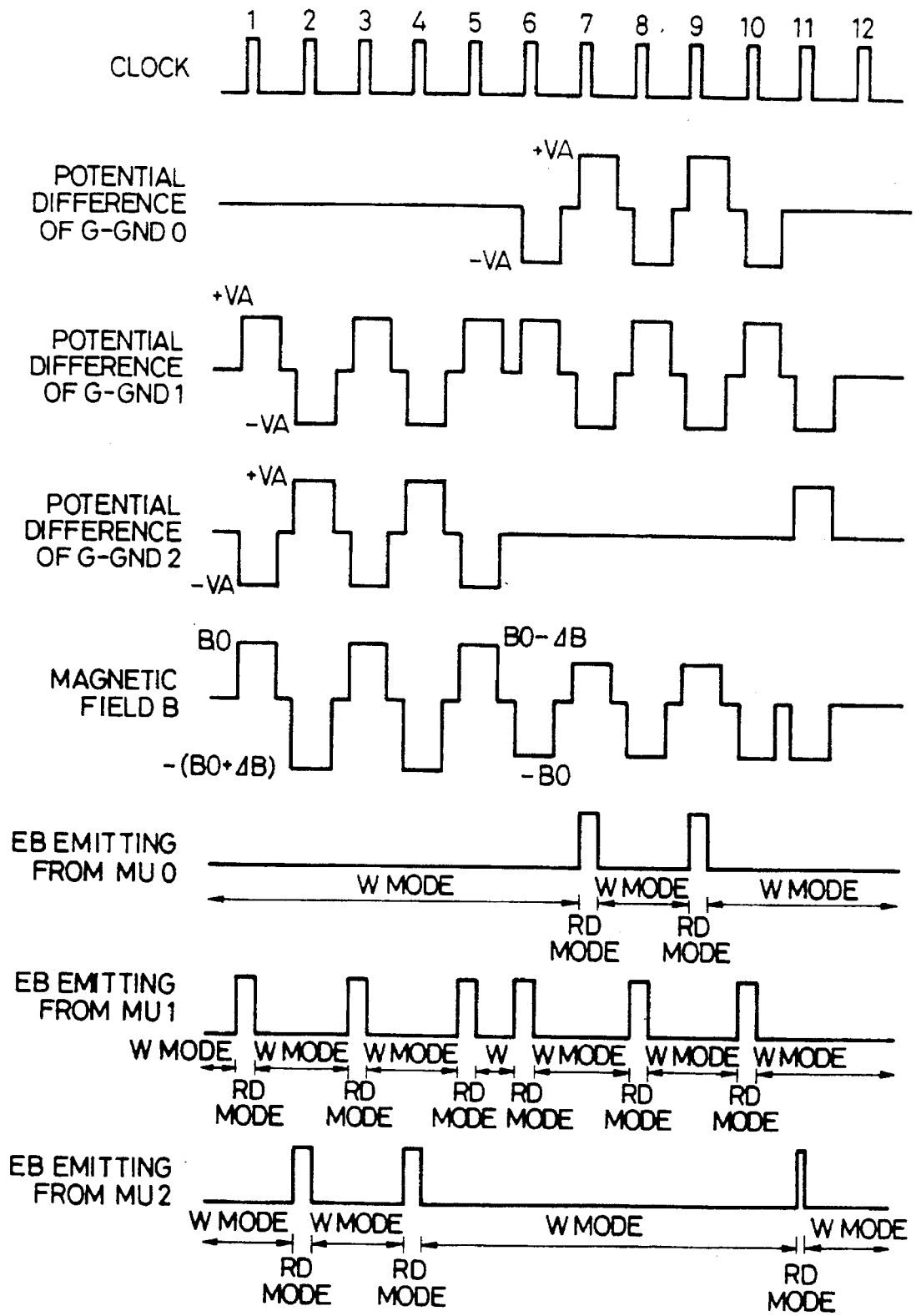
FIG. 5 is a timing chart for explaining the operation shown in FIG. 4.

The above operations will be described with reference to the timing chart of FIG. 5. Referring to FIG. 5, all information including pieces of new information written from the shift register SR1 to the unit elements U111 and U121 is transferred from the memory unit MU1 to the memory unit MU2 in response to every odd clock from the first clock to the fifth clock. This operation is the same as that shown in FIG. 1B. However, the information is transferred from the memory unit MU2 to MU1 every even clock. In this case, since the magnetic field is set at −(B0+ΔB), one-row shifting is then performed in the same manner as in FIG. 4. New information written from the shift register SR1 to the unit elements U111 and U121 and information from the memory unit MU1 are transferred to the memory unit MU0 at every even clock from the sixth clock to the 10th clock. In this period, since the information is transferred from the lower memory unit MU1 to the upper memory unit MU0, the magnetic field is set to be −B0. However, since the information is transferred from the memory unit MU0 to the memory unit MU1 at every odd clock from 7th to 9th clocks, the magnetic field B is set as B0−ΔB, thereby performing one-row shifting.

It should be noted that different magnetic fields are used for shifting parallel and nonparallel to the column even if forward one-row shifting is performed. It is apparent from FIG. 4 that shifting is performed from the memory unit MU1 to the memory units MU0 and MU2. In such shifting, the R mode must be the RD mode as the perfect destructive read mode. In response to the 11th clock, information is transferred from the memory unit MU2 to the memory unit MU1. In order to reserve the information in the memory unit MU2, the partial destructive read mode, i.e., the RN mode is set.

In the above description, information is transferred between the three memory units MU0, MU1, and MU2. In general, information can be easily transferred between at least two memory units MU. In this embodiment, the plurality of memory units MU are one-dimensionally arranged. However, the memory units MU may be two-dimensionally arranged to obtain the same effect as described above as shown in FIG. 6.

Figure 6:
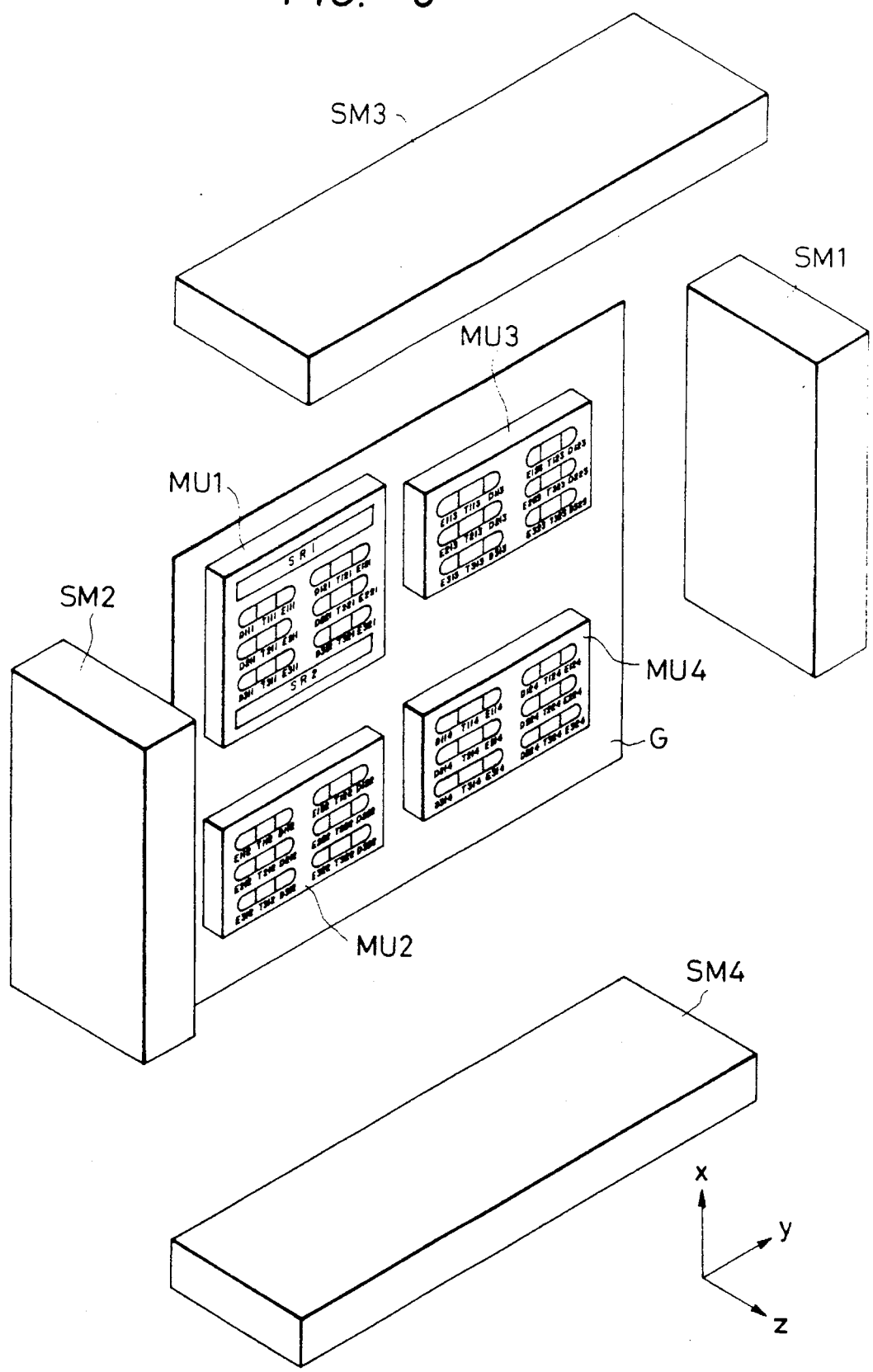
FIG. 6 is a schematic view showing a two-dimensional arrangement of the memory unit according to a modification of the information transfer apparatus shown in FIGS. 1A and 1B.

Referring to FIG. 6, memory units MU1, MU2, MU3, and MU4 are two-dimensionally arranged, and magnetic field generating means SM1 and SM2 are opposite to each other along the y direction of the substrate. Magnetic field generating means SM3 and SM4 are opposite to each other along the x direction. As described above, information transfer and shifting between the memory units MU1 and MU2 and between the memory units MU3 and MU4 can be performed by the magnetic field in the y direction generated by the magnetic field generating means SM1 and SM2. Information transfer and shifting are performed between the memory units MU1 and MU3 and between the memory units MU2 and MU4 by the magnetic field in the x direction generated by the magnetic field generating means SM3 and SM4. Forward shifting and reverse shifting of the column information and forward shifting and reverse shifting of the row information can be performed in any memory unit MU.

According to the method and apparatus for transferring information according to this embodiment, when information is transferred between the plurality of memory units each comprising the electron beam source, the electron beam detecting means, and the driving means, the electron beam deflecting means, such as the magnetic field generating means, is controlled to deflect the electron beams, thereby simultaneously transferring the pieces of information being carried out. In addition, the magnetic field generating means is properly controlled to provide the shift function.

Figure 7:
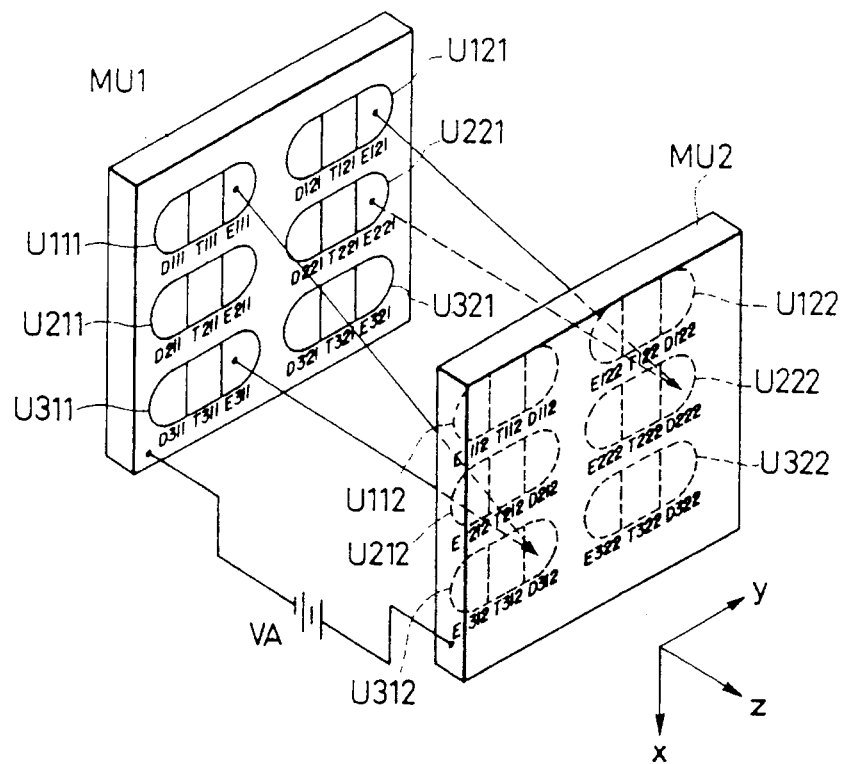
FIG. 7 is a schematic view of an apparatus for performing logical operations by deflecting an electron beam so as to explain an application of the method of the present invention.

FIG. 7 is a schematic view of a logic operation apparatus using an application of the information transfer method according to the present invention wherein the electron beam is deflected to perform logical operations.

The same reference numerals as in FIGS. 1A to 6 denote the same parts in FIG. 7.

Figure 8:
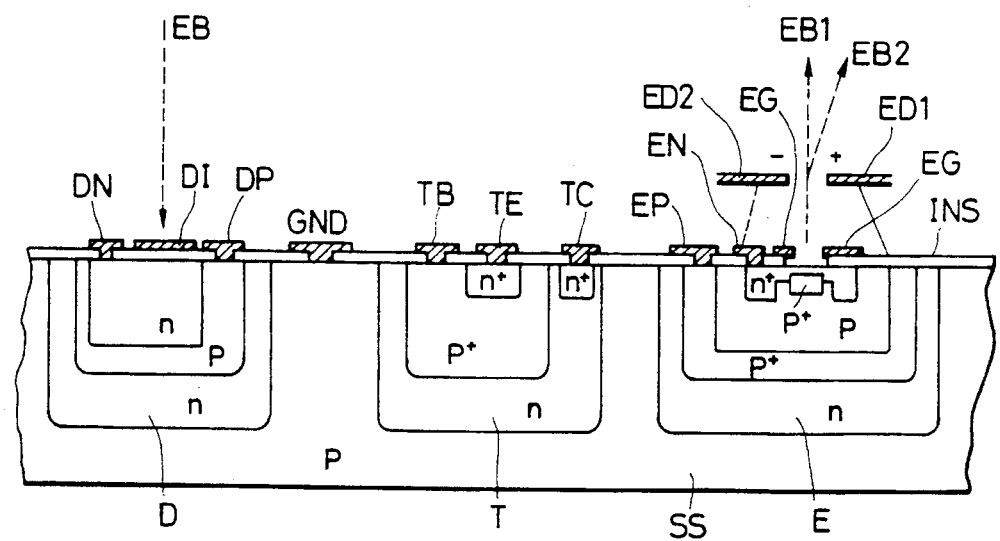
FIG. 8 is a sectional view of a unit element in the memory unit in the apparatus shown in FIG. 7.
Figure 9:
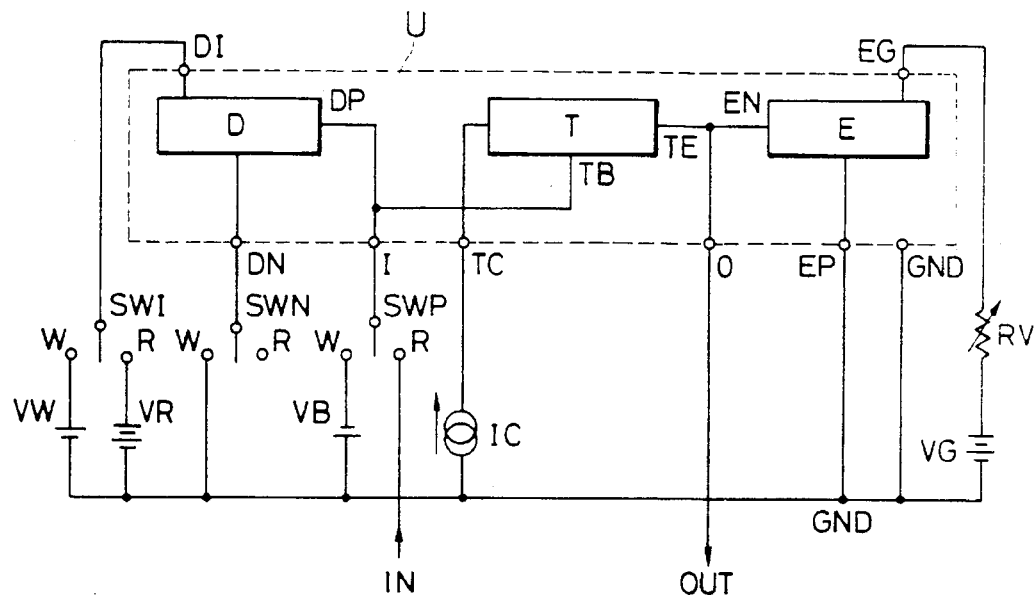
FIG. 9 is a block diagram of a drive unit for driving the element shown in FIG. 8.

The main part of the apparatus shown in FIG. 7 is illustrated in FIGS. 8 and 9. The main part is constituted by memory units MU1 and MU2 each including a plurality of unit elements U, each consisting of an electron beam detecting means D, a driving means T, and an electron beam source E. A deflection electrode (not shown) is formed to deflect an electron beam EB emitted from the electron beam source E of each unit element U in an arbitrary direction. For illustrative convenience, the memory unit MU1 comprises a 3 (row)×2 (column) memory unit consisting of elements U111, U121, U211, UU221, U311, and U321. The memory unit MU2 comprises unit elements U112, U122, U212, U222, U312, and U322. Each unit element U can be formed by semiconductor techniques such as epitaxial growth and photolithography and can have a very high packing density. A power source VA is inserted between the memory units MU1 and MU2.

The unit elements U111 to U322 arranged in the memory units MU1 and MU2 will be described with reference to FIGS. 8 and 9. FIG. 8 is a sectional view of the unit element U. The unit element comprises the electron beam detecting means D, the driving means T, and the electron beam source E, all of which are constituted by p-n junctions. An insulating layer INS is formed on the surface of a substrate SS of a p-type semiconductor. Various electrodes are formed on the substrate SS through the insulating layer INS. A reference voltage electrode DN, a positive bias electrode DI, and a reverse bias electrode DP are formed in the electron beam detecting means D constituted by an n-p-n (an order named from the lower surface of the substrate SS) junction. An acceleration electrode GND is formed on the substrate SS through an opening of the insulating layer INS. The driving means T formed in the substrate SS by an n-p$^+$-n$^+$ (an order named from the lower surface of the substrate SS) junction in the vicinity of the electron beam detecting means D. Electrodes TB, TE, and TC are formed in the driving means T. In addition, the electron beam source E constituted by an n-p$^+$-p-n$^+$ (an order named from the lower surface of the substrate SS) junction is formed next to the driving means T. Typical examples of the electron beam source E are solid-state electron beam sources as described in the above-mentioned prior art patents. The electron beam source E sets an electrode EN at a positive potential with respect to an electrode EP, i.e., applies a reverse-biased voltage to cause an avalanche effect, thereby generating electrons. A lead electrode EG is applied with the positive voltage so that the electrons are emitted in a vacuum from the opening. As described above, examples of the solid-state electron beam source utilizing the p-n junction are a negative work function type source, and other so-called electric field emission type sources, and a thermoelectron emission type source. Deflection electrodes ED1 and ED2 are arranged near the opening of the lead electrode EG. A predetermined electric field is generated by the deflection electrodes ED1 and ED2 to deflect the electron beams in the direction of EB1 and EB2.

FIG. 9 is a block diagram of a drive unit for driving the element described above. Switches SWI, SWN, and SWP are respectively connected to the electrodes DI, DN, and DP of the electron beam detecting means D. As described above in the above embodiment, the write mode (to be referred to as a W mode hereinafter) is set when the electron beam EB is incident on the electron beam detecting means D. The read mode (to be referred to as an RD mode hereinafter) is set when the electron beam EB is emitted from the electron beam source E. In this case, a write terminal W and a read terminal R are respectively arranged for each of the switches SWI, SWN, and SWP. A voltage VW is applied to the terminal W (of the terminals W and R) corresponding to the switch SWI, and a voltage VR is applied to the terminal W of the terminals R and W. The terminal W (of the terminals W and R) corresponding to the switch SWN is connected to the ground electrode GND, and the terminal R corresponding thereto is open. A negative voltage VB is applied to the terminal W (of the terminals W and R) corresponding to the switch SWP. External information is input to the terminal R corresponding to the switch SWP through an input terminal IN. The electrode TB in the driving means T is connected to the electrode DP in the electron beam detecting means D and can be connected to the terminal W or R by means of the switch SWP. A current source IC is connected to the electrode TC in the driving means T. The electrode TE is connected to the electrode EN of the electron beam source E. Information can be extracted by the electrodes TE and EN at an output terminal OUT. The lead electrode EG of the electron beam source E is connected to a power source VG through a variable resistor RV. The electrode EP is connected to the ground electrode GND.

Referring to FIG. 9, the W mode will be taken into consideration. The switches SWI, SWN, and SWP are set on the terminal W sides. The positive voltage VW is applied as a bias voltage to the electrode DI using the voltage at the electrode DN as a reference voltage in the electron beam detecting means D. In this case, a reverse-biased voltage VB is applied to the electrode DP. No current is supplied to the path between the electrodes DN and DP since this path is reverse-biased.

As shown in FIG. 8, the electron beam EB passes through the electrode DI to cause generation of electron-positive hole pairs in the insulating layer INS. The positive holes in the electron-hole pairs are accumulated in the insulating layer INS near the interface between the insulating layer INS and the n-type layer. The charge accumulated as positive holes is reserved relatively stably even if the electron beam EB is not emitted thereon. Since the reverse-biased voltage VB is applied to the electrode TB in the driving means T through the electrode DP in the same manner as in the electrode DP, the driving means T is maintained in the cutoff state, and the electron beam source E is kept inoperative.

In the R mode, the switches SWI, SWN, and SWP are connected to the terminal R sides. In this case, a preferable method of detecting a state of the electron beam detecting means D is one utilizing a phenomenon wherein a breakdown voltage obtained upon an application of a reverse-biased voltage across the electrodes DI and DP varies depending on the presence/absence of charge accumulated in the insulating layer INS, as described in the above embodiment. If charge is not accumulated in the insulating layer INS, a positive voltage having a magnitude higher than that of the W mode is applied to the electrode DI without causing breakdown. However, if charge is accumulated in the insulating layer INS at a level higher than a given threshold value, the above-mentioned positive voltage is applied to the electrode DI to cause breakdown, thereby performing reading. By utilizing the breakdown effect, a high-sensitivity electron beam detecting means D can be obtained.

When the electron beam detecting means D is subjected to breakdown, a current is supplied from the electrode DI to the electrode DP. Since the forward-biased current is supplied from the electrode TB to the electrode TE, the driving means T is turned on. The electron beam source E is driven by the driving means T. In this case, the amount of current of the electron beam EB emitted from the electron beam source E can be controlled by the variable resistor RV inserted between the electron beam source E and the power source VG. When the electron beam detecting means D is not subjected to breakdown, a current is not supplied from the electrode DI to the electrode DP and the driving means T is kept OFF. As a result, the electron beam EB is not emitted from the electron beam source E.

And yet two types of R modes can be set. The first mode is an RD mode wherein a substantial amount of the charge accumulated in the electron beam detecting means D is read out to perform destructive readout; and the second mode is an RN mode wherein the accumulated voltage is partially read out to leave a charge component whose level exceeds the threshold value, thereby performing nondestructive readout. For example, the RD mode is set to read out information for a period of time enough to completely read out the accumulated charge. The RN mode is set to read out information for a relatively short period of time. The presence/absence of information from the output terminal OUT can be electrically read out in the R mode, a voltage being forcibly applied to the input terminal IN in the W mode.

The operation of the memory units MU constituted by the unit elements U described above will be described with reference to FIG. 7. Referring to FIG. 7, information stored in the memory unit MU1 is transferred to the memory unit MU2 in accordance with the information stored in the memory unit MU1. For example, electron beams EB emitted from electron beam sources E111 and E311 are respectively deflected and the deflected beams are incident on an electron beam detecting means D312 of the memory unit MU2. An electron beam EB emitted from an electron beam source E121 is incident on an electron beam detecting means D222. In the unit element U121, a deflection voltage is applied to a deflection electrode ED shown in FIG. 8 such that if an electron beam EB is output from the electron beam source E121, the beam is incident on the electron beam detecting means D222. In the case shown in FIG. 7, an electron beam EB is not output from an electron beam source E221 in accordance with the information stored in the unit element U221. This state is indicated by broken lines. The memory unit MU1 is set in the R mode and the memory unit MU2 is set in the W mode. A voltage VA is applied to the ground electrode GND2 with respect to the electrode GND1 so that the electrode GND2 serves as an acceleration electrode. Therefore, an acceleration electric field from the memory unit MU1 to the memory unit MU2 is formed.

The amount of charge corresponding to the amount of current of the electron beam EB incident on the electron beam detecting means D is accumulated in the insulating layer INS. After the operation shown in FIG. 7 is completed, the information of the memory unit MU1 is superposed on the deflection voltage applied to the unit element U, and the superposed information is stored in each unit element of the memory unit MU2 in the form of charge. For example, the electron beams EB from the electron beam sources E111 and E311 are simultaneously incident on the electron beam detecting means D312. However, the electron beam from only the electron beam source E121 is incident on the electron beam detecting means D222. Therefore, the amount of charge in the electron beam detecting means D312 is twice that in the electron beam detecting means D222.

As described above, in the R mode of the electron beam detecting means D in each unit element, the threshold value for the accumulative amount of charge is present. No readout can be performed unless the accumulative charge exceeds the threshold value. By utilizing the threshold value, a logical addition and a logical multiplication of two pieces of information in the memory unit MU1 can be performed in each unit element U in the memory unit MU2.

Figure 10:
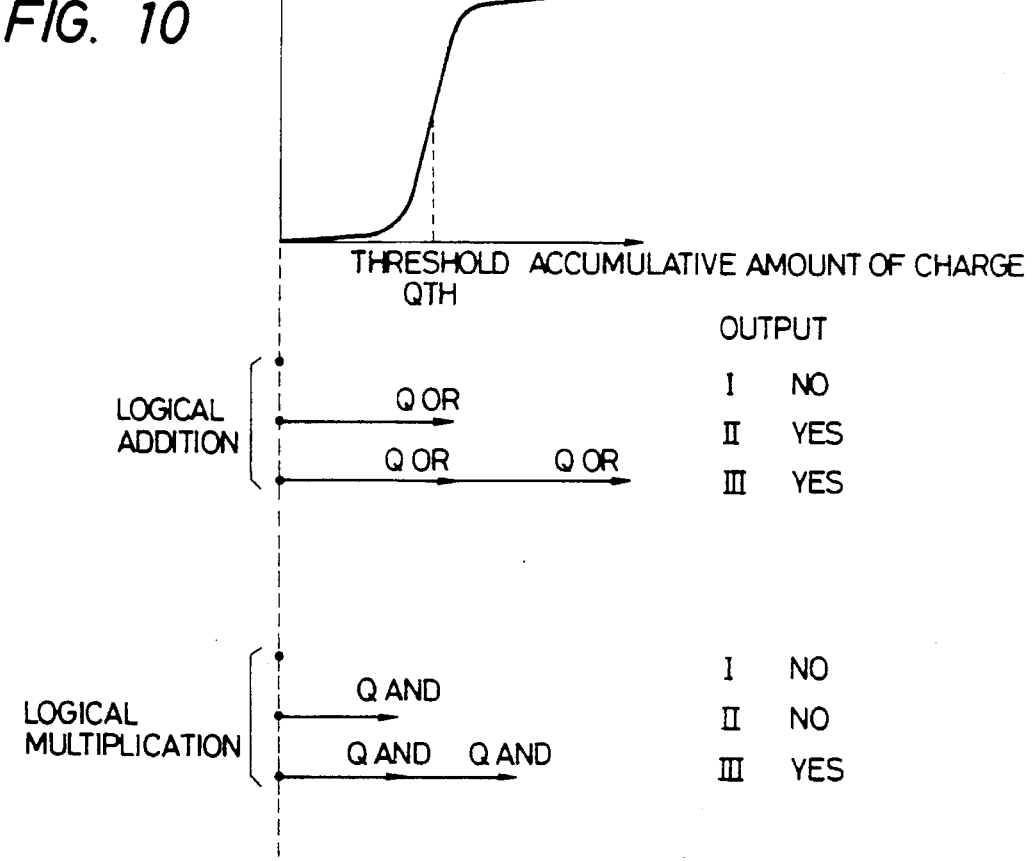
FIG. 10 is a graph showing the relationship between the breakdown threshold value, the accumulative amount of charge, the logical addition, and the logical multiplication in the apparatus shown in FIG. 7.

FIG. 10 shows the relationship between the threshold value, the accumulative amount of charge, the logical addition, and the logical multiplication. Referring to FIG. 10, QTH is an amount of threshold value charge for causing the breakdown, and Qor and Qand are accumulative amounts of charge induced by the electron beam EB incident in one unit element of the memory unit MU1 when the logical addition and the logical multiplication are to be performed. A case I indicates that no electron beam EB is incident from two unit elements of the memory unit MU1. A case II indicates that an electron beam is incident from one of the unit elements of the memory unit MU1. A case III indicates that the electron beams are respectively incident from the two unit elements of the memory unit MU1. As is apparent from FIG. 10, the amount of current of the electron beam EB incident from the unit element U in the memory unit MU1 onto one of the electron beam detecting means D or the amount of charge induced by the electron beam EB is controlled to detect the presence/absence of outputs, i.e., to select the logical addition or multiplication.

In order to control the amount of current of the electron beam EB incident on the electron beam detecting means D, the amount of current of the electron beam EB emitted from the electron beam source E belonging to each unit element U of the memory unit MU1 is controlled. For this purpose, the variable resistor RV shown in FIG. 9 is adjusted. Other techniques may be proposed wherein the amount of charge induced in the electron beam detecting means D is controlled by the amount of current of the electron beam EB incident on the electron beam detecting means D. For example, a variable focusing electron beam converging means may be arranged in the electron beam source E of each unit element U of the memory unit MU1 in order to control the amount of current. Therefore, the amount of current of the electron beam EB incident on the electron beam detecting means D of the memory unit MU2 can be controlled. More specifically, if the electron beam EB is converged on the incident surface of the electron beam detecting means D, the amount of current of the electron beam EB incident on the electron beam detecting means D is increased. However, the beam spot of the electron beam EB is larger than the incident surface area of the electron beam detecting means D, the amount of current of the electron beam EB incident on the detecting means D is decreased. By utilizing the above relationship, the amount of current of the electron beam EB incident on the electron beam detecting means D can be controlled. In this case, the variable resistor RV shown in FIG. 9 can be omitted.

In order to control the amount of charge induced by the incident electron beam EB, as described in "Electron Transmission Recording Tube", Uno, Kawakami and others, *Television*, Vol. 23, No. 9 (1969), a change in electron beam transmittance of a metal film can be utilized. In the electron beam detecting means D in FIG. 8, the thickness of the metal film electrode DI formed on the incident surface of the electron beam EB is properly controlled, or the voltage of the acceleration power source VA in FIG. 7 is changed, thereby selecting the logical addition or multiplication. In this case, the variable resistor RV shown in FIG. 9 can be omitted.

By utilizing the above techniques, a logical addition or multiplication of at least any two pieces of information out of the information included in the two-dimensional parallel information can be calculated. For example, by means of the selection of a logical addition or multiplication of the information accumulated in the unit elements U111 and U311 with regard to the unit element U312 and by means of that of the information accumulated in the unit elements U121 and U221 with regard to the unit element U222, logical operation can be carried out.

The embodiment of the present invention described with reference to FIG. 7 may be modified and changed. In the above embodiment, the threshold value of the accumulative amount of charge for the output of the electron beam detecting means D is kept unchanged, and the accumulative amount of change is changed, thereby selecting the logical addition or multiplication. However, the current of the incident electron beam EB and the amount of charge induced thereby may be kept unchanged, and the threshold value may be changed to select the logical addition or multiplication. In this case, a discriminator or the like for externally changing the threshold value under electrical control according to semiconductor techniques may be added to the drive circuit T shown in FIG. 8.

Referring to FIGS. 7 and 10, the electron beams EB are emitted from the unit elements U111 and U311 in the memory units MU1 and deflected, respectively. The deflected beams are incident on one unit element U312 of the memory unit MU2. However, electron beams EB emitted from three or more unit elements of the memory unit MU1 may be respectively deflected, and the deflected beams may be incident on one unit element of the memory unit MU2. By properly setting the threshold value in FIG. 10, a multi-input, one-output logical operation can be performed. In the case shown in FIG. 7, the electron beam EB is emitted from the memory unit MU1 and is incident on the memory unit MU2, and the logical operation is performed. However, it is possible to emit the electron beams within the memory unit MU2, thereby performing the logical operation therein. In this case, the voltage of the acceleration power source VA is reverse-biased.

In the case shown in FIG. 7, the electron beams EB emitted from the unit elements U of the memory unit MU1 are deflected in the x direction, and the logical operations are performed. However, deflection electrodes may be two-dimensionally arranged in the electron beam source E in FIG. 7 to two-dimensionally deflect the electron beams EB. With this function, the electron beams EB can be deflected in the y direction or in arbitrary directions within the x-y plane to perform logical operations.

Figure 11A:
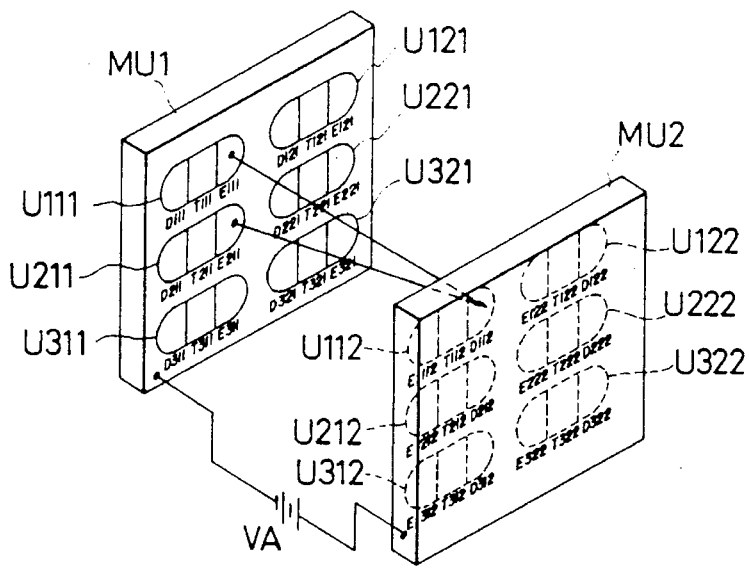
FIGS. 11A, 11B, and 11C are respectively views for performing logical operations by using the apparatus shown in FIG. 7.
Figure 11B:
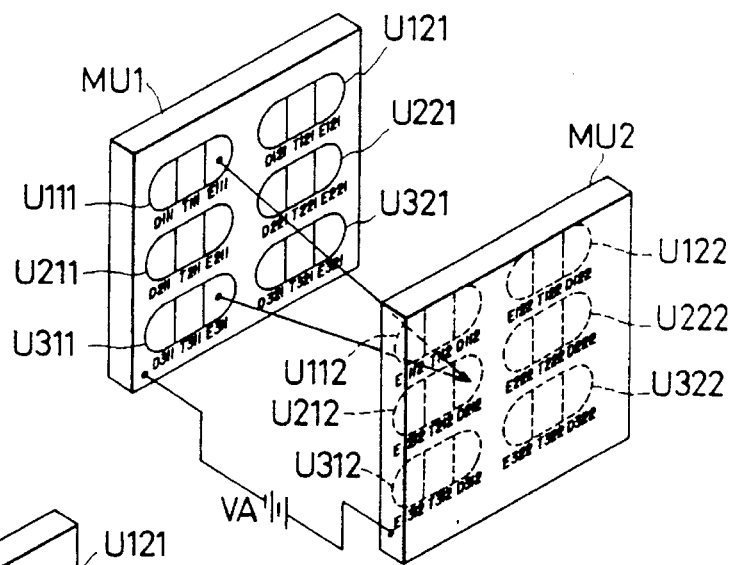
Figure 11C:
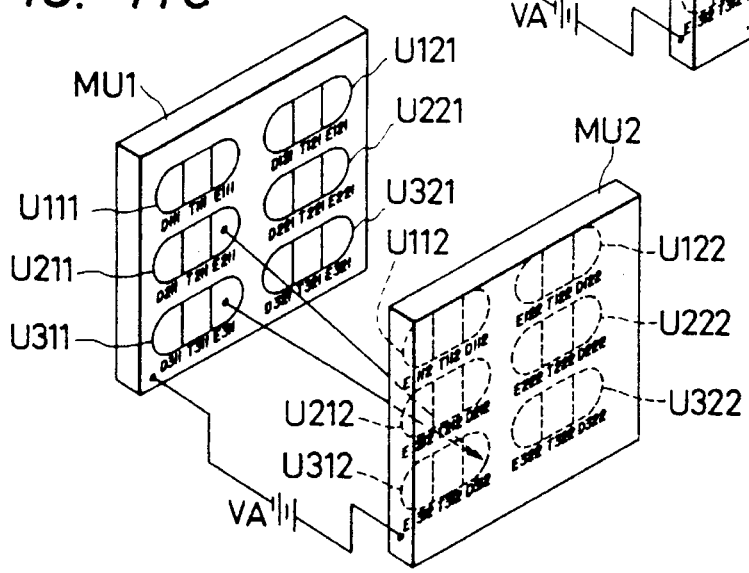

The deflection is performed using the electric field in FIG. 7. However, the electron beam EB may be deflected by a magnetic field, which can be incorporated in the present invention. Referring to FIG. 7, the electron beams EB emitted from two or more electron beam sources E of the memory unit MU1 are independently and simultaneously deflected and incident on one electron beam detecting means D. However, by setting the RN mode as the partial destructive read mode, the electron beams EB emitted from the electron beam sources E of the memory unit MU1 may be sequentially deflected and the deflected beams may be sequentially incident on the plurality of electron beam detecting means D of the memory unit MU2, as shown in FIGS. 11A, 11B, and 11C. As shown in FIG. 11A, information is received from the electron beam sources E111 and E211 to the electron beam detecting means D112. As shown in FIG. 11B, information is received from the electron beam sources E111 and E311 to the electron beam detecting means D212. Further, as shown in FIG. 11C, information is received from the electron beam sources E211 and E311 to the electron beam detecting means D312. The steps shown in FIGS. 11A, 11B, and 11C are sequentially performed in the RN mode as the partial destructive read mode. The logical additions or multiplications of information from the unit elements U111 and U211, the unit elements U111 and U311, and the unit elements U211 and U311 are respectively performed in the unit elements U112, U212, and U312.

In the method and apparatus for performing logical operations, the electron beams emitted in response to two-dimensional parallel information are independently deflected by the deflection electrodes provided to the electron beam sources and are incident on the electron beam detecting means. By utilizing the threshold value of the electron beam detecting means, a logical addition or multiplication of two or more pieces of information out of the information included in two-dimensional parallel information can be selectively performed at high speed, .thereby greatly improving the operation capability.

Figure 12A:
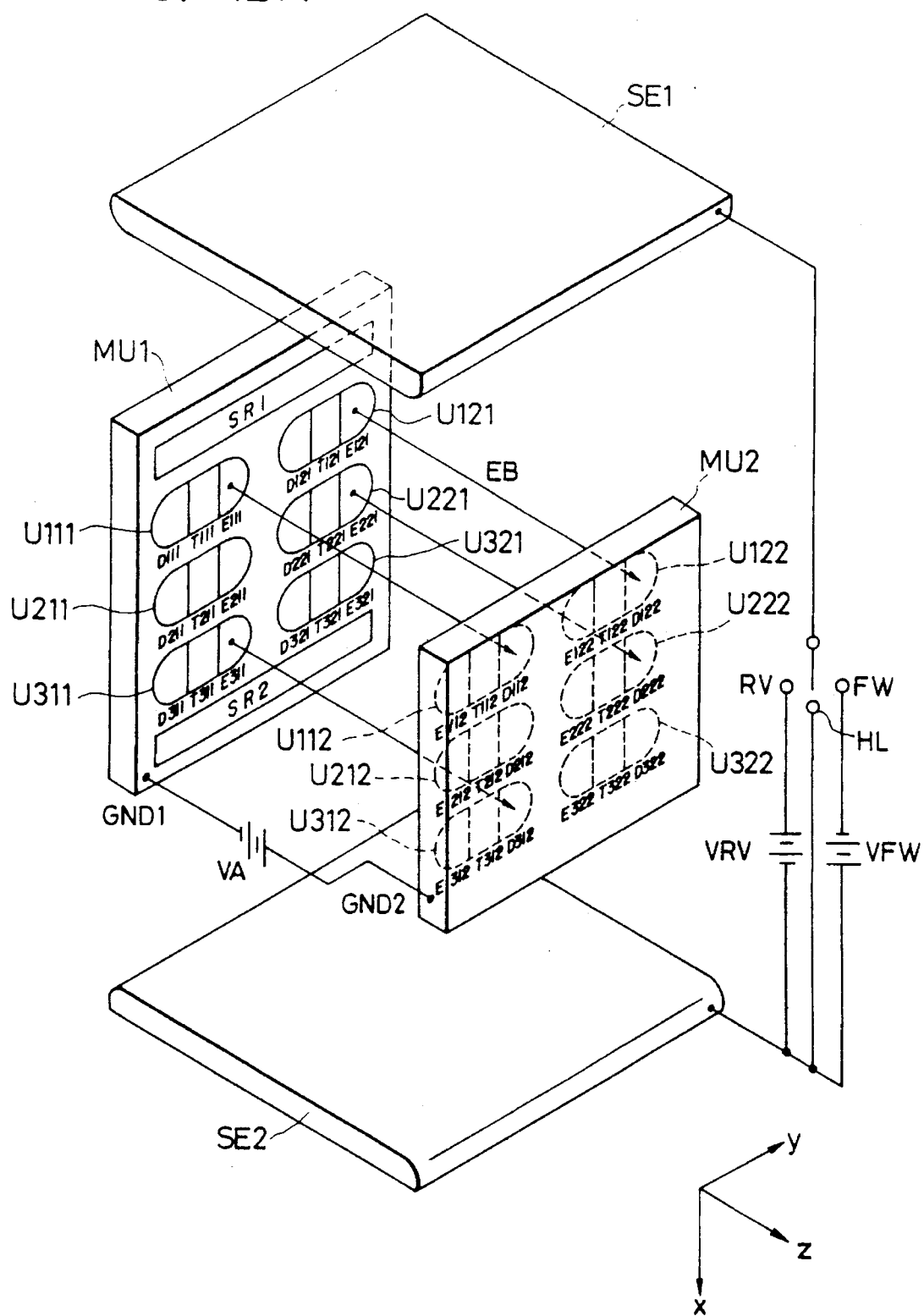
FIGS. 12A and 12B are schematic views showing a logical operation apparatus according to a modification of the apparatus shown in FIG. 7.
Figure 12B:
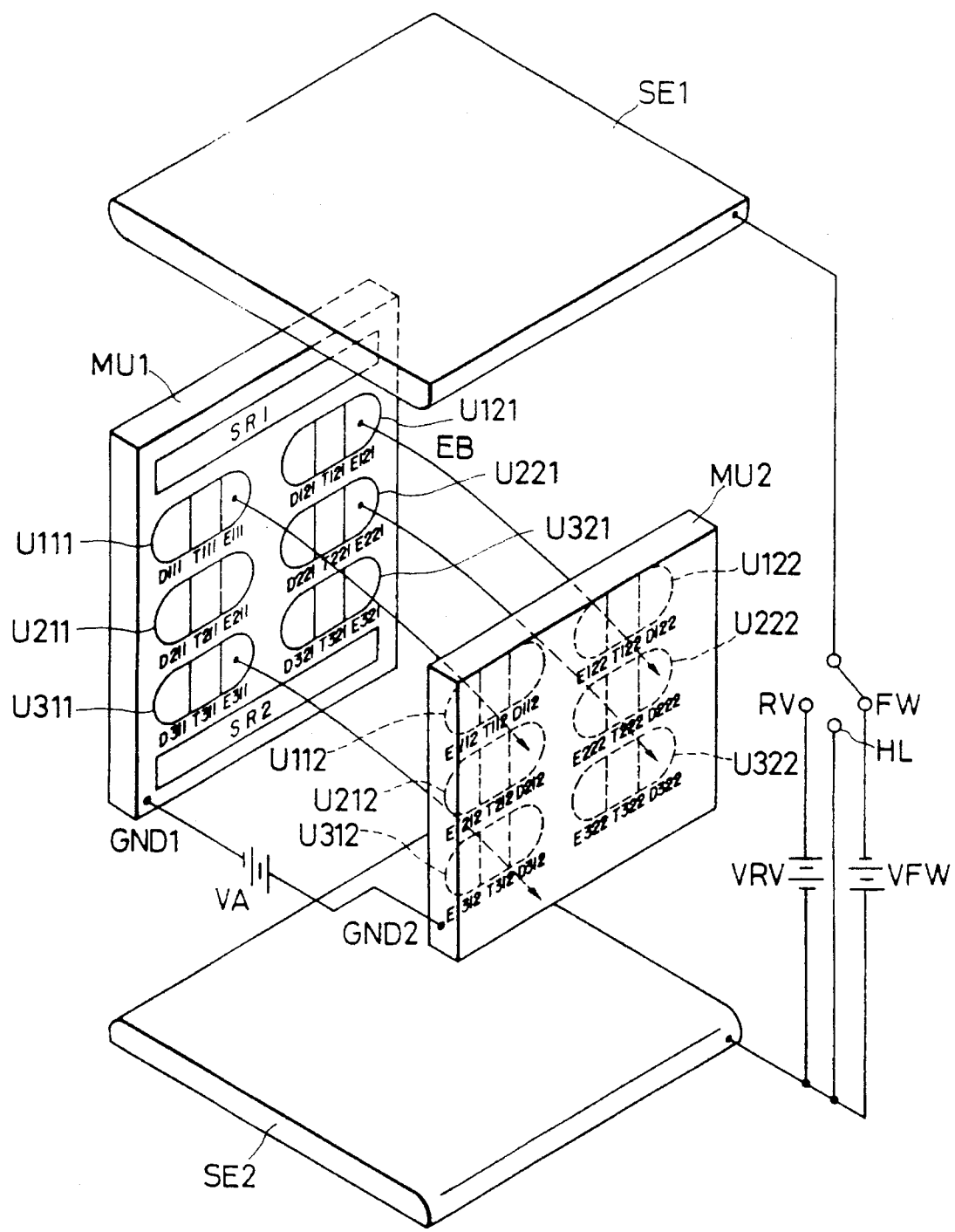

FIGS. 12A and 12B show a modification of the apparatus shown in FIG. 7, exemplifying a logical operation apparatus. The same reference numerals as in FIG. 7 denote the same parts in FIGS. 12A and 12B.

In the apparatus of FIGS. 12A and 12B, in the same manner as in FIG. 7, the memory units MU1 and MU2 oppose each other. Each of the memory units MU1 and MU2 including a plurality of unit elements U each consisting of electron beam detecting means D, driving means T, and electron beam source E. For the sake of simplicity, the memory units MU1 and MU2 in FIGS. 12A and 12B comprise 3 (row)×2 (column) memory units respectively consisting of the unit elements U111, U121, U211, U221, U311 and U321 and the unit elements U112, U122, U212, U222, U312 and U322. The unit elements can be easily formed by semiconductor techniques such as epitaxial growth and photolithography, and have a high packing density. The shift register SR1 is arranged in the upper portion of the memory unit MU1, and the shift register SR2 is arranged in the lower portion of the memory unit MU1. The power source VA is connected between the memory units MU1 and MU2. The deflection electrodes SE1 and SE2, as magnetic field generating means, are arranged above and below the memory units MU1 and MU2. A switch RV is arranged between the deflection electrodes SE1 and SE2 through a power source VRV. A switch FW is arranged between the electrodes SE1 and SE2 through a power source VFW. A switch HL is arranged between the electrodes SE1 and SE2 without being through a power source.

The structure and the principle of driving the memory units MU1 and MU2 in this modification are substantially the same as those of the memory units MU1 and MU2 shown in FIG. 7.

A description associated with the memory units MU1 and MU2 and unit elements U111 to U322 will be omitted.

The operation of the apparatus will be described with reference to FIGS. 12A and 12B.

Referring to FIGS. 12A and 12B, the shift registers SR1 and SR2 are designed to exchange information with external devices. The shift registers SR1 and SR2 can be constituted by conventional electrical circuits formed on a semiconductor substrate. In the case of FIGS. 12A and 12B, the shift register SR1 writes information to input terminals IN of the unit elements U111 and U121. The shift register SR2 reads out information from output terminals OUT of the unit elements U311 and U321.

FIG. 12A shows a state wherein information is transferred from the memory unit MU1 to the memory unit MU2 in accordance with the information stored in the memory unit MU1. More specifically, electron beams EB emitted from electron beam sources E111, E121, E221, and E311 of the memory unit MU1 are respectively incident on electron beam detecting means D112, D122, D222 and D312 of the memory unit MU2, thus transferring the information from the memory unit MU1 to the memory unit MU2. In this case, the memory unit MU1 is set in the RN mode as the partial destructive read mode, and the memory unit MU2 is set in the W mode. An acceleration voltage of the power source VA is applied to the ground electrode GND2 with respect to the electrode GND1 so that the electrode GND2 serves as an acceleration electrode. In this state, an acceleration electric field is formed from the memory unit MU1 to the memory unit MU2. In the state of FIG. 12A, a potential difference between the polarization electrodes SE1 and SE2 as the electromagnetic field generating means is set to 0, and the electron beam EB is not deflected.

As shown in FIG. 12B, a proper voltage VFW is applied between the electrodes SE1 and SE2, the electron beam is deflected at a predetermined angle corresponding to the magnitude of the voltage VFW. The electron beams EB emitted from the electron beam sources E111, E121, and E221 are respectively incident on the electron beam detecting means D212, D222, and D322.

The amount of charge corresponding to the amount of current of the electron beams EB incident on the electron beam detecting means D is charged in the insulating layer INS. Therefore, after the operations in FIGS. 12A and 12B are completed, pieces of information of the two unit elements of the memory unit MU1 are superposed and accumulated in each unit element U of the memory unit MU2 in the form of charge. For example, the electron beams EB from the electron beam sources E221 and E121 are sequentially incident on the electron beam detecting means D222. The electron beam EB from only the electron beam source E111 is incident on the electron beam detecting means D212. Therefore, the accumulative amount of change of the electron beam detecting means D222 is twice that of the electron beam detecting means D212.

In the R mode of the electron beam detecting means D, the threshold value for the accumulative amount of charge is assumed. If the actual accumulative amount of charge is not higher than the threshold value, readout cannot be performed. By utilizing the threshold value, a logical addition or multiplication of information from the two unit elements U of the memory unit MU1 can be performed in each unit element U in the memory unit MU2 in the same manner as in FIG. 7.

In the case shown in FIGS. 12A and 12B, the amount of current of the electron beam EB incident from one unit element U of the memory unit MU1 on the electron beam detecting means D or the amount of charge induced by the electron beam EB is properly controlled to select the logical addition or multiplication. In order to control the amount of current of the electron beam EB incident on the electron beam detecting means D, the amount of current of the electron beam EB emitted from the electron beam source E belonging to each unit element U of the memory unit MU1 can be controlled. For this purpose, the variable resistor RV shown in FIG. 9 is adjusted.

Other techniques for controlling the amount of charge induced in the electron beam detecting means D in accordance with the amount of current of the electron beam EB incident on the electron beam detecting means D or the incident electron beam EB may be utilized, as described with reference to FIG. 7.

In this modification, the logical addition or multiplication of two-dimensional information in the memory unit MU1 can be performed in correspondence to the electron beam EB incident on the electron beam detecting means D of the memory unit MU2.

The above description is associated with the modification shown in FIGS. 12A and 12B. Other various modifications except for the one shown in FIGS. 12A and 12B may be made. In the above embodiment, the threshold value of the accumulative amount of charge for the output of the electron beam detecting means D is kept unchanged, and the accumulative amount of change is changed, thereby selecting the logical addition or multiplication. However, the current of the incident electron beam EB and the amount of charge induced thereby may be kept unchanged, and the threshold value may be changed to select the logical addition or multiplication. In this case, a discriminator or the like for externally changing the threshold value under electrical control according to semiconductor techniques may be added to the drive circuit T shown in FIGS. 8 and 9.

In this modification, the electron beams EB are emitted from the unit elements U211 and U121 in the memory units MU1 and deflected, respectively. The deflected beams are incident on one unit element U222 of the memory unit MU2. However, electron beams EB emitted from three or more unit elements of the memory unit MU1 may be respectively deflected, and the deflected beams may be incident on one unit element of the memory unit MU2. By properly setting the breakdown threshold value, a multi-input, one-output logical operation can be performed. In addition, the electron beam EB emitted from one unit element U of the memory unit MU1 in the RD mode as the perfect destructive read mode is deflected by one unit element U of the memory unit MU2 and reaches the unit MU2. The logical operation apparatus can serve as a shift register.

By combining information exchange with the external circuit through the shift registers SR1 and SR2, the operation of the shift registers, and the logical operation described with reference to FIGS. 12A and 12B, two-dimensional parallel information is input to the memory unit MU1. Thereafter, the two-dimensional information is subjected to simultaneous logical operations. This arrangement is suitable for an image processing apparatus. If a wiring pattern which allows direct input/output of information with respect to the unit elements U arranged in a matrix form, the shift registers SR1 and SR2 can be omitted. In the modification of FIGS. 12A and 12B, the electron beam EB is emitted from the memory unit MU1 and incident on the memory unit MU2. However, the electron beams may be emitted from the memory unit MU2 to the memory unit MU1 and logical operations may be made in the memory unit MU1. In this case, the reversed-biased acceleration voltage VA is applied.

In the modification shown in FIGS. 12A and 12B, logical operations for the two adjacent unit elements U in the memory unit MU1 are performed in the memory unit MU2. However, by properly controlling the acceleration voltage, a large deflection angle can be obtained without deforming the track of the electron beam EB. If such deflection is performed, it is possible to perform logical calculations between any two unit elements in addition to the two adjacent unit elements U. A reverse-biased voltage VRV is applied to the deflection electrode SE1, the deflection direction is reversed, i.e., in the negative direction of x-axis. However, if the voltage is applied such that the deflection electric field is applied to the y direction, the electron beams can be deflected in any two-dimensional direction in cooperation with the electrodes SE1 and SE2. Therefore, two-dimensional parallel operations having any shift direction and any shift amount can be performed.

In the modification of FIGS. 12A and 12B, deflection is performed using the electric field. However, the electron beams may be deflected by a magnetic field, which can be incorporated in the present invention.

In the above modification, the electron beams emitted on the basis of the two-dimensional parallel information are deflected by the electromagnetic field generating means and sequentially incident on the electron beam detecting means. By selectively arranging the current amount varying means of the electron beams incident on the electron beam detecting means, a variable focusing electron converging means, an electron beam transmittance varying means, a threshold value discriminator, or the like, the threshold value of the electron beam detecting means is utilized to selectively perform simultaneous logical additions or multiplications of a plurality of pieces of information included in the two-dimensional parallel information, thereby greatly improving logical operation efficiency.

Figure 13A:
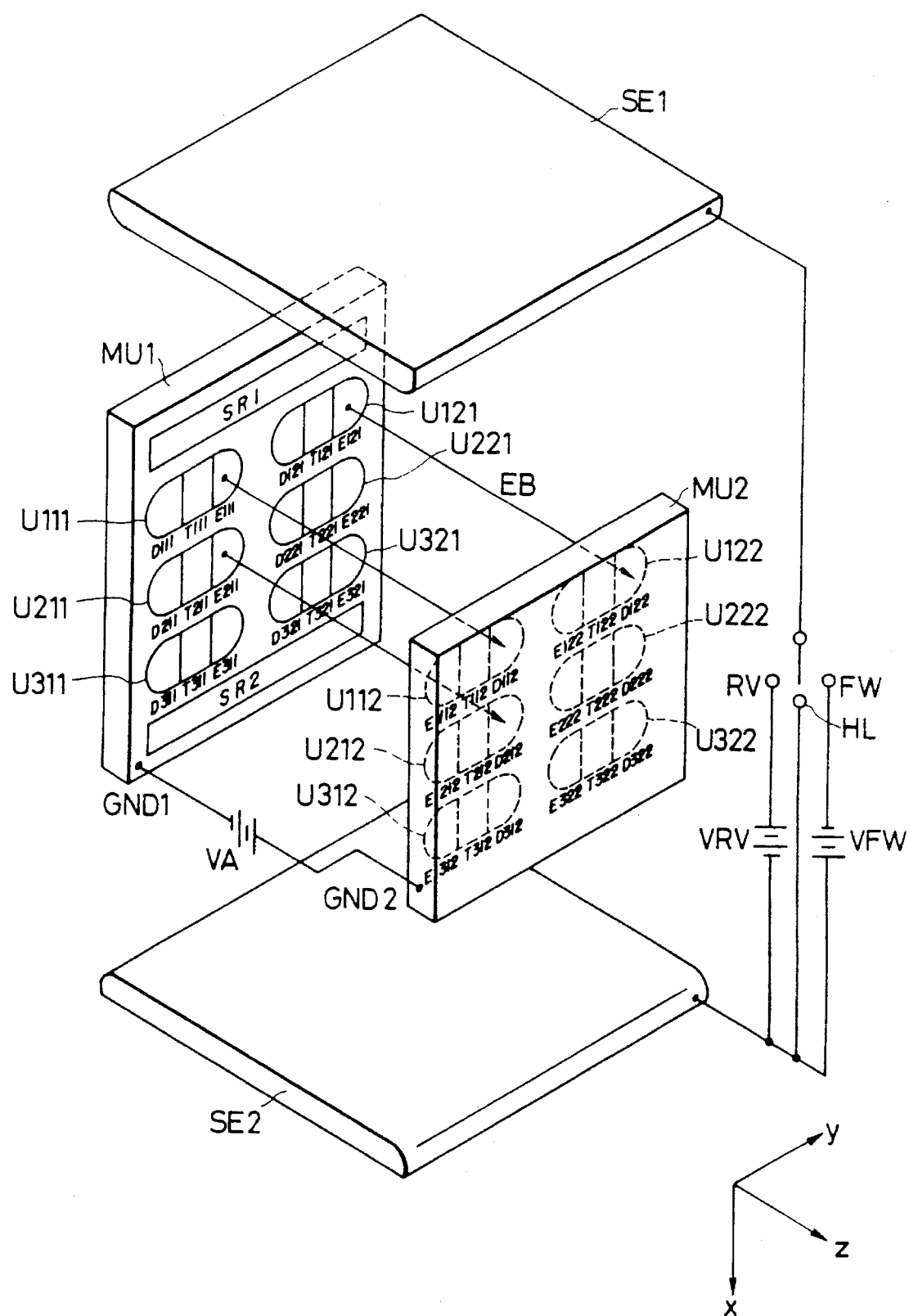
FIGS. 13A and 13B are schematic views of an apparatus for shifting information by deflecting the electron beam according to another application of the method of the present invention.
Figure 13B:
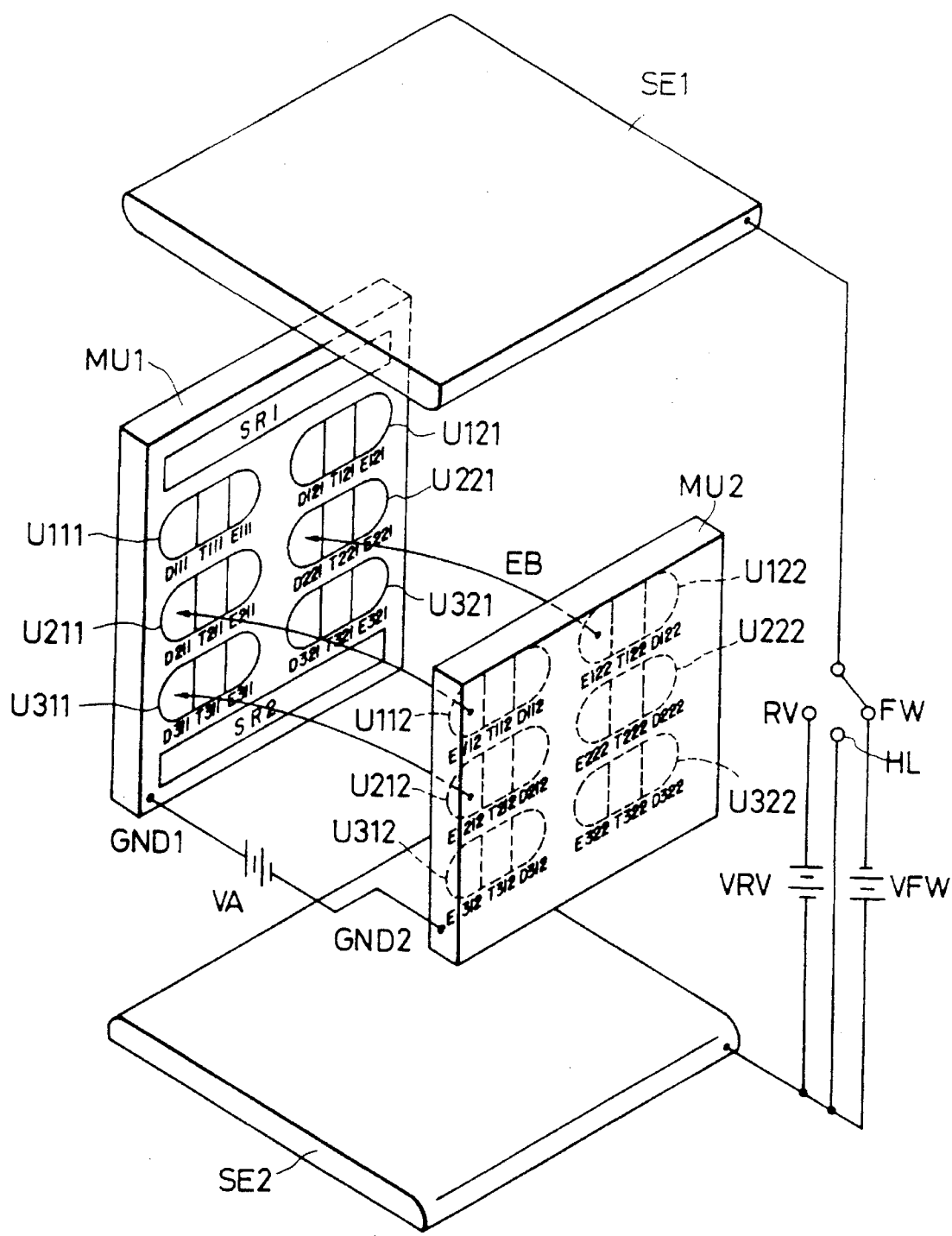

FIGS. 13A and 13B show another application of the information transfer method according to the present invention, exemplifying an information shift apparatus for deflecting electron beams to shift information.

The same reference numerals as in the previous drawings denote the same parts in FIGS. 13A and 13B.

In the information shift apparatus of this application, memory units MU1 and MU2 oppose each other. Each of the memory units MU1 and MU2 include a plurality of unit elements U each consisting of an electron beam detecting means D, a driving means T, and an electron beam source E. For the sake of simplicity, the memory units MU1 and MU2 comprise 3 (row)×2 (column) memory units including the unit elements U111, U121, U211, U221, U311, U321, and the like. The unit elements U can be easily formed by semiconductor techniques such as epitaxial growth and photolithography and have a high packing density. A shift register SR1 is arranged in the upper portion of the memory unit MU1, and a shift register SR2 is arranged in the lower portion of the memory unit MU1. A power source VA is connected between the memory units MU1 and MU2. Deflection electrodes SE1 and SE2 as magnetic field generating means are respectively arranged above and below the memory units MU1 and MU2. A switch RV is arranged between the deflection electrodes SE1 and SE2 through a power source VRV. A switch FW is arranged between the electrodes SE1 and SE2 through a power source VFW. A switch HL is arranged between the electrodes SE1 and SE2 without being through a power source.

The structure and the principle of driving the memory units MU1 and MU2 and the unit elements in this application are substantially the same as those in the sectional view of FIG. 8 and the block diagram of FIG. 9.

A description associated with the structure of the apparatus will be omitted. A description associated with the principle of driving and a description associated with the operation of the information shift apparatus will be described with reference to FIGS. 8, 9, 13A and 13B.

The operation of the electron beam detecting means D will be briefly described. In the W mode, switches SW1, SWN, and SWP are set in the switch W sides. A positive voltage VW is applied to the electrode DI using a voltage at the electrode DN as a reference voltage. The path between the electrodes DN and DP is reverse-biased, and a current is not supplied therethrough. When the electron beam EB is incident through the electrode DI, the beam passes through the electrode DI and causes to generate electron-positive hole pairs in the insulating layer INS. The positive holes in the electron-positive hole pairs are accumulated in the insulating layer INS near the interface between the insulating layer INS and the n-type layer. The charge accumulated as positive holes can be relatively stably stored in the insulating layer INS even if radiation of the electron beam EB is not present.

Read access of the electron beam detecting means D will be described below. A conventional technique is performed such that the electrodes DI and DN are set at identical potentials and a read electron beam is radiated. However, it is preferable to utilize a phenomenon wherein a breakdown voltage obtained upon an application of a reverse-biased voltage across the electrodes DI and DP varies according to the presence/absence of charge accumulated in the insulating layer INS. More specifically, a voltage VR as a positive voltage higher than that in the W mode is applied to the electrode DI not to cause breakdown when the insulating layer INS is not charged, but to cause breakdown when the charge in the insulating layer INS exceeds a predetermined threshold value, thereby supplying a current. By utilizing such a breakdown effect, a high-sensitivity electron beam detecting means D can be obtained. In this case, most of the charge accumulated in the insulating layer INS is preferably discharged in the read mode.

The driving means T is a so-called n-p-n type transistor. Another switching element may be used to drive the electron beam source E. The electron beam detecting means D, the driving means T, and the electron beam source E are isolated from each other by applying a reverse-biased voltage to the p-n junction. The electron beam detecting means D, the driving means T, and the electron beam source E need not be formed on a single substrate. In addition, these elements may be field effect elements.

The mode for emitting the electron beam EB onto the electron beam detecting means D is defined as the R mode. In the W mode, switches SWI, SWN, and SWP are connected to the switch W sides. In this case, when the electron beam EB is incident on the electron beam detecting means D, the charge is accumulated in the insulating layer INS of the electron beam detecting means D in the form of positive holes or the like. The positive holes accumulated in the insulating layer INS can be stably reserved after radiation of electron beams. In this case, in the driving means T, the reverse-biased voltage VB is applied to the electrode TB through the switch SWP in the same manner as in the electrode DP. Therefore, the driving means T is set in the cutoff state, and the electron beam source E is kept inoperative.

In the R mode, the switches SWI, SWN, and SWP are connected to the switch R sides. In this case, a reverse-biased voltage higher than that in the W mode is applied to the electrode DI. Whether the electron beam detecting means D is subjected to breakdown or not is determined according to the radiation history of the electron beams EB, i.e., the presence/absence of radiation. If the electron beam detecting means D is subjected to breakdown, a current is supplied from the electrode DI to the electrode DP. A forward current is supplied from the electrode TB to the electrode TE according to the current supplied from the electrode DI to the electrode DP. Therefore, the driving means T is turned on. The avalanche effect causes supply of a reverse current from the electrode EN to the electrode EP in the electron beam source E. In this state, if a positive voltage is applied to the lead electrode EG, electrons are emitted as electron beams EB. However, if the electron beam detecting means D is not subjected to breakdown, a current is not supplied from the electrode DI to the electrode DP, and the driving means T is kept OFF. As a result, no electron beam EB is emitted from the electron beam source E. In the R mode, the presence/absence of information can be electrically read out from the output terminal OUT. A voltage may be forcibly applied to the input terminal to write information.

The operation of the memory units MU having the above-mentioned unit elements U will be described with reference to FIGS. 13A and 13B. Referring to FIGS. 13A and 13B, shift registers SR1 and SR2 are designed to input/output external information and can be constituted by conventional electrical circuits formed on a semiconductor substrate. The shift register SR1 in FIGS. 13A and 13B is designed to write information to input terminals IN of the unit elements U111 and U121. The shift register SR2 in FIGS. 13A and 13B is designed to read out information from output terminals OUT of the unit elements U311 and U321.

FIG. 13A shows a state wherein information is transferred from the memory unit MU1 to the memory unit MU2 in accordance with the information written in the memory unit MU1. For example, electron beams EB emitted from the electron beam sources E111, E121, and E211 in the memory unit MU1 are respectively incident on the electron beam detecting means D112, D122, and D212, information is transferred from the memory unit MU1 to the memory unit MU2. In this case, the memory unit MU1 is set in the R mode, and the memory unit MU2 is set in the W mode. An acceleration voltage VA is applied to an acceleration electrode GND2 with respect to an electrode GND1. An acceleration electric field directed from the memory unit MU1 to the memory unit MU2 is formed. In the case of FIG. 13A, a potential difference between deflection electrodes SE1 and SE2 as electromagnetic generating means is set to zero. Therefore, the electron beams EB are not deflected.

As shown in FIG. 13B, the memory unit MU1 is set in the W mode, and the memory unit MU2 is set in the R mode. A negative voltage is applied to the acceleration electrode GND2 with respect to the electrode GND1. In this case, if the potential difference between the deflection electrodes SE1 and SE2 is zero, the electron beams EB emitted from the electron beam sources E112, E122, and E212 are respectively incident on the electron beam detecting means D111, D121, and D211. Storage information is held in the same state as in FIG. 13A. However, if a proper voltage VFE is applied to the deflection electrode SE2 with respect to the deflection electrode SE1, and the electron beam EB can be deflected. The electron beams EB are respectively incident on the electron beam detecting means D211, D221, and D311. In this manner, information of the memory unit MU1 can be shifted by one row. By repeating this operation, information can be sequentially shifted.

Figure 14:
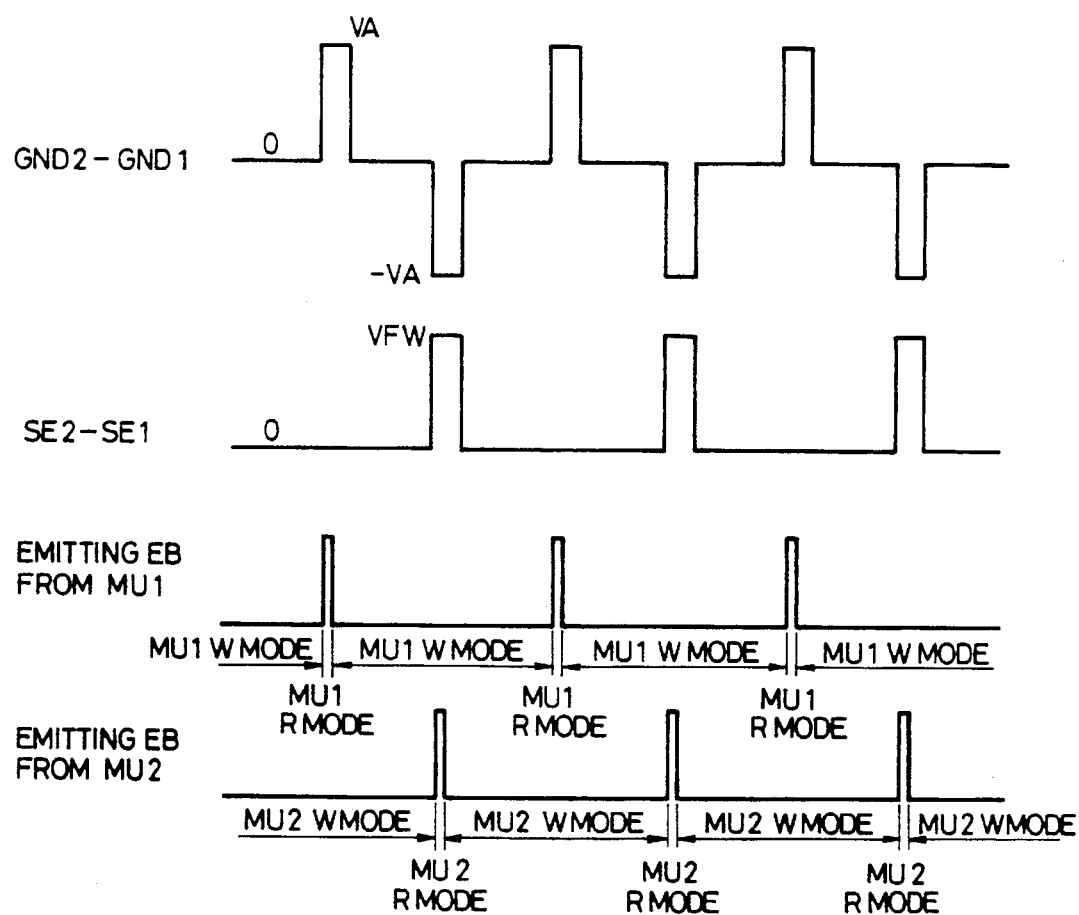
FIG. 14 is a timing chart for explaining information shifting shown in FIGS. 13A and 13B.

FIG. 14 is a timing chart of voltages applied for sequential information shifting. An acceleration voltage applied across the electrodes GND2–GND1 is given as VA, a voltage applied across the deflection electrodes SE2–SE1 is given as 0, the memory unit MU1 is set in the R mode, and the memory unit MU2 is set in the W mode. The electron beam EB is emitted from the memory unit MU1 and incident in the memory unit MU2. The acceleration voltage applied across the electrodes GND2–GND1 is set to –VA, the deflection voltage applied across the electrodes SE2–SE1 is set to VFW, the memory unit MU2 is set in the R mode, and the memory unit MU1 is set in the W mode. The electron beam EB is emitted from the memory unit MU2 and incident on the memory unit MU1, thereby achieving repetitive information shifting.

A time required for emitting the electron beams EB from the memory units MU1 and MU2 is set to be shorter than a time required for applying the acceleration voltage between the electrodes GND2–GND1 or the deflection voltage between the electrodes SE2–SE1, thereby accurately receiving information. The memory units MU1 and MU2 are set in the W mode for a period excluding the period for emitting the electron beams EB. In this state, information stored as the charge in the memory units MU1 and MU2 is stabilized.

The method of shifting information in the application of FIGS. 13A and 13B has been described. However, the shift technique is not limited to this application. In the above application, when the information is transferred from the memory unit MU2 to the memory unit MU1 in the information shift mode, the electron beams EB are deflected. However, when the information is transferred from the memory unit MU1 to the memory unit MU2, the electron beams EB are deflected; when information is shifted from the memory unit MU2 to the memory unit MU1, the electron beams EB need not be deflected.

If is possible to achieve two-row shifting upon an application of the voltage VFW between the deflection electrodes SE2 and SE1. In addition, the memory units MU1 and MU2 are geographically offset by ½ row, and a voltage (½)VFW may be always applied thereto. Shifting of a plurality of rows can be performed by properly selecting the value of the voltage VFW without causing distortion of the track of the electron beam EB. The voltage VRV as a means for applying an electromagnetic field in a direction opposite to that of the voltage VFW in FIGS. 13A and 13B may be applied to perform reverse shifting. In addition, by applying an electric field in the x direction in FIGS. 13A and 13B, column shifting can be performed such that the electron beam EB emitted from the electron beam source E111 can be incident on the electron beam detecting means D122.

The deflecting means may be generally exemplified by an electromagnetic field generating means. In this case, the electric field generating means may be used, or a magnetic field generating means may be used, or both may be used integrally. The electric shift registers SR1 and SR2 shown in FIGS. 13A and 13B may be replaced with a single shift register if the single shift register can control both inputs and outputs of bidirection data.

Figure 15A:
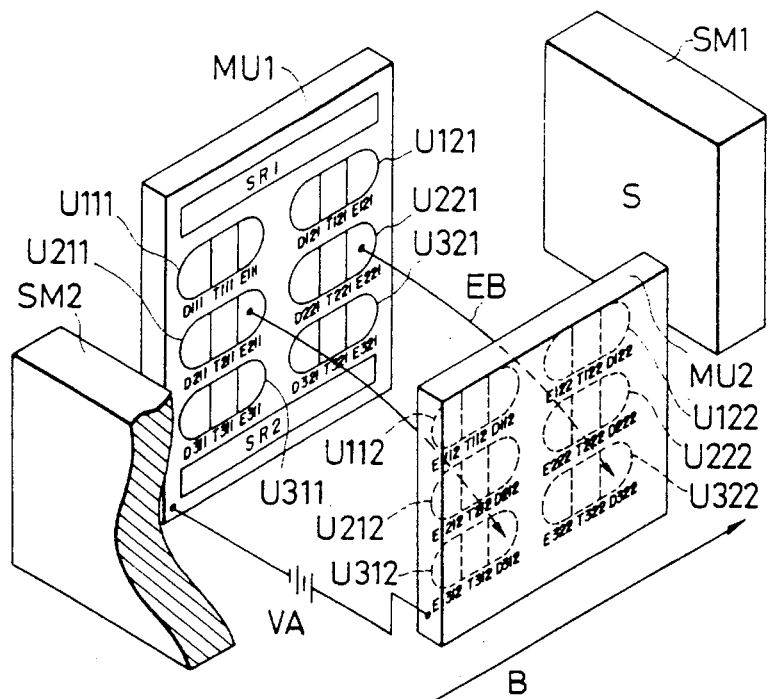
FIGS. 15A and 15B are schematic views showing a modification of the information shift apparatus shown in FIGS. 13A and 13B.
Figure 15B:
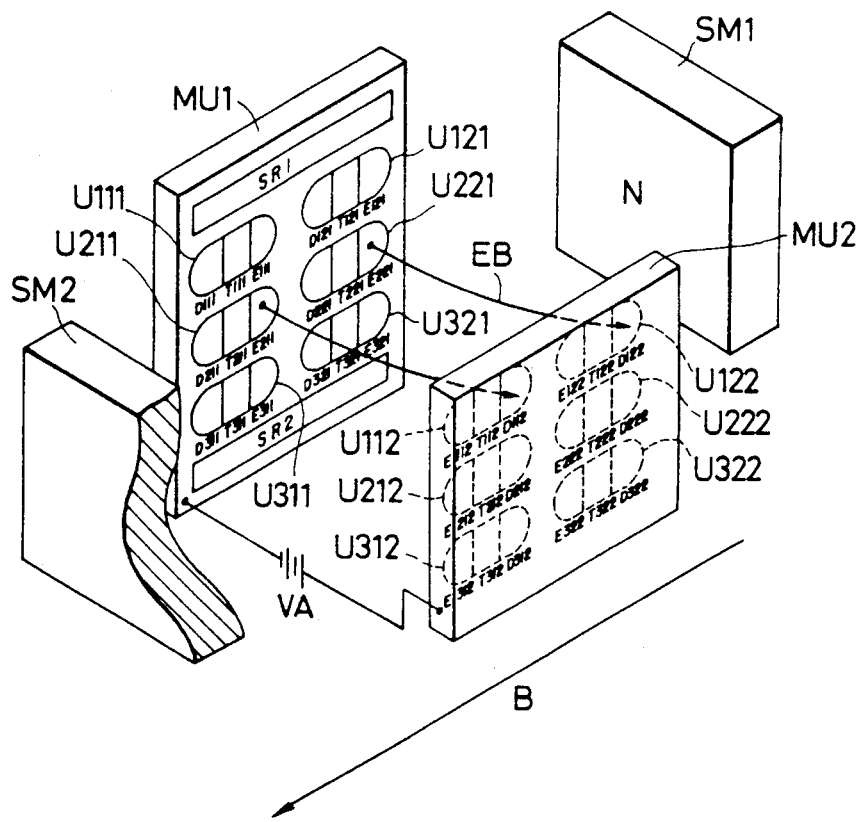

FIGS. 15A and 15B show a modification of an information shift apparatus (FIGS. 13A and 13B) for shifting information by a magnetic field. Magnetic field generating means SM1 and SM2 are arranged to the left and right of the memory units MU1 and MU2, opposing each other in the same manner as in FIGS. 13A and 13B. For example, when information is transferred from the memory unit MU1 to the memory unit MU2 and is shifted, electron beams EB from electron beam sources E211 and E221 are supposed to be incident on electron beam detecting means D212 and D222 if a magnetic field B is not generated by the magnetic field generating means SM1 and SM2. As shown in FIG. 15A, the magnetic field B having a predetermined intensity is generated from the magnetic field generating means SM2 to the magnetic field generating means SM1, the electron beams EB can be shifted toward the direction of the electron beam detecting means D312 and D322. As shown in FIG. 15B, if the magnetic field B is applied from the magnetic field generating means SM1 to the magnetic field generating means SM2, reverse shifting can be performed such that the electron beams EB can be incident from the electron beam sources E211 and E221 to the electron beam detecting means D112 and D122.

Between a plurality of units each consisting of an electron beam source, an electron beam detecting means, and an driving means for driving an electron beam source in response to a signal from the electron beam detecting means in the information shift apparatus, the electron beam from one electron beam source is deflected by the electromagnetic field generating means. The deflected beam can be incident on any one of the plurality of detecting means. Therefore, the electron beam is shifted by an arbitrary amount in an arbitrary direction, thereby achieving information conversion such as serial/parallel information conversion, one-dimensional information conversion, and two-dimensional information conversion.

Figure 16A:
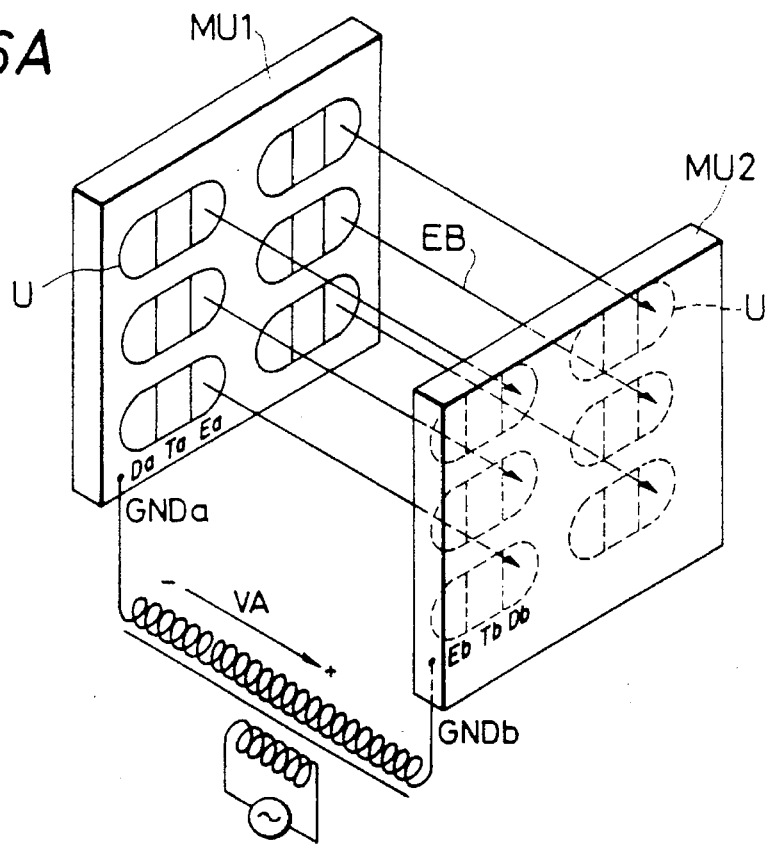
FIGS. 16A and 16B are schematic views of a memory device utilizing juxtaposed memory units according to still another application of the method of the present invention.
Figure 16B:
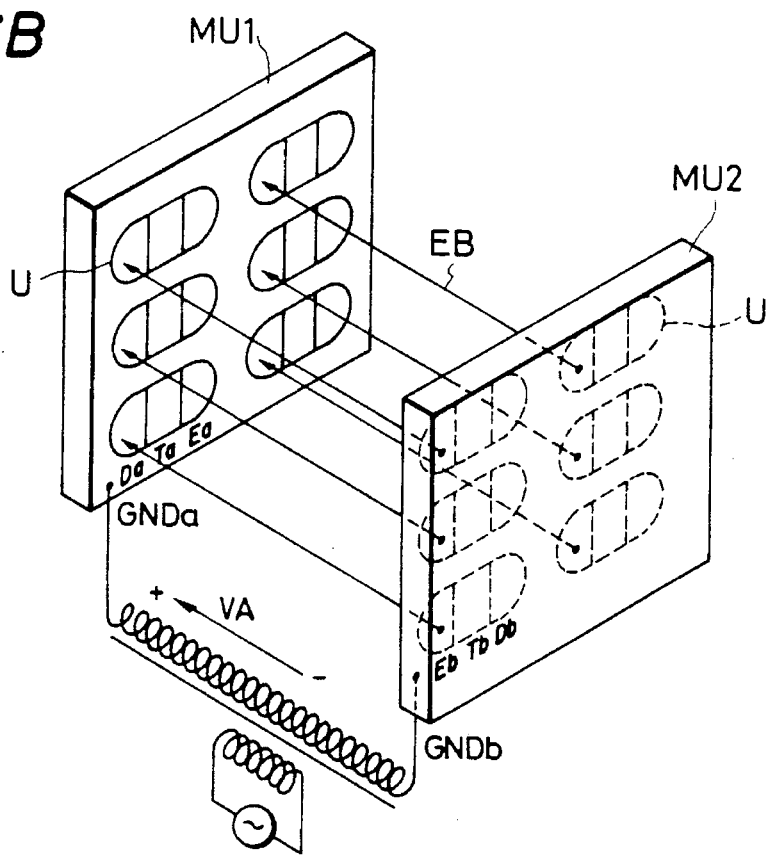

FIGS. 16A and 16B show another application of the information transfer method according to the present invention, exemplifying a memory device by arranging opposite memory units.

The memory device of this application comprises memory units MU1 and MU2 including unit elements U each consisting of an electron beam detecting means D, a driving means T, and an electron beam source E. The memory units MU1 and MU2 oppose each other through a power source VA. Referring to FIGS. 16A and 16B, for the sake of simplicity, each of the memory units MU1 and MU2 comprise a 3 (row)×2 (column) matrix memory unit consisting of six unit elements U. The unit elements U can be formed by semiconductor techniques such as epitaxial growth and photolithography, and can have a very high packing density.

The unit element U arranged in the memory units MU1 and MU2 is shown by the sectional view in FIG. 2, and a detailed description thereof will be omitted.

It should be noted that the electron beam detecting means D, the driving means T, and the solid-state electron beam source E need not be formed on a single substrate and that these elements may be field effect type elements.

Figure 17:
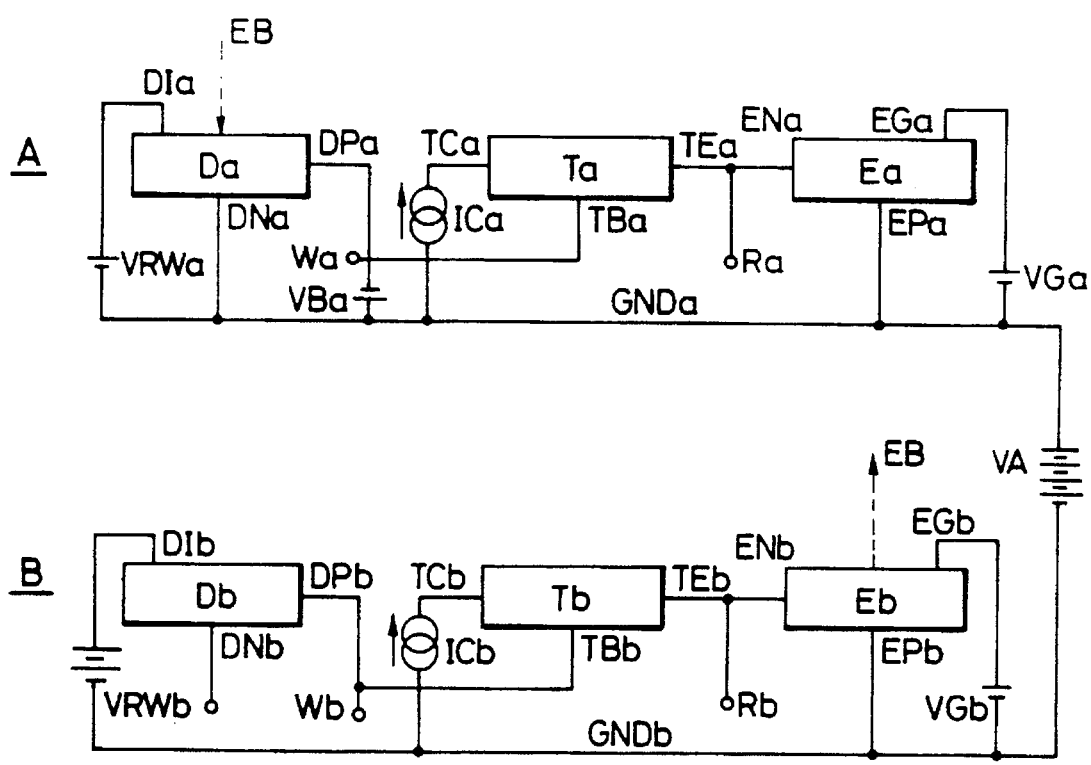
FIG. 17 is a block diagram of a drive unit for driving the memory unit shown in FIGS. 16A and 16B.

FIG. 17 is a block diagram of a drive unit for driving unit elements U in the pair of memory units MU1 and MU2 shown in FIGS. 16A and 16B.

Referring to FIG. 17, an electron beam detecting means Da, a driving means Ta, and a solid-state electron beam source Ea constitute a single unit element A. Similarly, an electron beam detecting means Db, a driving means Tb, and a solid-state electron beam source Eb constitute another unit element B. In the electron beam detecting means Da in the unit element A, a voltage VRWa is applied between an electrode DIa and an acceleration electrode GNDa. An electrode DNa is connected to the acceleration electrode GNDa. A reverse-biased voltage VBa is applied between an electrode DPa and the acceleration electrode GNDa. A current source ICa is connected to an electrode TCa of the driving means Ta. An electrode TBa is connected to the electrode DPa. An electrode TEa is connected to an electrode ENa of an electron beam source Ea. An electrode EPa of the electron beam source Ea is connected to the acceleration electrode GNDa. A voltage VGa is applied to an electrode EGa. The unit element B has substantially the same arrangement as the unit element A. However, a voltage is not applied across electrodes DPb and TBb. A voltage VA is applied between the acceleration electrode GNDa of the unit element A and an acceleration electrode GNDb of the unit element B. When the electron beam detecting means Da and Db can directly drive the solid-state electron beam sources Ea and Eb, the driving means Ta and Tb are assumed to be included in the electron beam detecting means Da and Db.

Referring to FIG. 17, the unit element A is set in the W mode for emitting the electron beam EB onto the electron beam detecting means Da. The unit element B is set in the R mode for emitting the electron beam EB from the electron beam source Eb. In the electron beam detecting means Da in the unit element A, the positive voltage VRWa is applied as a bias voltage to the electrode DIa with reference to a voltage at the electrode DNa. The reverse-biased voltage VBa is applied to the electrode DPa. For this reason, the path between the electrodes DNa and DPa is reverse-biased, and a current is not supplied therethrough. The electron beam EB emitted from the solid-state electron beam source Eb is accelerated by the electron beam acceleration voltage source VA, incident on the electron beam detecting means Da, and passes through the electrode DIa. The positive holes in the electron-positive hole pairs generated in the insulating layer INS are accumulated in the insulating layer near the interface between the insulating layer INS and the n-type layer. The charge accumulated as positive holes are relatively stably reserved without radiation of the electron beam EB. The reverse-biased voltage VBa is applied to the electrode TBa of the driving means Ta, and the driving means Ta is set in the cutoff state, thereby disabling the electron beam source Ea.

A method of detecting the state of the electron beam detecting means Db in the unit element B is one utilizing a phenomenon wherein a breakdown voltage obtained upon an application of the reverse-biased voltage across the electrodes DIb and DPb varies according to the presence/absence of charge accumulated in the insulating layer INS. More specifically, a voltage VRWb as a positive voltage higher than that in the R mode is applied to an electrode DIb not to cause breakdown when the insulating layer INS is not charged but to cause breakdown when the charge in the insulating layer INS exceeds the predetermined threshold value. By utilizing such a breakdown effect, a high-sensitivity electron beam detecting means Db can be obtained.

The detailed mechanism of changes in breakdown voltages caused by history of electron beam radiation is not satisfactorily clarified. However, E. H. Show et al discussed such a mechanism in Proceedings of the IEEE, Vol. 55, No. 7, P. 1168. By utilizing such a breakdown phenomenon, a high-sensitivity detecting means can be obtained. The driving means T comprises an n-p-n type transistor. However, another switching element may be used to drive only the electron beam source.

If the electron beam detecting means Db is subjected to breakdown, a current is supplied from the electrode DIb to the electrode DPb. The driving means Tb for supplying a forward current from the electrode TBb to an electrode TEb is turned on. A reverse current is supplied from an electrode ENb to an electrode EPb in the solid-state electron beam source Eb according to the avalanche effect. In this case, a positive voltage VGb is applied to a lead electrode EGb, the electrons are extracted in a vacuum and accelerated as the electron beam EB by the voltage of the voltage source VA. The accelerated beam is incident on the electron beam detecting means Da. However, if the electron beam detecting means Db is not subjected to breakdown, a current is not supplied from the electrode DIb to the electrode DPb. The driving means Tb is kept OFF. As a result, the electron beam EB is not generated by the solid-state electron beam source Eb.

Referring to FIG. 17, the values of the potentials VRWa and VRWb applied to the unit elements A and B are reversed, the electrode DNa is open, an electrode DNb is connected to the acceleration electrode GNDb, a terminal Wa between the electrodes DPa and TBa is open (i.e., the reverse-biased voltage VBa is withdrawn), a reverse-based voltage VBb is applied to a terminal Wb between the electrodes DPb and TBb, and the direction of the voltage source VA is reversed. Under these conditions, the electron beam EB is generated from the solid-state electron beam source Ea in correspondence with the charge accumulated in the electron beam detecting means Da and is incident on the electron beam detecting means Db.

Electron beam radiation from the solid-state electron beam source Eb to the electron beam detecting means Da, and electron beam radiation from the solid-state electron beam source Ea to the electron beam detecting means Db are alternately performed to always refresh information. The presence/absence of information can be electrically read out from a terminal Rb or the terminal Wb in the state of FIG. 17. A positive or negative voltage is forcibly applied to the terminal Wb or Rb to write information. These techniques may be used to write external information in the memory device or to read information from the memory device.

Refreshing of information between the plurality of unit elements will be described with reference to FIGS. 16A and 16B. Radiation of the electron beam EB from the solid-state electron beam source Ea to the electron beam detecting means Db, as shown in FIG. 16A, and radiation of the electron beam Eb from the solid-state electron beam source Eb to the electron beam detecting means Da, as shown in FIG. 16B, are alternately performed to retain charge information in the electron beam detecting means Da and Db, which information may be generally lost for a long period of time unless otherwise refreshed. As shown in FIGS. 16A and 16B, refreshing can be simultaneously performed between the plurality of unit elements. External input may be received or internal information can be externally output by using one or two of the terminals Wa, Ra, Wb, and Rb shown in FIG. 17. This operation can be performed such that the terminals of the unit elements are connected to a shift register or a multiplexor. In this case, if matrix wiring is available, the number of peripheral elements can be reduced. The shift register, the multiplexor, and the like may be formed integrally on a single substrate having a plurality of unit elements each consisting of the electron beam detecting means D, the driving means T, and the solid-state electron beam source E.

Figure 18A:
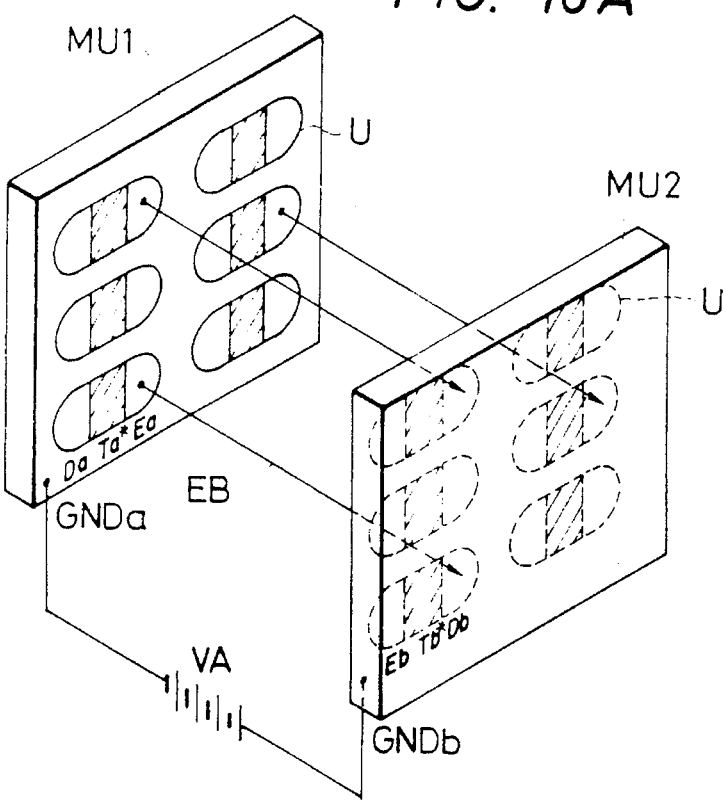
FIGS. 18A and 18B are schematic views showing a modification of the memory device shown in FIGS. 16A and 16B.
Figure 18B:
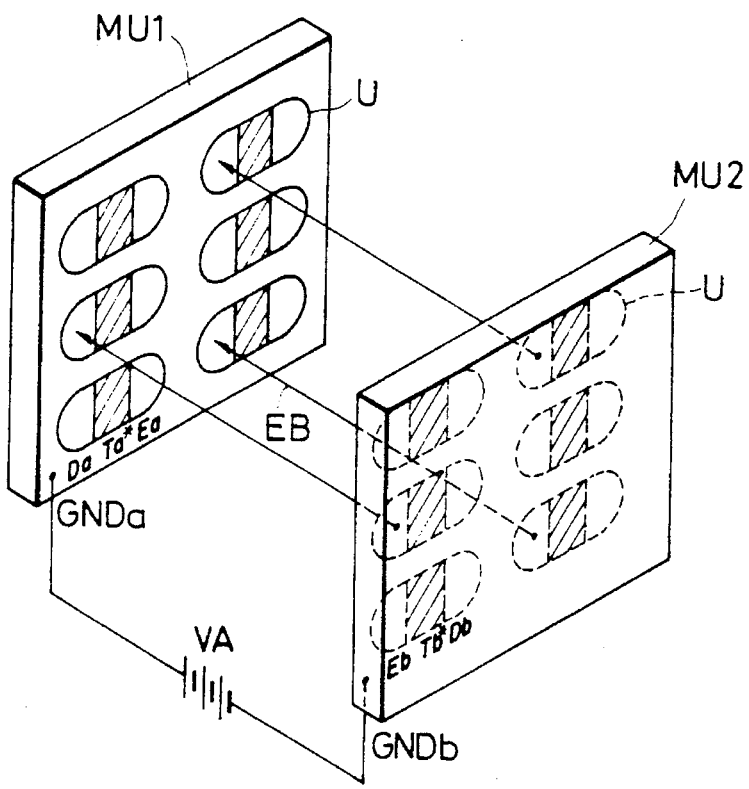

If the electron beam radiation history is present in the electron beam detecting means Da present in FIGS. 16A and 16B, the electron beam EB is generated by the solid-state electron beam source Ea. Otherwise, the electron beam EB is not generated. On the contrary, in this case, for example, inverters in driving means Ta* and Tb* may be used as shown in FIGS. 18A and 18B. If the electron beam radiation history is present in the electron beam detecting means Da, the electron beam EB is not generated from the solid-state electron beam source Ea by the inverting driving means Ta*. Otherwise, the electron beam EB is generated from the solid-state electron beam source Ea. In this case, the memory units MU1 and MU2 store complementarily inverted information.

Figure 40:
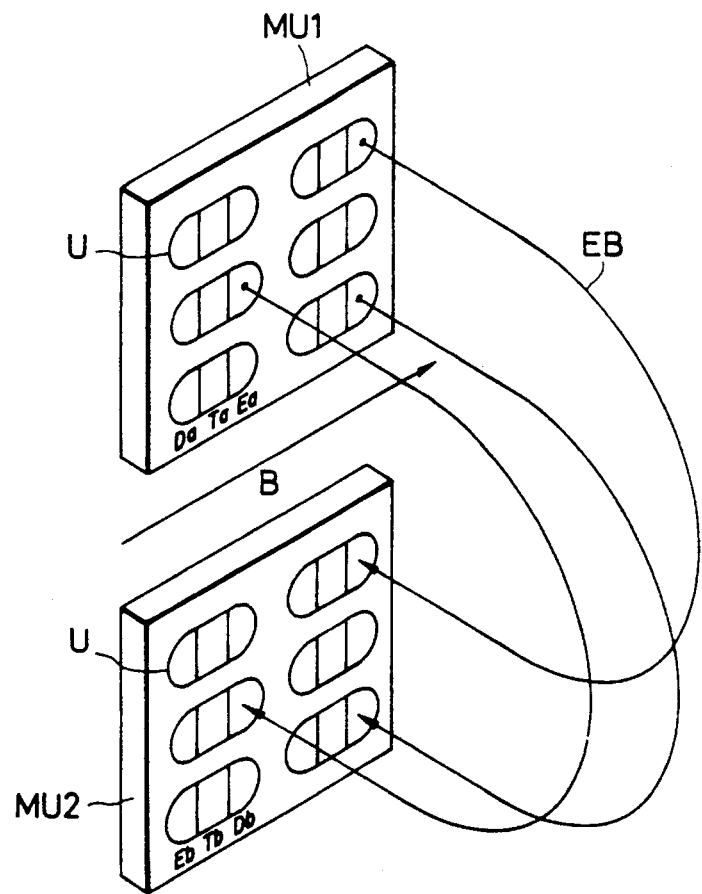
FIG. 40 is a view showing still another modification of the memory device shown in FIGS. 16A and 16B.

A magnetic field and other acceleration electrodes may be used in addition to the voltage source VA of the electric field generating means so as to accelerate the electron beam EB. If a magnetic field is used, the electron beam EB is deflected from the memory unit MU1 to the memory unit MU2 by a magnetic field B indicated by an arrow in FIG. 40. The memory units MU1 and MU2 can be arranged, as shown in FIG. 40. When the direction of the magnetic field B is reversed, the electron beam EB can be incident from the solid-state electron beam source Eb to the electron beam detecting means Da.

In the memory device as described above, the electron beams are exchanged between the plurality of unit elements, each consisting of an electron beam detecting means, a driving means, and an electron beam source. Therefore, high-density refreshing can be performed.

Figure 19A:
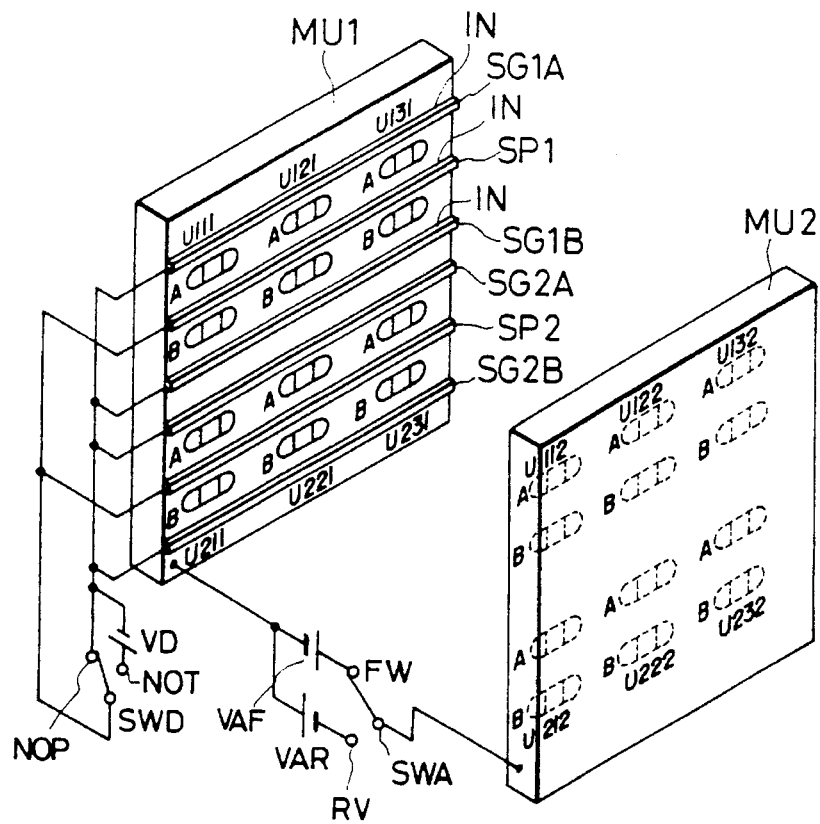
FIGS. 19A and 19B are respectively a schematic view and an enlarged view showing part of the memory device shown in FIGS. 16A and 16B.
Figure 19B:
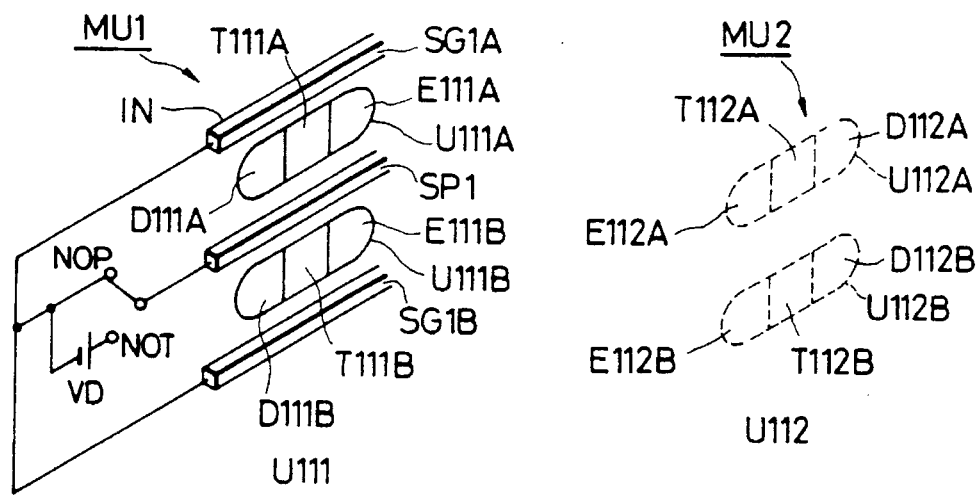

FIGS. 19A and 19B show a modification of the memory device shown in FIGS. 16A and 16B, in which FIG. 19A is a schematic view thereof, and FIG. 19B is an enlarged view showing part thereof.

This modification exemplifies a recording apparatus capable of performing logical inversion of information in addition to the memory function shown in FIGS. 16A and 16B.

Referring to FIGS. 19A and 19B, the main part of the recording apparatus comprises memory units MU1 and MU2 including a plurality of element units each consisting of an electron beam detecting means D, a driving means T, and an electron beam source E. The memory units MU1 and MU2 oppose each other. For the sake of simplicity, the memory units MU1 and MU2 comprise unit elements U111, U121, U131, U211, U221, and U231, and unit elements U112, U122, U132, U212, U222, and U232, respectively. Each unit element comprises 2 (row)×3 (column) matrix unit element. The unit elements can be formed by semiconductor techniques such as epitaxial growth and photolithography, and can have a very high packing density.

Deflection electrodes SP1, SG1A, SG1B, SP2, SG2A, and SG2B are formed in the memory unit MU1 to deflect the electron beams emitted from the electron beam sources E. The deflection electrodes are electrically insulated from the unit elements. A positive component of a deflection voltage VD is applied to the deflection electrodes SG1A, SG1B, SG2A, and SG2B, and a negative component thereof is applied to the deflection electrodes SP1 and SP2 through a switch SWD. A switch SWA is arranged between the memory units MU1 and MU2 to allow an application of an acceleration voltage VAF or a reverse-based acceleration voltage VAR therebetween.

The unit elements U111 to U232 in the memory units MU1 and MU2 in the above arrangement are the same as those shown in FIGS. 16A and 16B, and a detailed description thereof will be omitted.

The operation of the memory device according to this modification will be described with reference to FIGS. 19A and 19B and FIGS. 20A to 22B. FIG. 19B is an enlarged view of the unit elements U111 and U112 shown in FIG. 19A. A unit element U111A includes an electron beam source E111A, a driving means T111A, and an electron beam detecting means D111A. The unit element U111 of the memory unit MU1 opposes the memory unit U112 of the memory unit MU2. When a deflection voltage is not applied to the deflection electrodes SG1A, SG1B, and SP1, the electron beams emitted from the electron beam source E111A and an electron beam source E111B are respectively incident on electron beam detecting means D112A and D112B. However, when the deflection voltage VD is applied to the deflection electrodes SG1A, SG1B, and SP1, the electron beams emitted from the electron beam sources E111A and E111B are incident as follows by properly selecting the value of a voltage VD. For example, the electron beam from an electron beam source E111A is incident on the electron beam detecting means D112B, and the electron beam emitted from the electron beam source E111B is incident on the electron beam detecting means D112A.

In this modification, 1-bit logical information can be processed by the two unit elements, e.g., one unit element (e.g., U111) of the memory unit MU1 and one corresponding unit element (e.g., U112) of the memory unit MU2. In this modification, the memory unit MU1 is set in the R mode, and the memory unit MU2 is set in the W mode. In this state, the electron beam is emitted from the memory unit MU1 and is detected by the memory unit MU2. Subsequently, the memory unit MU1 is set in the W mode and the memory unit MU2 is set in the R mode. In this state, the electron beam is emitted from the memory unit MU2 and detected by the memory unit MU1. These steps constitute one cycle. After one cycle is completed. One cycle is selected from an NOP cycle for holding the logic value upon completion of the previous cycle and an NOT cycle for inverting the logic value upon completion of the previous cycle. One of the NOP and NOT cycles is selected by switching terminals NOP and NOT by the switch SWD.

Figure 20A:
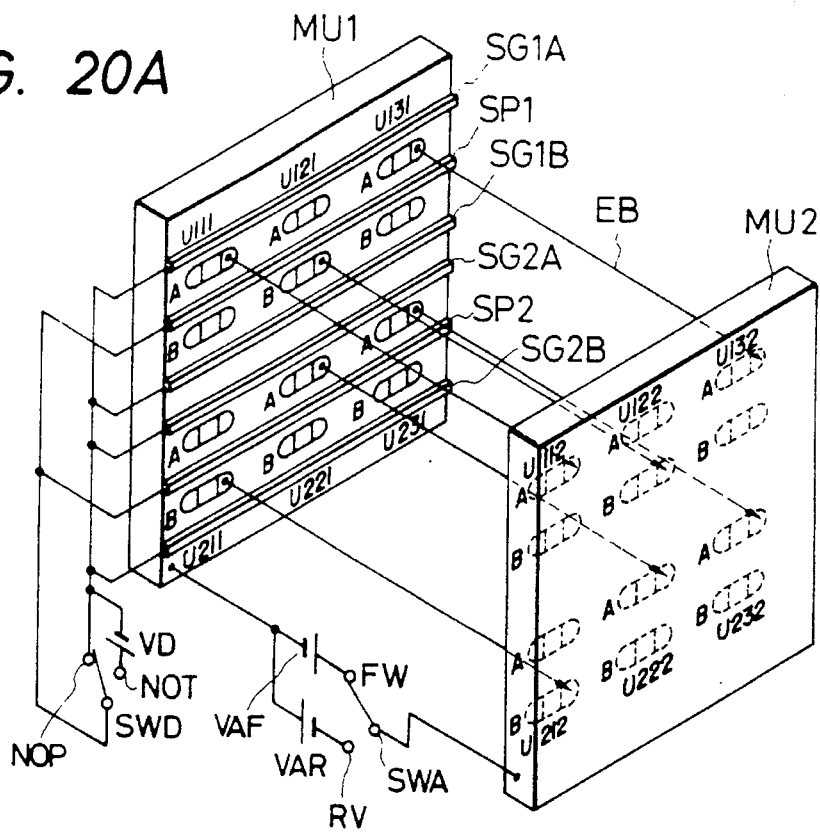
Figure 20B:
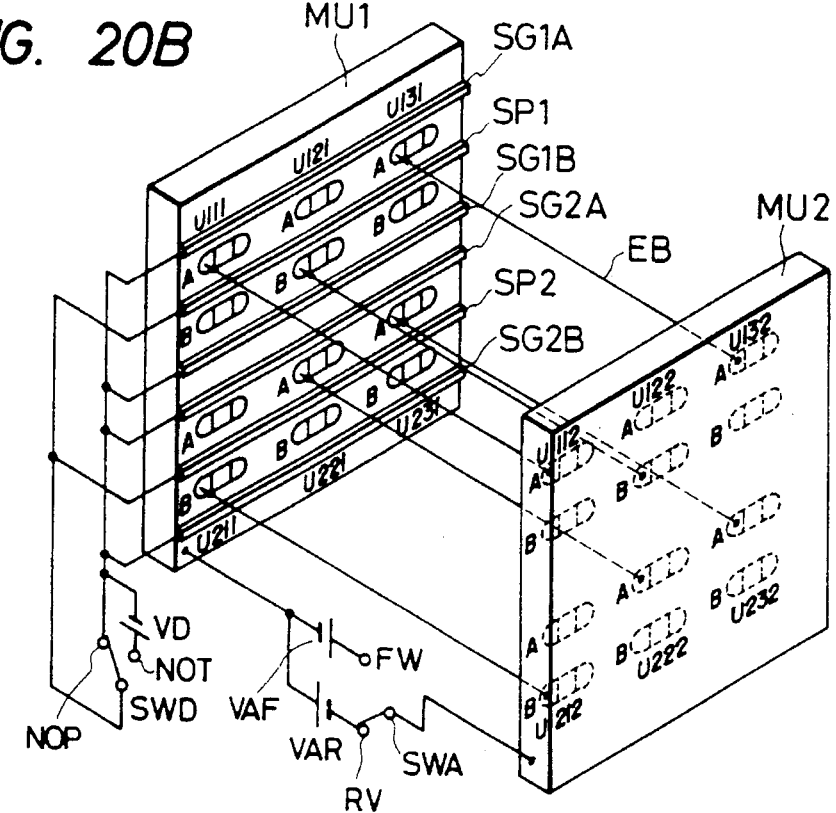

FIGS. 20A and 20B show the NOP cycle in the modification of FIGS. 19A and 19B. FIG. 20A shows a state wherein the memory unit MU1 is set in the R mode and the memory unit MU2 is set in the W mode. The electron beams EB are emitted from the electron beam sources E included in the element U111A and elements U121B, U131A, U211B, U221A, and U231A in the memory unit MU1. A voltage is not applied to the deflection electrodes SP and SG. The electron beams EB are accelerated by an acceleration voltage VAF and are respectively incident on the electron beam detecting means D included in the unit element U112A and elements U122B, U132A, U212B, U222A, and U232A.

FIG. 20B shows a subsequent state of FIG. 20. In the state of FIG. 20B, the memory unit MU2 is set in the R mode and the memory unit MU1 is set in the W mode. As described above, the unit element U111A or the like receives the electron beam EB in the W mode and then emits the electron beam EB in the R mode. Therefore, the operation of FIG. 20B corresponds to that of FIG. 20A. The electron beams EB are emitted from the electron beam sources E of the unit elements U112A, U122B, U132A, U212B, U222A, and U232A and are incident on the electron beam detecting means D of the unit elements U111A, U121B, U131A, U211B, and U221A upon acceleration with the acceleration voltage VAR. If the next cycle is the NOP cycle, the operation is returned to that in FIG. 20A. The state shown in FIGS. 20A and 20B is maintained until the NOP cycle continues.

The pair of unit elements processing one bit can be set in one of the operation states, as shown in FIGS. 20A and 20B. The first operation state is defined such that the electron beam EB is emitted from the unit element in the memory unit MU1 and the electron beam is not emitted from the unit element in the memory unit MU2. The second operation state is defined such that the electron beam EB is emitted from the unit element in the memory unit MU2 and the electron beam is not emitted from the unit element in the memory unit MU1. For example, if the electron beam EB is emitted from the memory unit MU1 and the electron beam EB is not emitted from the memory unit MU2, a logic value of "1" is set. If the electron beam is emitted from the memory unit MU2 and the electron beam is not emitted from the memory unit MU1, a logic value of "0" is set. In this case, information "1, 0, 1, 0, 1, 0" is set in the order of pairs of unit elements (U111, U112), (U121, U122), (U131, U132), (U211, U212), (U221, U222), and (U231, U232).

Figure 21A:
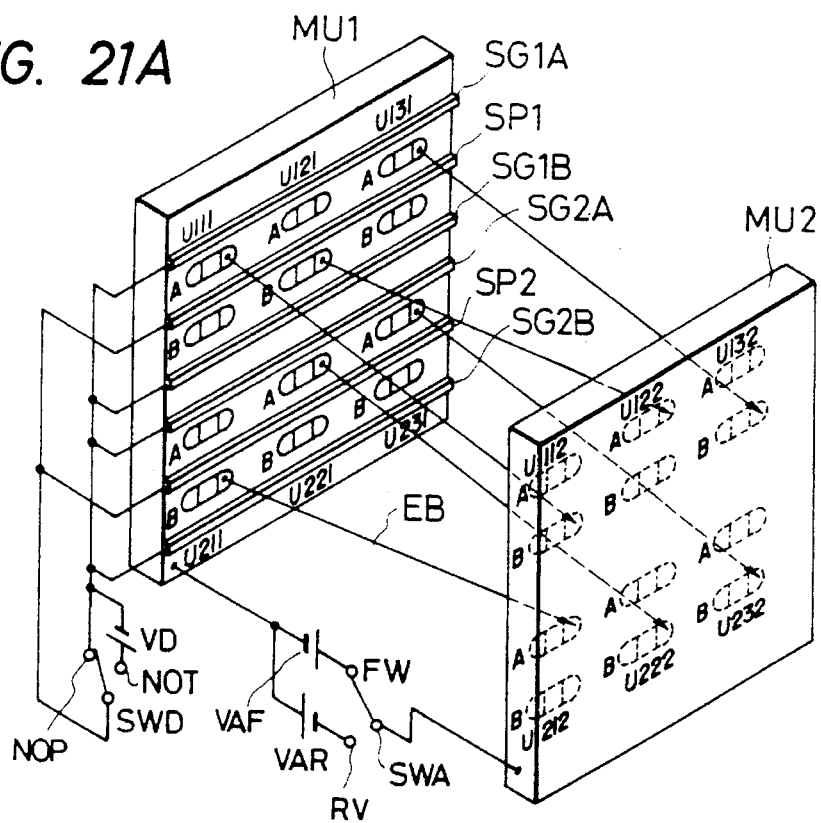
Figure 21B:
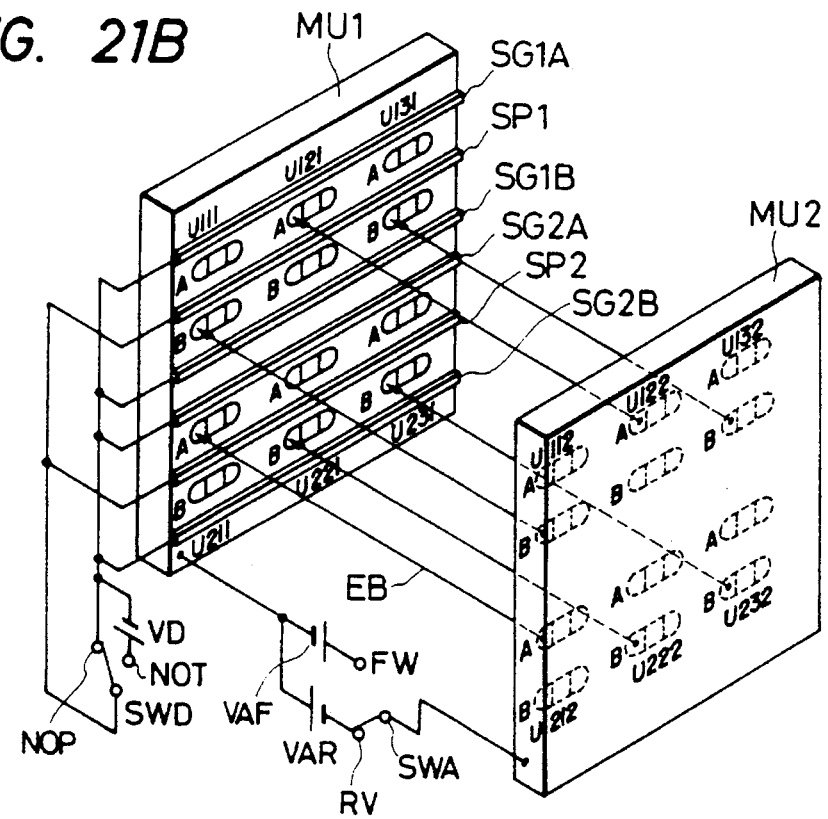

FIGS. 21A and 21B are views for explaining the NOT cycle in the modification of FIGS. 19A and 19B. Referring to FIG. 21A, the memory unit MU1 is set in the R mode. For example, the electron beams EB are emitted from the electron beam sources E of the unit elements U111A, U121B, U131A, U211B, U221A, and U231A. In this case, the deflection voltage VD is applied between the deflection electrodes SG1A and SP1, between the deflection electrodes SG1B and SP1, between the deflection electrodes SG2A and SP2, and between the deflection electrodes SG2B and SP2. The electron beams EB are deflected by the electric field generated by the deflection voltage VD and at the same time are accelerated by the acceleration voltage VAF. The accelerated electron beams are respectively incident on unit elements U112B, U122A, U132B, U212A, U222B, and U232B.

FIG. 21B shows a subsequent state of FIG. 21A. In this state in FIG. 21B, the memory unit MU2 is set in the R mode. Since no deflection electrodes are arranged in the memory unit MU2, the electron beams EB emitted from the electron beam sources E of the unit elements U112B, U122A, U132B, U212A, U222B, and U232B in correspondence with the results of FIG. 21A are accelerated by the accelerated voltage VAR. The accelerated electron beams are respectively incident on the electron beam detecting means D of unit elements U111B, U121A, U131B, U211A, U221B, and U231B.

Figure 22A:
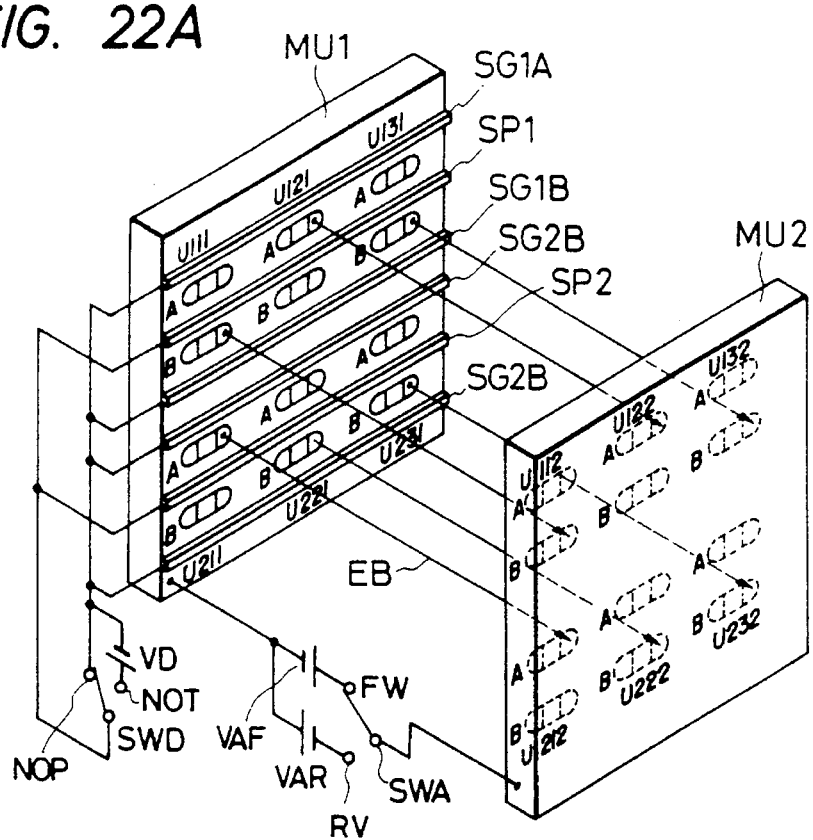
Figure 22B:
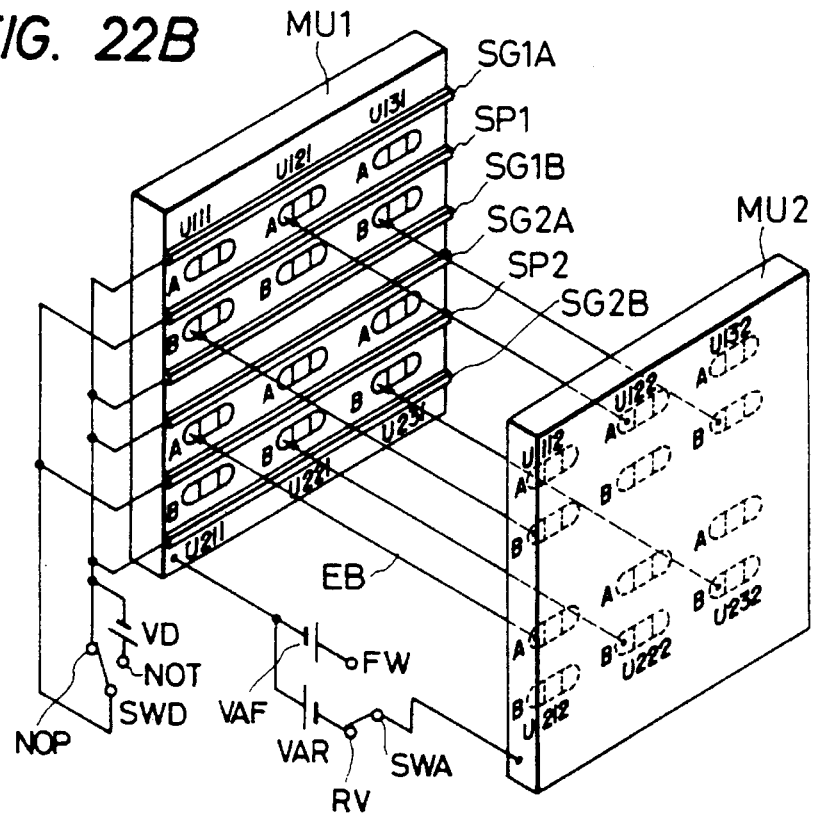

FIGS. 22A and 22B show an NOP cycle after the cycle of FIGS. 21A and 21B. As described with reference to FIG. 20A and 20B, the information of the previous cycle is held in the NOP cycle. The same information as in FIG. 21B is held in the state of FIG. 22B. In other words, information "0, 1, 0, 1, 0, 0" is held in the order of the pairs of unit elements (U111, U112), (U121, U122), (U131, U132), (U211, U212), (U221, U222), and (U231, U232). The NOT cycle of FIGS. 21A and 21B for the state of FIGS. 20A and 20B is performed so that all logical values are inverted.

In the above modification, the logical inversion operation is performed by deflecting the electron beams by the electric field. However, the electron beams may be deflected by a magnetic field. The electron beams emitted from the electron beam sources can be deflected by the magnetic field. The memory units MU1 and MU2 oppose each other. However, such a disposition is not an essential part of the present invention. If an arrangement is assured wherein the corresponding unit elements of the memory units can exchange the electron beams by using an electromagnetic field or any other means and the beams can be externally controlled such that the electron beams emitted from the electron beam sources of one memory unit can be incident on the electron beam detecting means of the other memory unit, such a modification can be made within the spirit and scope of the invention.

As described above in detail, in the memory device for performing logic inversion operations, two-dimensional information is stored in the memory device, or all pieces of information are subjected to parallel logical inversion at high speed. This memory device can be effectively used for especially image processing.

Figure 23:
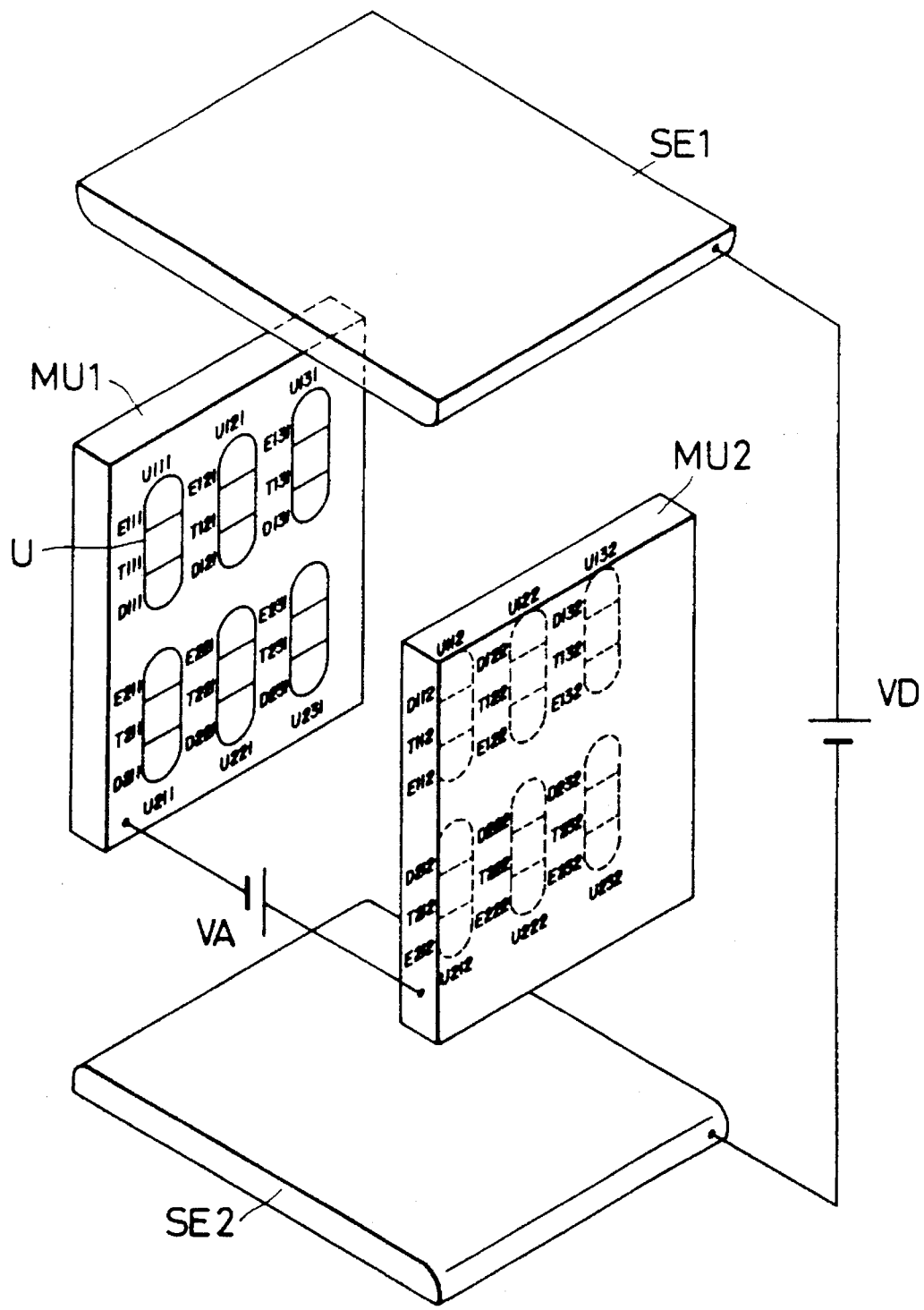
FIG. 23 is a schematic view showing another modification of the memory device shown in FIGS. 16A and 16B.

FIG. 23 shows another modification of the memory device shown in FIGS. 16A and 16B, exemplifying a memory device having a logical inversion operation function in the same manner as shown in FIGS. 19A and 19B.

The same reference numerals as in FIGS. 16A and 16B and FIGS. 19A and 19B denote the same parts in FIG. 23.

The memory device of this modification comprises memory units MU1 and MU2 including a plurality of unit elements U each consisting of an electron beam detecting means D, a driving means T, and an electron beam source E. The memory units MU1 and MU2 oppose each other. For the sake of simplicity, referring to FIG. 23, the memory units MU1 and MU2 comprise 2 (row)×3 (column) matrix memory units consisting of unit elements U111, U121, U131, U211, U221 and U231, and unit elements U112, U122, U132, U212, U222 and U232, respectively. The unit elements U are formed by semiconductor techniques such as epitaxial growth and photolithography and can have a very high packing density. A power source VA is arranged between the memory units MU1 and MU2. Deflection electrodes SE1 and SE2 as electromagnetic field generating means are arranged above and below the memory units MU1 and MU2. A power source VD is arranged between the deflection electrodes SE1 and SE2.

The structures of the memory units MU1 and MU2 and the unit elements are the same as those in the sectional view of FIG. 8.

Figure 24:
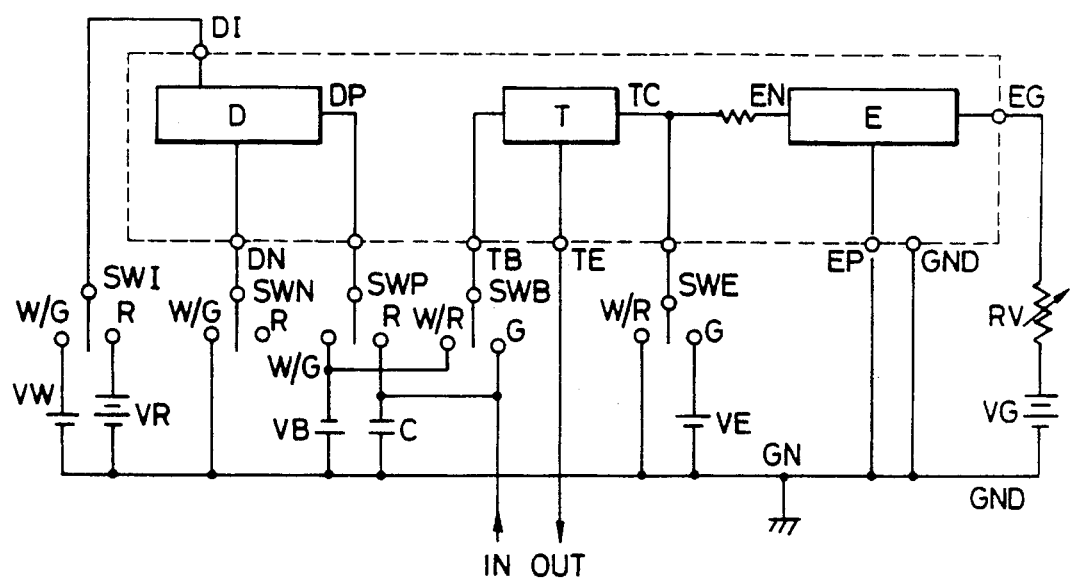
FIG. 24 is a block diagram of a drive unit for driving the memory unit shown in FIG. 23.

FIG. 24 is a block diagram of a drive unit for driving the unit elements of this modification.

A switch SWI is connected to an electrode DI of the electron beam detecting means D, a switch SWN is connected to an electrode DN therein, and a switch SWP is connected to an electrode DP therein. A switch SWB is connected to an electrode TB of the driving means T, and a switch SWE is connected to an electrode TC thereof. A mode for writing an electron beam EB in the electron beam detecting means D is defined as a W mode. A mode for reading out information from the electron beam detecting means is defined as an R mode. A mode for emitting the electron beam EB from the electron beam source E corresponding to this information is defined as a G mode. An electron beam exit terminal W/G and a read terminal R oppose each of the switches SWI, SWN, and SWP. A voltage VW is applied to the terminal W/G corresponding to the switch SWI, and a voltage VR is applied to the terminal R corresponding thereto. The terminal W/G corresponding to the switch SWN is connected to a ground electrode GN, and the terminal R corresponding thereto is open. A negative voltage VB is applied to the terminal W/G corresponding to the switch SWP, and the terminal R thereof is connected to the W/G side where information is temporarily saved. The switches SWB and SWE are connected to the W/R side. The positive voltage VW is applied as a bias voltage to the electrode DI with reference to the voltage at the electrode DN in the electron beam detecting mean D. The positive voltage VW is applied as a bias voltage to the electrode DP. The path between the electrodes DN and DP is reverse-biased, and a current is not supplied therethrough. As shown in FIG. 8, the electron beam EB passes through the electrode DI and generates electron-hole pairs in the insulating layer INS. The holes in the electron-hole pairs are accumulated in the insulating layer INS near an interface between the insulating layer INS and an n-type layer. The charge accumulated as positive holes is reserved relatively stably even if the electron beam EB is not emitted thereon. Since the reverse-biased voltage VB is applied to the electrode TB in the drive means T through the electrode DP in the same manner as in the electrode DP, the driving means T is maintained in the cutoff state, and the electron beam source E is kept inoperative.

In the R mode, the switches SWI, SWN, and SWP are connected to the switch R sides. The switches SWB and SWE are connected to the W/R sides. In this case, a preferable method of detecting a state of the electron beam detecting means D is one utilizing a phenomenon wherein a breakdown voltage obtained upon an application of a reverse-biased voltage across the electrodes DI and DP varies depending on the presence/absence of charge accumulated in the insulating layer INS. If charge is not accumulated in the insulating layer INS, a positive voltage having a magnitude higher than that of the W mode is applied to the electrode DI without causing breakdown. However, if charge is accumulated in the insulating layer INS at a level higher than a given threshold value, the above-mentioned positive voltage is applied to the electrode DI to cause breakdown, thereby performing reading. By utilizing the breakdown effect, a high-sensitivity electron beam detecting means D can be obtained.

When the charge in the insulating layer INS exceeds the threshold value and the electron beam detecting means D is subjected to breakdown, a current is supplied from the electrode DI to the electrode DP. Since the forward-biased current is supplied from the electrode DI to the electrode DP to charge a capacitor C through the switch SWP. However, when the electron beam detecting means D is not subjected to breakdown, a current is not supplied from the electrode DI to the electrode DP and the capacitor C is not charged.

Subsequently, in the G mode of electron beam radiation, the switches SWI, SWN, and SWP are connected to the terminal W/G sides, and the switches SWB and SWE are connected to the terminal G sides. If the capacitor C is charged, the charge as a current is supplied from the electrode TB to an electrode TE through the switch SWB. Therefore, the driving means T is turned on. However, a voltage VE is bypassed from the electrode TC to the electrode TE in the driving means T, and the voltage is not applied to an electrode EN of the electron beam source E. In this case, the electron beam EB is not emitted from the electron beam source E. However, if the capacitor C is not charged, a current is not flowed from the electrode TB to the electrode TE, and the driving means T is kept off. As a result, the voltage is applied to the electrode EN. The electron beam source E is driven and the electron beam EB is emitted. More specifically, if the electron beam EB is emitted onto the electron beam detecting means D in the W mode, the electron beam EB is not emitted from the electron beam source E in the G mode following the R mode. If the electron beam EB is not incident on the electron beam detecting means D in the W mode, the electron beam EB is emitted from the electron beam source E in the G mode following the R mode.

The amount of current of the electron beam EB emitted from the electron beam source E can be controlled by a variable resistor RV inserted between the electron beam source E and the power source VG.

And yet, two types of R modes can be set. The first mode is an RD mode wherein a substantial amount of the charge accumulated in the electron beam detecting means D is read out to perform perfect destructive readout; and the second mode is an RN mode wherein the accumulated voltage is partially read out to leave a charge component whose level exceeds the threshold value, thereby performing partial destructive readout. For example, the RD mode is set to read out information for a period of time enough to completely read out the accumulated charge. The RN mode is set to read out information for a relatively short period of time. As shown in FIG. 24, in the G mode, the presence/absence of information can be electrically read out from the output terminal OUT in the G mode. A voltage is forcibly applied to the input terminal IN to write information.

The operation of the above arrangement using the memory units MU including the above-mentioned unit elements U will be described with reference to FIGS. 25A and 25B to FIGS. 27A and 27B. In this modification, one unit element in the memory unit MU2 opposite the memory unit MU1 and one unit element in the memory unit MU1 can deal with 1-bit information. This information represents a logical value, i.e., "1" or "0". The W, R, and G modes of the memory unit MU1 and then the W, R, and G modes of the memory unit MU2 constitute one cycle. One cycle can be selected from an NOP cycle for holding the logical value obtained upon completion of the previous cycle and an NOT cycle for inverting the logical value obtained upon completion of the previous cycle.

Figure 25A:
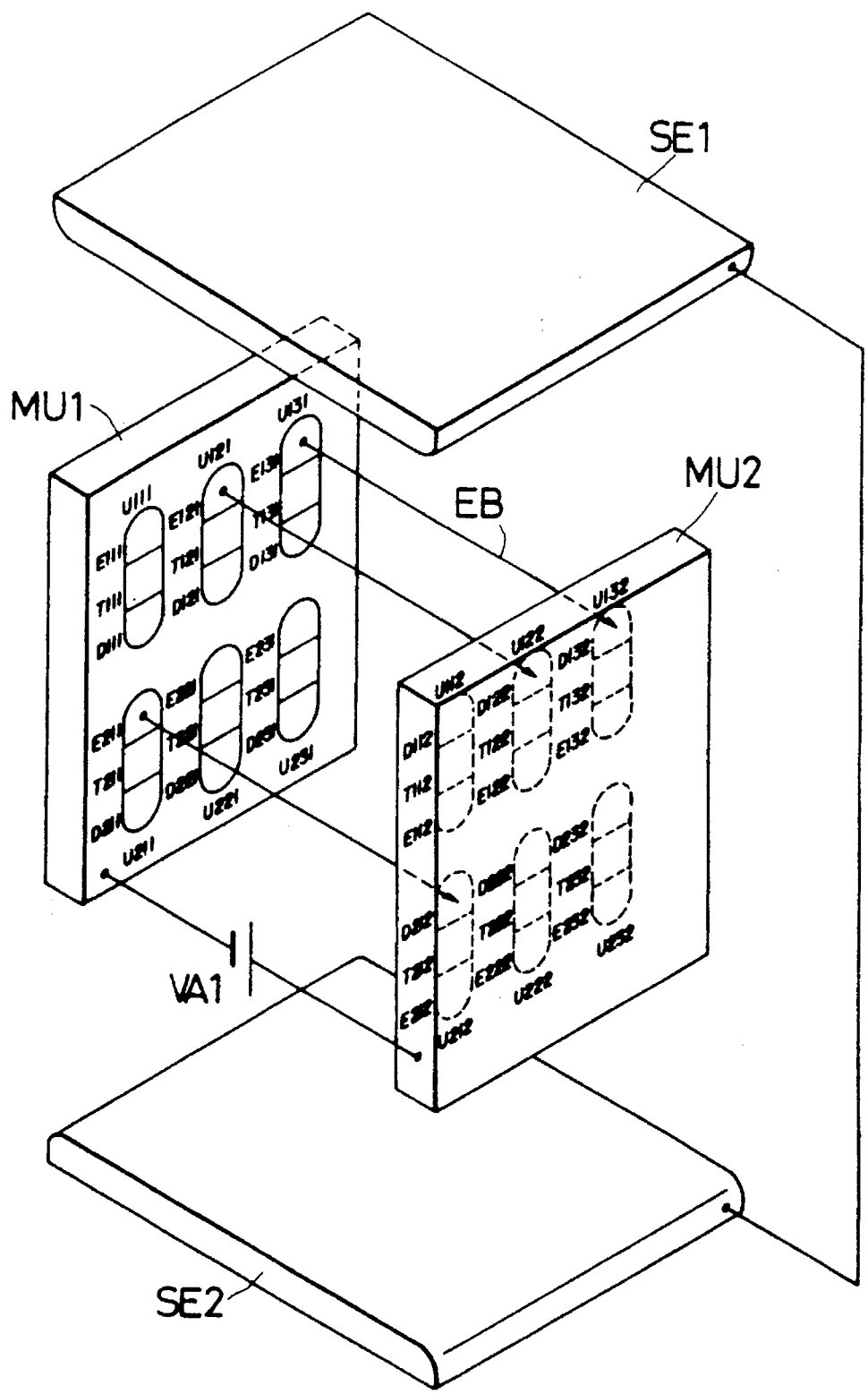
Figure 25B:
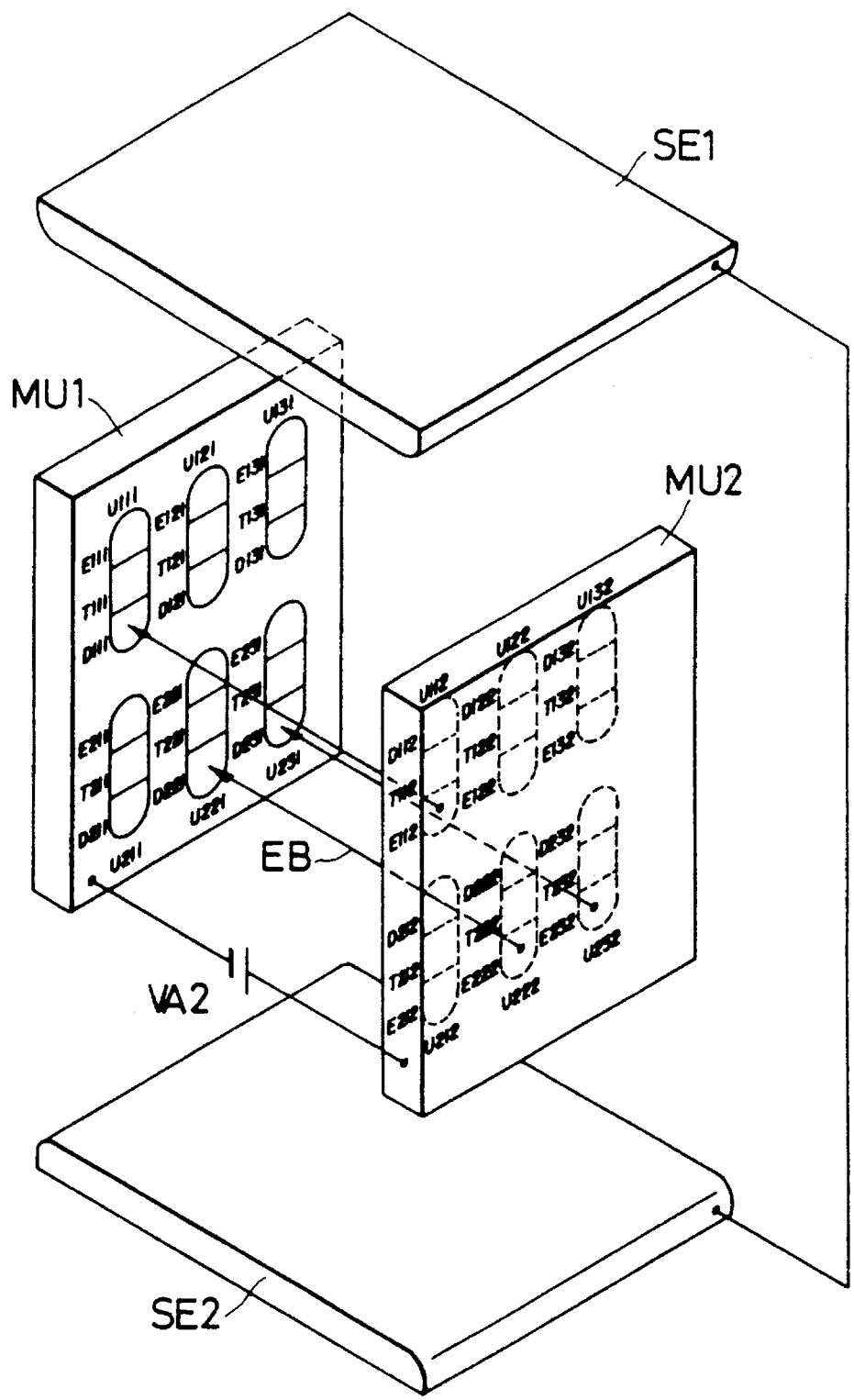

FIGS. 25A and 25B show the NOP cycle of the modification of FIG. 23. FIG. 25A shows a state wherein the memory unit MU1 is set in the G mode and the memory unit MU2 is set in the W mode. Electron beams EB are emitted from, e.g., electron beam sources E121, E131, and E211 in the memory unit MU1 according to information obtained upon completion of the previous cycle. No voltage is applied to the deflection electrodes SE1 and SE2. The electron beams EB are accelerated by the acceleration electric field generated by the acceleration voltage VA and applied from the memory unit MU1 to the memory unit MU2. The accelerated electron beams reach the electron beam detecting means D122, D132, and D212. FIG. 25B shows a subsequent state of FIG. 25A. In the state of FIG. 25B, the memory unit MU2 is set in the G mode, and the memory unit MU1 is set in the W mode. In the unit elements U111, U112, ..., if the electron beam EB is incident in the W mode, the electron beam EB in the G mode following the R mode is not emitted. If the electron beam EB is not emitted in the W mode, the electron beam EB is output in the G mode following the R mode. Referring to FIG. 25B, the electron beams EB emitted from the electron beam sources E112, E222, and E232 are accelerated by the acceleration electric field generated by the acceleration voltage VA2 and applied from the memory unit MU2 to the memory unit MU1. The accelerated beams are respectively incident on the corresponding electron beam detecting means D111, D221, and D231. If the next cycle is the NOP cycle, the state in FIG. 25A is restored. The state in FIGS. 25A and 25B are maintained if the NOP cycle continues.

The pair of unit elements processing one bit can be set in one of the operation states. The first operation state is defined such that the electron beam EB is emitted from the unit element in the memory unit MU1 and the electron beam is not emitted from the unit element in the memory unit MU2. The second operation state is defined such that the electron beam EB is emitted from the unit element in the memory unit MU2 and the electron beam is not emitted from the unit element in the memory unit MU1. For example, if the electron beam EB is emitted from the memory unit MU1 and the electron beam EB is not emitted from the memory unit MU2, a logic value of "1" is set. If the electron beam is emitted from the memory unit MU2 and the electron beam is not emitted from the memory unit MU1, a logic value of "0" is set. In the case of FIGS. 25A and 25B, information "0, 1, 1, 1, 0, 0" is set in the order of pairs of unit elements (U111, U112), (U121, U122), (U131, U132), (U211, U212), (U221, U222), and (U231, U232).

Figure 26A:
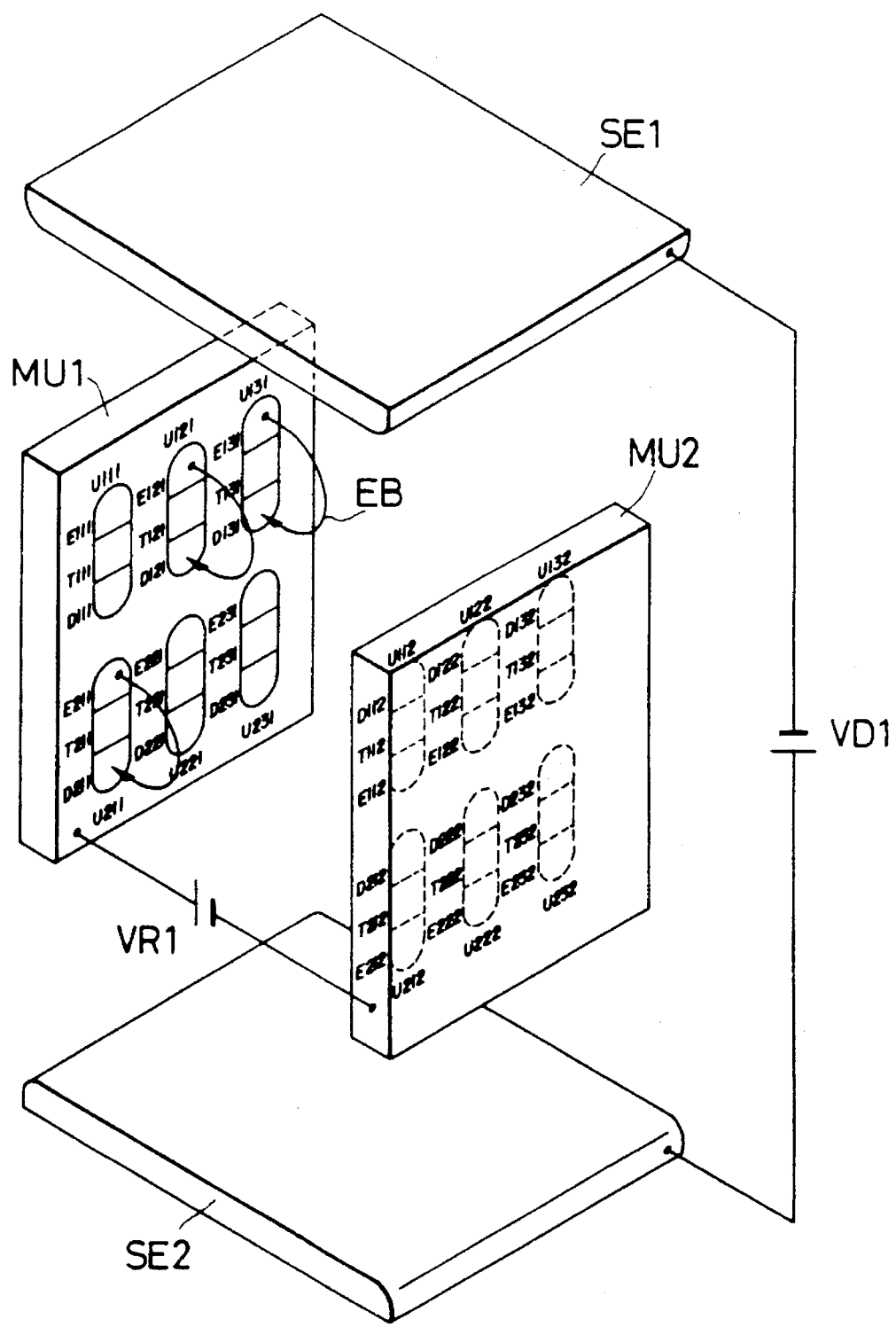
Figure 26B:
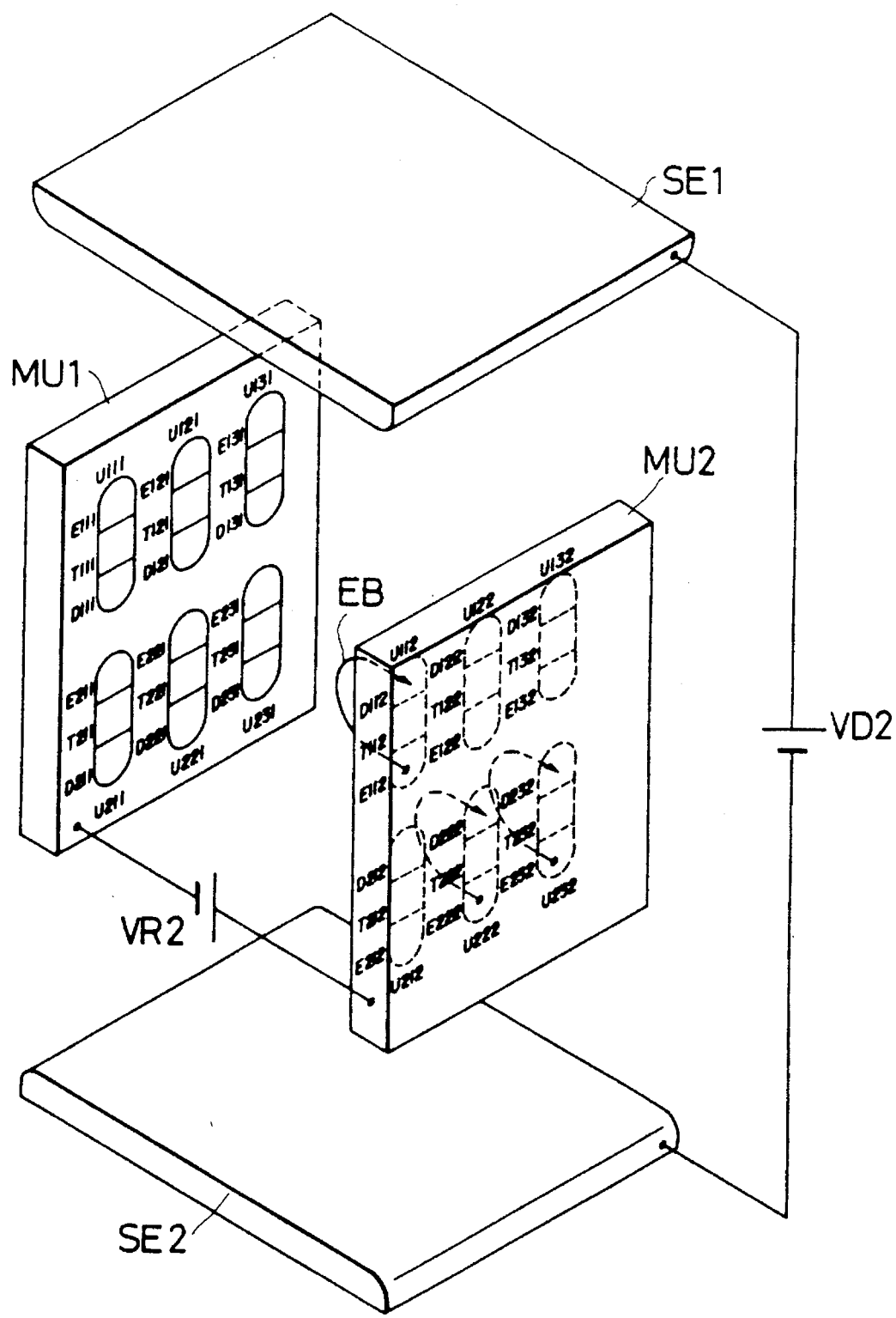

FIGS. 26A and 26B are views for explaining the NOT cycle in the modification of FIG. 23. In FIG. 26A, the memory unit MU1 is set in the G mode. The electron beams EB are emitted from the electron beam sources E121, E131, and E211 in correspondence with the information in the same manner as in FIGS. 25A and 25B. In this case, a reverse-biased acceleration voltage VR1 is applied between the memory units MU1 and MU2. A reverse-biased acceleration electric field is applied from the memory unit MU2 to the memory unit MU1. A deflection voltage is applied between the deflection electrodes SE1 and SE2 and thus a deflection electric field between the electrode SE1 and SE2 is formed. An electric field induced by these voltages is properly controlled to emit the electron beam EB from the electron beam source E of each unit element U in the memory unit MU1 onto the electron beam detecting means D of the corresponding unit element U in the memory unit MU1. For example, the electron beams EB emitted from the electron beam sources E121, E131, and E211 can be respectively incident on the electron beam detecting means D121, D131, and D211. As described above, when the G mode is set in the memory unit MU, the electron beam detecting means D of each unit element U is set in a state as if it is set in the W mode. Therefore, the charge can be accumulated again in the electron beam detecting means D with this incident electron beam EB.

FIG. 26B shows a subsequent state of FIG. 26A. In the state of FIG. 26B, the memory unit MU2 is set in the G mode. The polarity of the reverse-biased acceleration voltage VR2 applied between the memory units MU1 and MU2 and the polarity of the deflection voltage VD2 applied between the deflection electrodes SE1 and SE2 are reversed from the polarities of the voltages in the case of FIG. 26A, the electron beams EB emitted from the electron beam sources E112, E222, and E232 in the memory unit MU2 are respectively incident on the electron beam detecting means D112, D222, and D232 of the corresponding unit elements U.

Figure 27A:
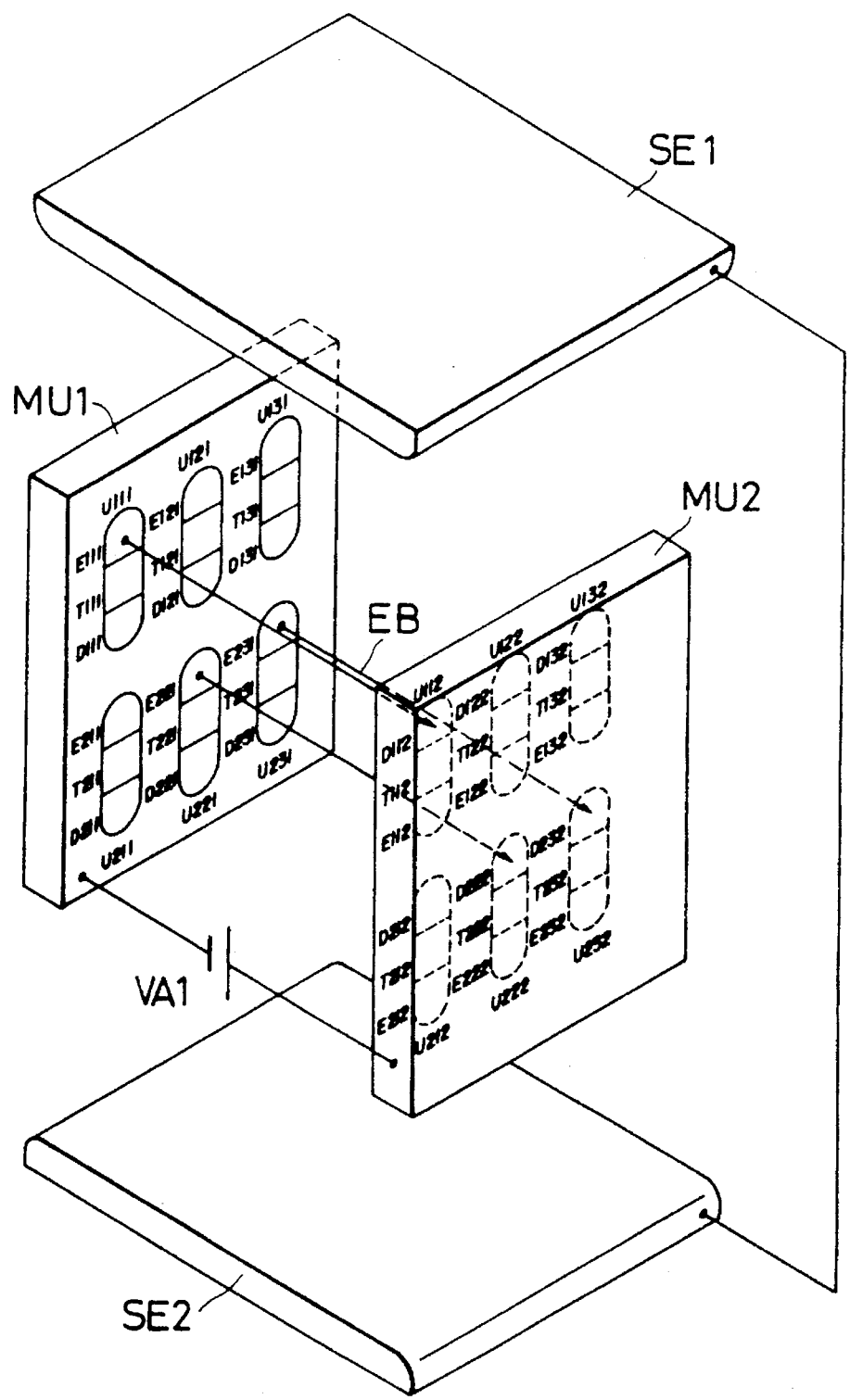
Figure 27B:
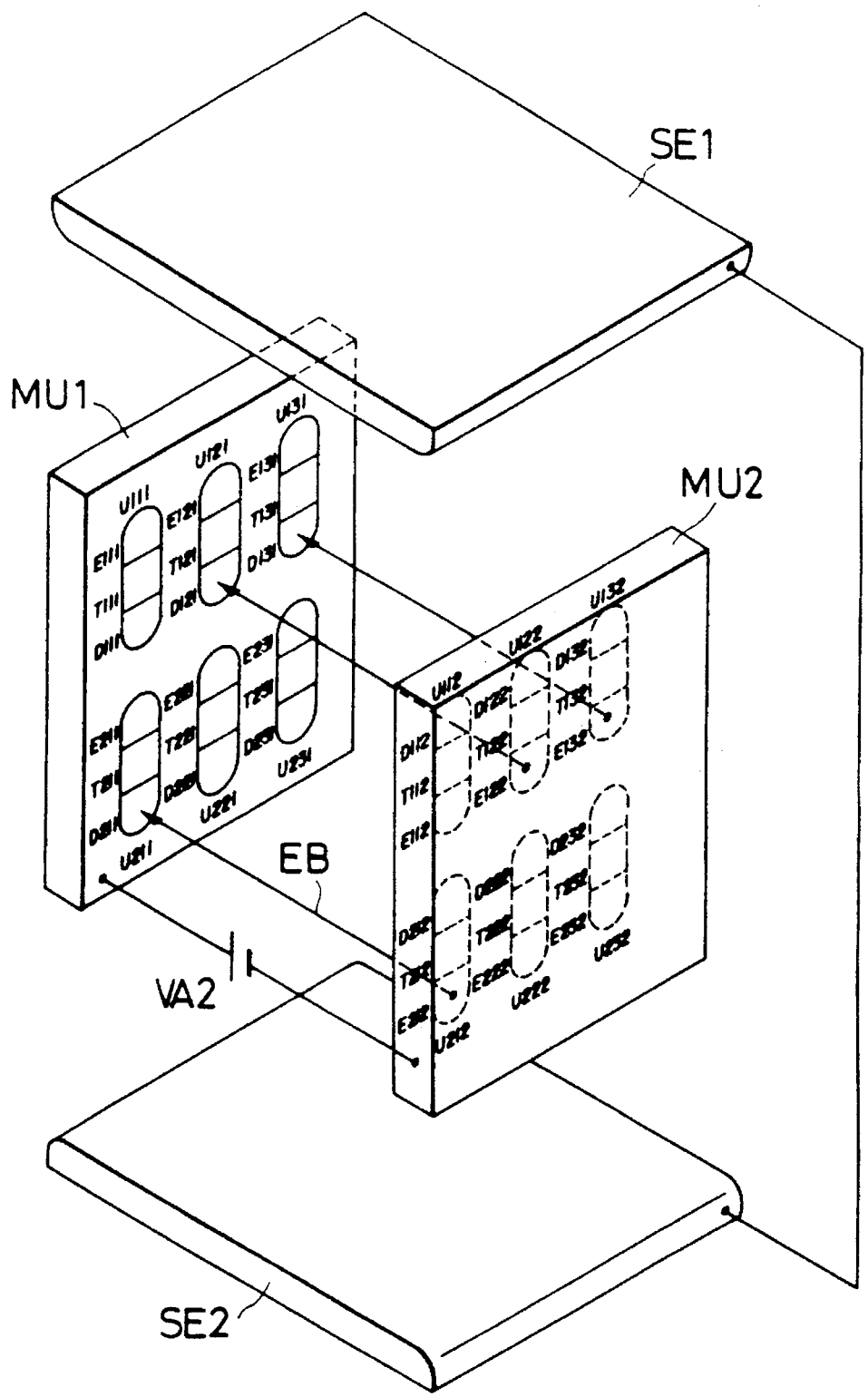

FIGS. 27A and 27B show the NOP cycle following the NOT cycle shown in FIGS. 26A and 26B. In the state of FIG. 27A, the memory unit MU1 is set in the G mode. The electron beams EB emitted from the electron beam sources E111, E221, and E231, which have not been incident on the corresponding detecting means in the previous cycle, are emitted, and other unit elements are kept disabled. Therefore, the logical information stored in the NOP cycle in FIGS. 27A and 27B is given as "1, 0, 0, 0, 1, 1" in the order of (U111, U112), (U121, U122), (U131, U132), (U211, U212), (U221, U222), and (U231, U232). When the NOT cycle in FIGS. 26A and 26B is completed from the state of FIGS. 25A and 25B, all logical values are inverted.

Figure 28:
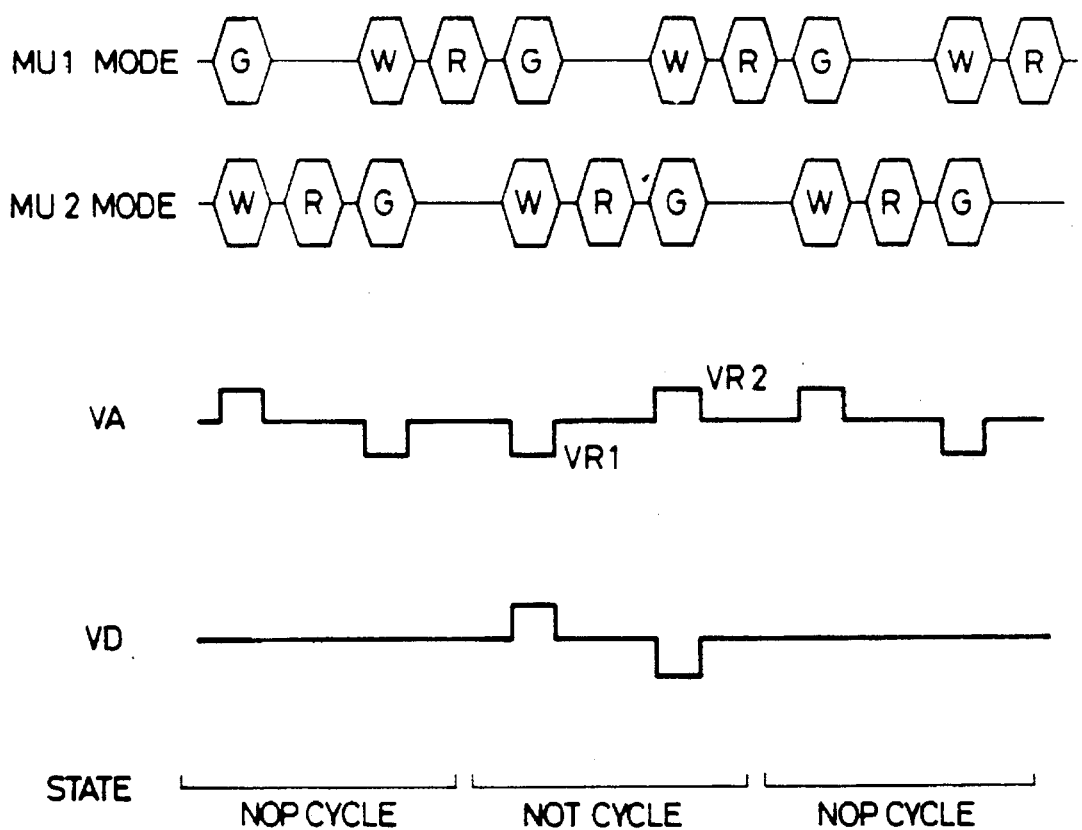
FIG. 28 is a timing chart for explaining the operations shown in FIGS. 25A and 25B to FIGS. 27A and 27B.

FIG. 28 is a timing chart of the acceleration and deflection voltages applied to the memory units MU1 and MU2 in the W, R, and G modes when the cycles are continuously performed. When the above operations are performed in accordance with the above timing chart, parallel storage and parallel inversion operations of the two-dimensional logical value information can be performed at high speed.

The above description exemplifies reverse acceleration and deflection of the electron beam EB by the electric field so as to perform logical inversion operations. However, the electron beam EB may be deflected by a magnetic field. The electron beam EB emitted from the electron beam source E can be incident on the electron beam detecting means D of the corresponding unit element U.

In the above description, one cycle includes the G mode of the memory unit MU1 and the subsequent G mode of the memory unit MU2. Therefore, the operation is exemplified in a mode wherein the electron beams EB are emitted from the memory unit MU2 in the NOT cycle, as shown in FIG. 26B. However, in practice, the operation in FIG. 26B need not be performed. Only the operation of the NOT cycle in FIG. 26A can be performed, and the next NOP cycle is initiated to perform logical inversion.

In addition, the memory unit MU1 opposes the memory unit MU2. However, such a disposition is not essential in the present invention. If an arrangement is assured wherein the corresponding unit elements of the memory units can exchange the electron beams by using an electromagnetic field or any other means and the beams can be externally controlled such that the electron beams emitted from the electron beam sources of one memory unit can be incident on the electron beam detecting means of the other memory unit, such a modification can be made within the spirit and scope of the invention.

As described above in detail, in the memory device for performing logic inversion operations, two-dimensional information is stored in the memory device, or all pieces of information are subjected to parallel logical inversion at high speed. This memory device can be effectively used for especially image processing.

Figure 29A:
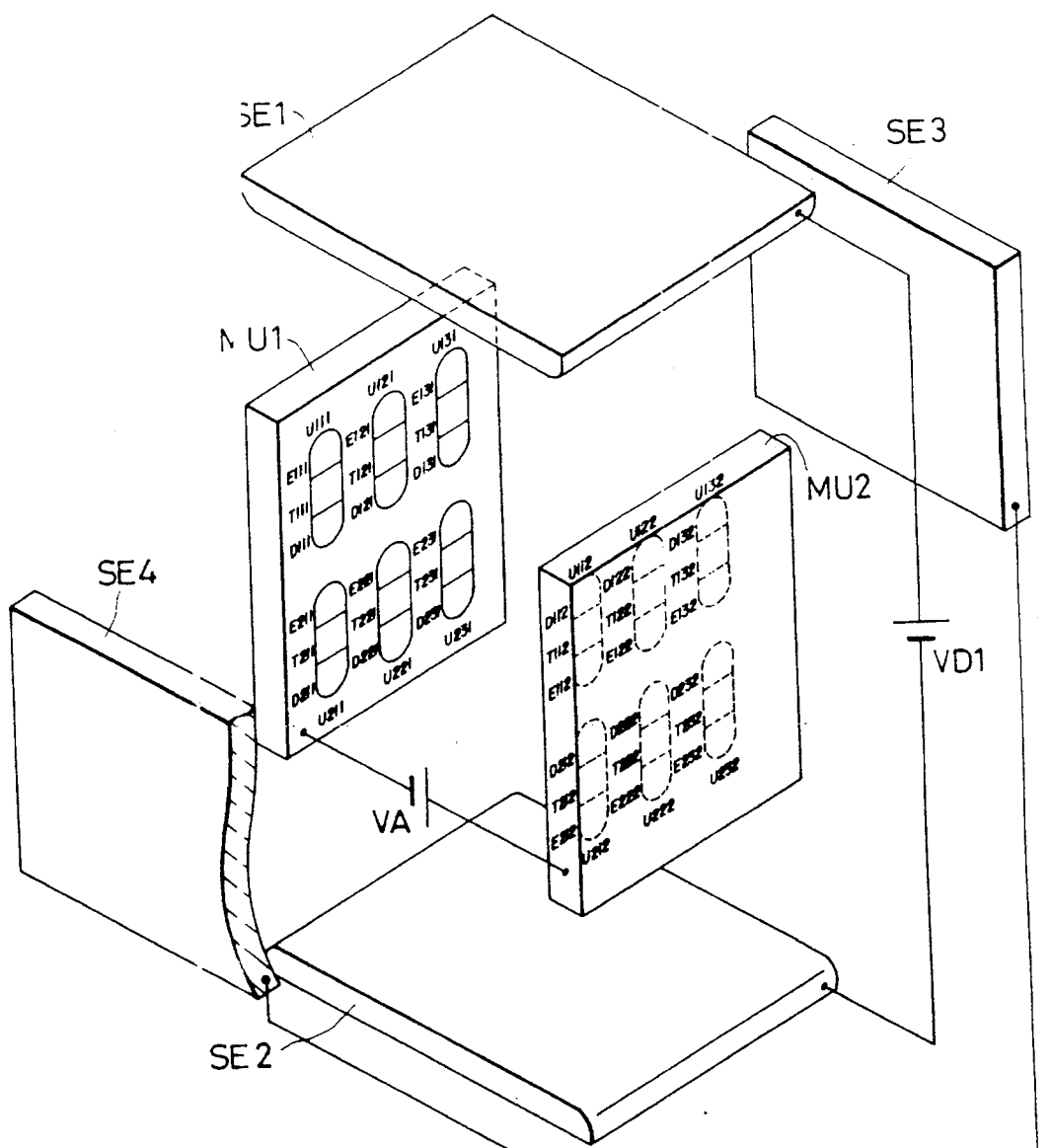
FIGS. 29A and 29B are schematic views showing still another modification of the memory device shown in FIGS. 16A and 16B.
Figure 29B:
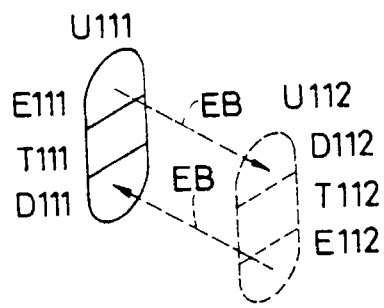

FIGS. 29A and 29B show still another modification of the memory device shown in FIGS. 16A and 16B, exemplifying a memory device having a logical operation function for performing various logical operations by controlling two-dimensional deflection of electron beams.

The same reference numerals as in FIGS. 16A and 16B denote the same parts in FIGS. 29A and 29B.

The memory device of this modification comprises memory units MU1 and MU2 including a plurality of unit elements U each consisting of an electron beam detecting means D, a driving means T, and an electron beam source E. The memory units MU1 and MU2 oppose each other. For the sake of simplicity, referring to FIG. 29A, the memory units MU1 and MU2 comprise 2 (row)×3 (column) matrix memory units consisting of unit elements U111, U121, U131, U211, U221 and U231, and unit elements U112, U122, U132, U212, U222 and U232, respectively. The unit elements U are formed by semiconductor techniques such as epitaxial growth and photolithography and can have a very high packing density.

A power source VA is arranged between the memory units MU1 and MU2. The potential and the polarity of the power source VA are variable. Deflection electrodes SE1 and SE2 as electromagnetic field generating means are arranged above and below the memory units MU1 and MU2. A power source VD is arranged between the deflection electrodes SE1 and SE2. The potential and polarity of the power source VD are variable. Deflection electrodes SE3 and SE4 as the electromagnetic generating means are arranged to the left and right of the memory units MU1 and MU2. A deflection power source VD2 is arranged between the deflection electrodes SE3 and SE4. The potential and polarity of the deflection power source VD2 are variable.

FIG. 29B is an enlarged view showing the positional relationship between the unit element U111 arranged in the memory unit MU1 shown in FIG. 29A and the unit element U112 arranged in the memory unit MU2 shown in FIG. 29A. The unit element U111 consists of an electron beam source E111, a driving means T111, and an electron beam detecting means D111. The unit element U112 consists of an electron beam source E112, a driving means T112, and an electron beam detecting means D112.

The memory units MU1 and MU2 have the same structure and function as those in FIG. 23. A description concerning the memory units MU1 and MU2 will be omitted.

The logical operation function of the memory device in this modification will be described below. FIG. 29B is an enlarged view of the unit elements U111 and U112 arranged on the corresponding memory units MU shown in FIG. 29A. An electron beam EB emitted from the electron beam source E111 of the unit element U111 is incident on the electron beam detecting means D112 in the unit element U112. Similarly, an electron beam EB emitted from the electron beam source E112 in the unit element U112 is incident on the electron beam detecting means D111 in the unit element U111. These beam radiation operations can be performed without using a deflecting means.

In this modification shown in FIGS. 29A and 29B, one unit element in the memory unit MU2 opposite to the memory unit MU1 and one unit element in the memory unit MU1 can deal with 1-bit information. This information represents a logical value, i.e., "1" or "0". The W, R, and G modes of the memory unit MU1 and then the W, R, and G modes of the memory unit MU2 constitute one cycle. One cycle can be selected from an NOP cycle for holding the logical value obtained upon completion of the previous cycle, an NOT cycle for inverting the logical value obtained upon completion of the previous cycle, a SHIFT cycle for shifting information stored in the memory units MU, an OR cycle for simultaneously performing logical additions of at least two pieces of information stored in the memory units MU, and an AND cycle for simultaneously performing logical multiplications of at least two pieces of information stored in the memory units.

The NOP cycle in the modification of FIGS. 29A and 29B will be described with reference to FIGS. 25A and 25B. In the NOP cycle, the deflection electrodes are not used. For illustrative convenience, the electrodes SE3 and SE4 in FIGS. 29A and 29B are supposed to be omitted when the NOP cycle is described with reference to FIGS. 25A and 25B. FIG. 25A shows a state wherein the memory unit MU1 is set in the G mode and the memory unit MU2 is set in the W mode. Electron beams EB are emitted from, e.g., electron beam sources E121, E131, and E211 in the memory unit MU1 according to information obtained upon completion of the previous cycle. No voltage is applied to the deflection electrodes SE1 and SE2. The electron beams EB are accelerated by the acceleration electric field generated by the acceleration voltage VA and applied from the memory unit MU1 to the memory unit MU2. The accelerated electron beams reach the electron beam detecting means D122, D132, and D212. FIG. 25B shows a subsequent state of FIG. 25A. In the state of FIG. 25B, the memory unit MU2 is set in the G mode, and the memory unit MU1 is set in the W mode. In the unit elements U111, U112, . . . , if the electron beam EB is incident in the W mode, the electron beam EB in the G mode following the R mode is not emitted. If the electron beam EB is not emitted in the W mode, the electron beam EB is output in the G mode following the R mode. Referring to FIG. 25B, the electron beams EB emitted from the electron beam sources E112, E222, and E232 are accelerated by the acceleration electric field generated by the acceleration voltage VA2 and applied from the memory unit MU2 to the memory unit MU1 since the electron beams EB are not incident on the electron beam detecting means D112, D222, and D232 in FIG. 25A. The accelerated beams are respectively incident on the corresponding electron beam detecting means D111, D221, and D231. If the next cycle is the NOP cycle, the state in FIG. 25A is restored. The state in FIGS. 25A and 25B are maintained if the NOP cycle continues.

The pair of unit elements processing one bit can be set in one of the operation states. The first operation state is defined such that the electron beam EB is emitted from the unit element in the memory unit MU1 and the electron beam is not emitted from the unit element in the memory unit MU2. The second operation state is defined such that the electron beam EB is emitted from the unit element in the memory unit MU2 and the electron beam is not emitted from the unit element in the memory unit MU1. For example, if the electron beam EB is emitted from the memory unit MU1 and the electron beam EB is not emitted from the memory unit MU2, a logic value of "1" is set. If the electron beam is emitted from the memory unit MU2 and the electron beam is not emitted from the memory unit MU1, a logic value of "0" is set. In this case, as shown in FIGS. 25A and 25B, information "0, 1, 1, 1, 0, 0" is set in the order of pairs of unit elements (U111, U112), (U121, U122), (U131, U132), (U211, U212), (U221, U222), and (U231, U232).

The NOT cycle in the modification of FIGS. 29A and 29B will be described with reference to FIGS. 26A and 26B. In FIG. 26A, the memory unit MU1 is set in the G mode. The electron beams EB are emitted from the electron beam sources E121, E131, and E211 in correspondence with the information in the same manner as in FIGS. 25A and 25B. In this case, a reverse-biased acceleration voltage VR1 is applied between the memory units MU1 and MU2. A reverse-biased acceleration electric field is applied from the memory unit MU2 to the memory unit MU1. A deflection voltage is applied between the deflection electrodes SE1 and SE2 and thus a deflection electric field between the electrode SE1 and SE2 is formed. An electric field induced by these voltages is properly controlled to emit the electron beam EB from the electron beam source E of each unit element U onto the electron beam detecting means D of the corresponding unit element U in the memory unit MU1. For example, the electron beams EB emitted from the electron beam sources E121, E131, and E211 can be respectively incident on the electron beam detecting means D121, D131, and D211. As described above, when the G mode is set in the memory unit MU, the electron beam detecting means D of each unit element U is set in a state as if it is set in the W mode. Therefore, the charge can be accumulated again in the electron beam detecting means D with this incident electron beam EB.

FIG. 26B shows a subsequent state of FIG. 26A. In the state of FIG. 26B, the memory unit MU2 is set in the G mode. The polarity of the reverse-biased acceleration voltage VR2 and the polarity of the deflection voltage VD2 are reversed from the polarities of the voltages in the case of FIG. 26A, the electron beams EB emitted from the electron beam sources E112, E222, and E232 in the memory unit MU2 are respectively incident on the electron beam detecting means D112, D222, and D232 of the corresponding unit elements U.

The NOP cycle shown in FIGS. 27A and 27B can be performed in the modification of FIGS. 29A and 29B after the NOT cycle shown in FIGS. 26A and 26B is completed. In the state of FIG. 27A, the memory unit MU1 is set in the G mode. The electron beams EB emitted from the electron beam sources E111, E221, and E231, which have not been incident on the corresponding detecting means in the previous cycle, are emitted, and other unit elements are kept disabled. Therefore, the logical information stored in the NOP cycle in FIGS. 27A and 27B is given as "1, 0, 0, 0, 1, 1" in the order of (U111, U112), (U121, U122), (U131, U132), (U211, U212), (U221, U222), and (U231, U232). When the NOT cycle in FIGS. 26A and 26B is completed from the state of FIGS. 25A and 25B, all logical values are inverted.

Figure 30A:
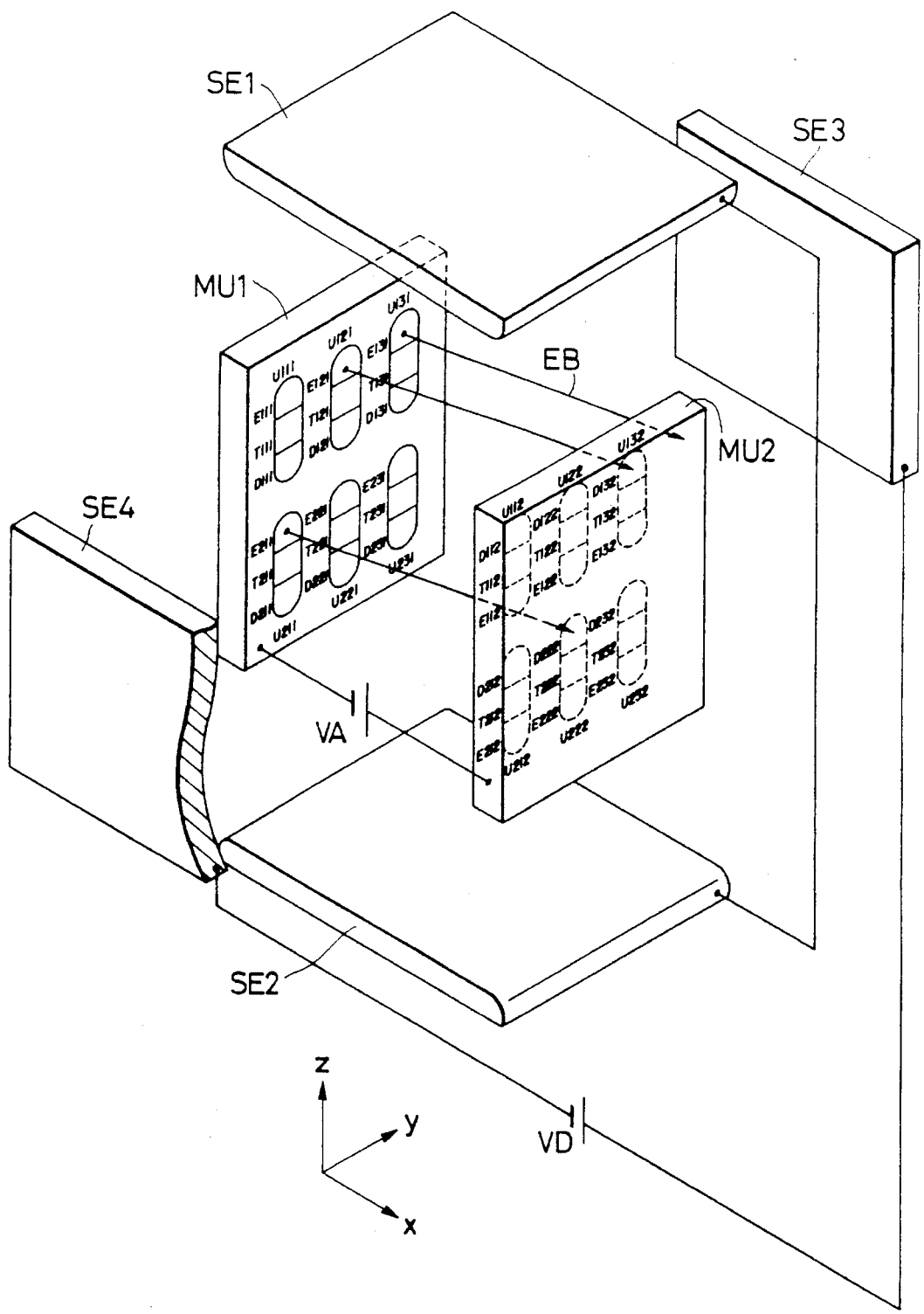
Figure 30B:
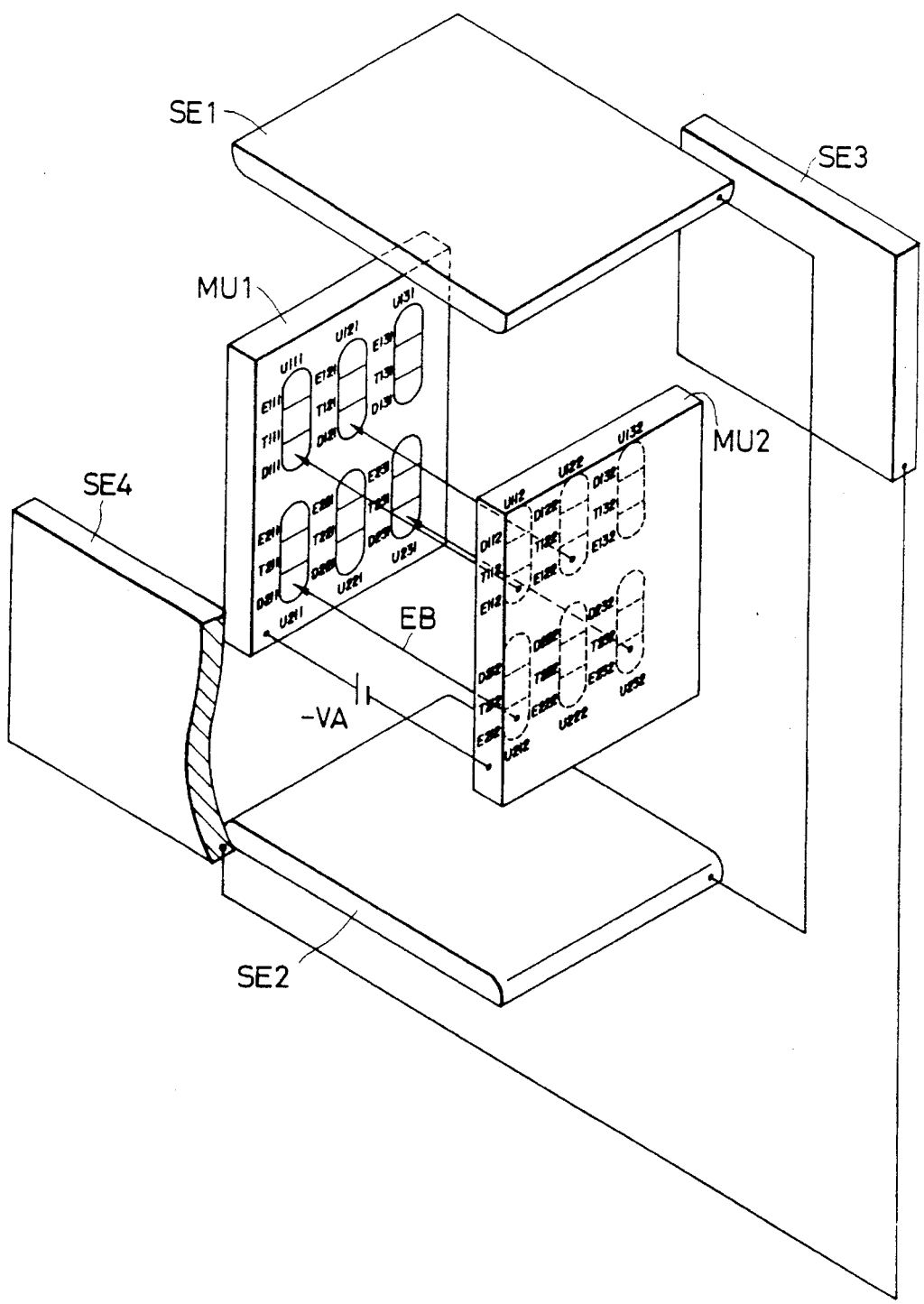

FIGS. 30A and 30B show the SHIFT cycle in the modification of FIGS. 29A and 29B. Referring to FIG. 30A, the memory unit MU1 is set in the G mode, and the memory unit MU 2 is set in the W mode. The electron beams EB are emitted from the electron beam sources E121, E131, and E211 corresponding to the storage information in the same manner as in FIGS. 25A and 25B. In this case, the acceleration voltage VA is applied between the memory units MU1 and MU2 to generate an acceleration electric field from the memory unit MU1 to the memory unit MU2. A proper deflection voltage VD is applied between the deflection electrodes SE3 and SE4 to generate a y-direction deflection electric field between the memory units MU1 and MU2. The electron beams EB emitted from the memory unit MU1 are deflected by this electric field and are incident on the electron beam detecting means D adjacent by one to those in the NOP mode. More specifically, the electron beams EB emitted from the electron beam sources E121 and E211 are respectively incident on the electron beam detecting means D132 and D222. The electron beam EB emitted from the electron beam source E121 is not incident on any electron beam detecting means D.

FIG. 30B shows a subsequent state of FIG. 30A. In the state of FIG. 30B, the memory unit MU2 is set in the G mode. In this case, the acceleration voltage −VA between the memory units MU1 and MU2 has a polarity opposite to that in FIG. 30A. In this case, the deflection voltage is not applied between the deflection electrodes SE3 and SE4. The electron beams EB emitted from the electron beam sources E112, E122, E212, and E232 are respectively incident on the electron beam detecting means D111, D121, D211, and D232. In this manner, when the NOP cycle is initiated after the SHIFT cycle shown in FIGS. 30A and 30B, information is shifted by one column as compared with the state before shifting. Referring to FIGS. 30A and 30B, the information accumulated in the element pairs (U131, U132) and (U231, U232) is lost. After the SHIFT cycle is completed, information of "0" is accumulated in the element pairs (U111, U112) and (U211, U212). This phenomenon occurs in a conventional shift register and is not limited to this modification of the present invention.

Figure 31A:
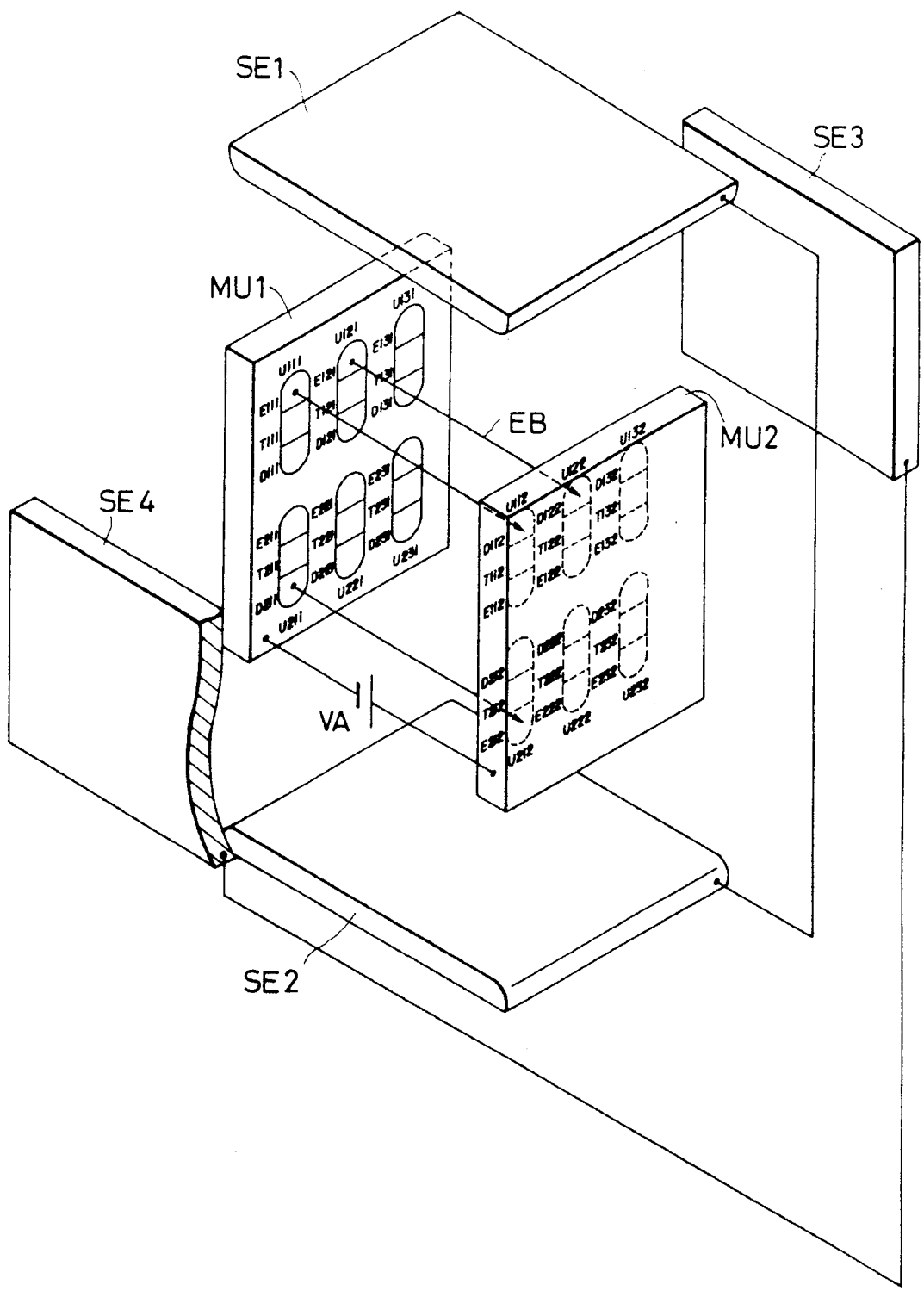

The operations in the AND and OR cycles will be described with reference to FIGS. 31A to 33B and FIG. 10. Referring to FIG. 31A, the memory unit MU1 is set in the G mode, and the memory unit MU2 is set in the W mode. The acceleration power voltage VA is applied between the memory units MU1 and MU2 to generate an acceleration electric field from the memory unit MU1 to the memory unit MU2. A potential difference between the deflection electrodes SE1 and SE2 and a potential difference between the deflection electrodes SE3 and SE4 are set to zero. In this case, when the electron beams EB are emitted from, e.g., the electron beam sources E111, E121, and E211 corresponding to the information accumulated in the memory unit MU1, these electron beams EB are not deflected and are incident on the electron beam detecting means D112, D122, and D212, respectively.

Figure 31B:
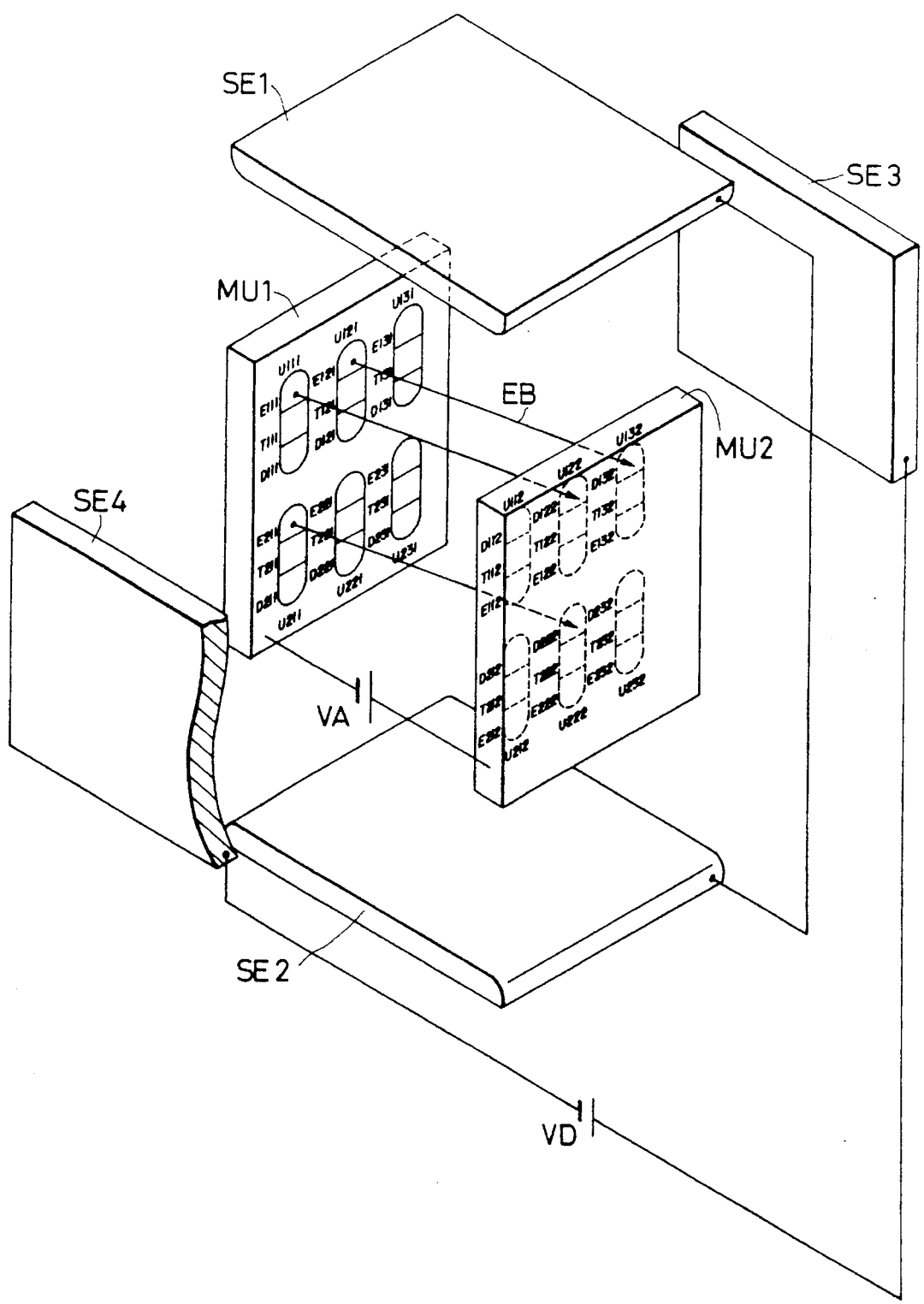

When a proper voltage VD is applied between the deflection electrodes SE3 and SE4, as shown in FIG. 31B, the deflection electric field is generated from the deflection electrode SE4 to the deflection electrode SE3, thereby deflecting the electron beams EB. The electron beams EB emitted from the electron beam sources E111, E121, and E211 are respectively incident on the electron beam detecting means D122, D132, and D222.

As described above, the charges corresponding to the amounts of current of the electron beams incident on the electron beam detecting means are stored in the corresponding insulating layers INS. Therefore, after the operations in FIGS. 31A and 31B, information of one unit element of the memory unit MU1 is superposed on that of another element thereof, and the superposed insulation is accumulated in the corresponding unit element U in the memory unit MU2 in the form of charge. For example, when the electron beams EB are sequentially incident from the electron beam sources E111 and E121 onto the electron beam detecting means D122, and the electron beam EB is incident from only the electron beam source E121 onto the electron detecting means D132, the charge of the electron beam detecting means D122 is twice that of the electron beam detecting means D132.

In the read operation of the information in the electron beam detecting means D, no readout can be performed unless the actual accumulative amount of charge exceeds the threshold value. By utilizing the threshold value, the logical addition or multiplication for the information from two unit elements in the memory unit MU1 is performed in the corresponding unit element U in the memory unit MU2.

FIG. 10 shows the relationship between the threshold value, the accumulative amount of charge, the logical addition, and the logical multiplication, as previously mentioned. Referring to FIG. 10, QTH is an amount of threshold value charge, and Qor and Qand are accumulative amounts of charge induced by the electron beam EB incident in one unit element of the memory unit MU1 when the logical addition and multiplication are to be performed. A case I indicates that no electron beam EB is incident from two unit elements of the memory unit MU1. A case II indicates that an electron beam is incident from one of the unit elements of the memory unit MU1. A case III indicates that the electron beams are respectively incident from the two unit elements of the memory unit MU1.

As is apparent from FIG. 10, an amount of current of the electron beam EB incident from one unit element U in the memory unit MU1 onto the electron beam detecting means D or the amount of charge induced by the electron beam EB is controlled to select the logical addition or multiplication. More specifically, in order to perform a logical addition, if the amount Qor of charge induced in the electron beam detecting means D upon radiation of the electron beam EB of one cycle is set to be larger than the amount QTH of threshold value charge, the actual accumulative amount of charge exceeds the threshold value, assuming that the electron beam is incident on the electron beam detecting means by at least one of the two cycles. In addition, in order to perform a logical multiplication, the amount Qand of charge induced by the electron beam detecting means D upon radiation of the electron beam of one cycle is smaller than the charge QTH of the threshold value charge but larger than ½ the charge QTH of the threshold value charge, the actual accumulative amount of charge cannot exceed the threshold value, assuming that the electron beams of all cycles, i.e., two cycles are not incident on the electron beam detecting means D.

In order to control the amount of current of the electron beam EB incident on the electron beam detecting means D, the amount of current of the electron beam EB output from the electron beam source E belonging to each unit element in the memory unit is controlled. For this purpose, the variable resistor RV shown in FIG. 24 is adjusted.

Figure 32A:
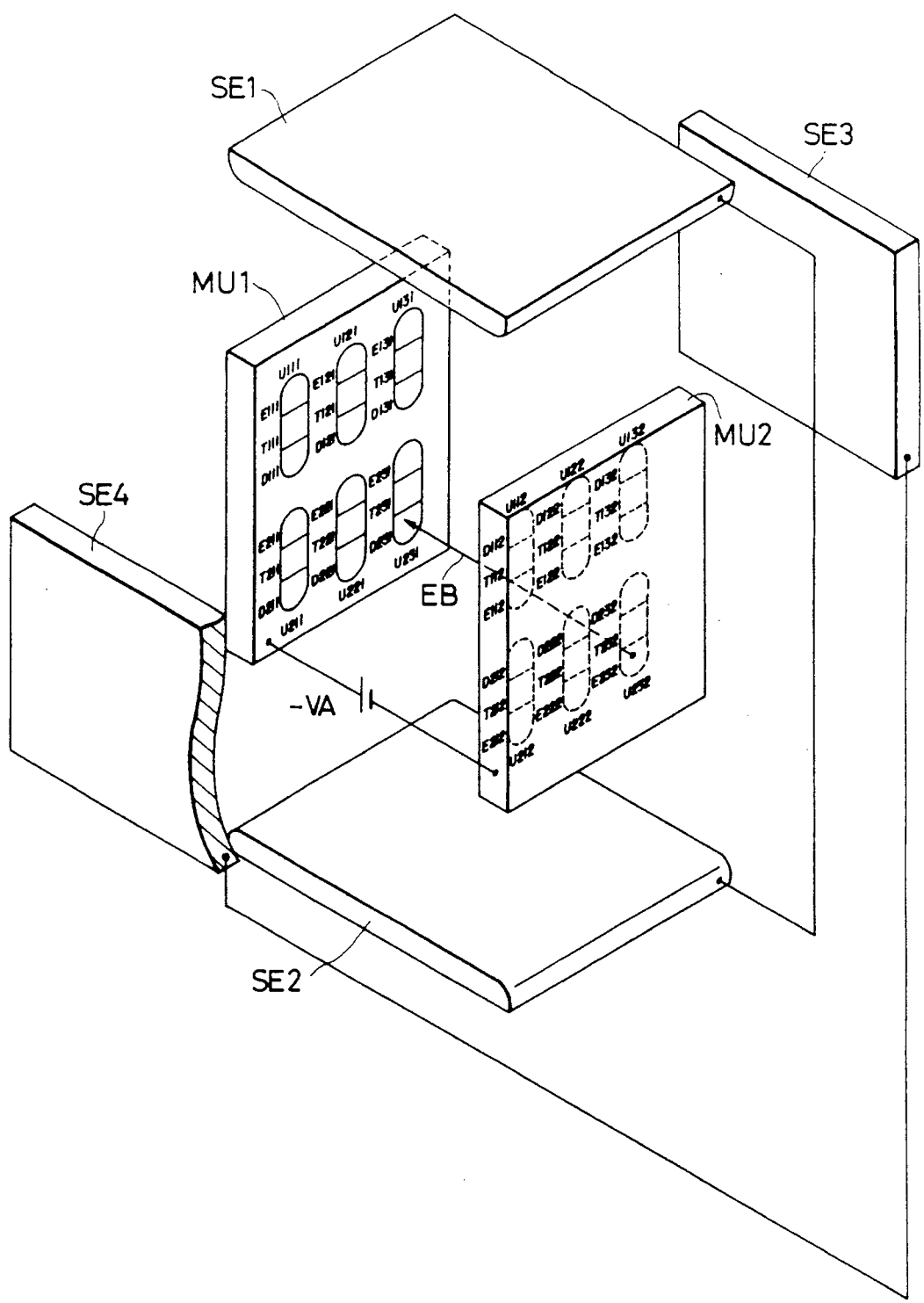

As is apparent from the above description, the logical addition or multiplication can be performed by the operations in FIGS. 31A and 21B, utilizing the threshold value QTH. FIG. 32A shows a state wherein the memory unit MU2 is set in the G mode upon completion of the operations in FIGS. 31A and 31B when the threshold value charge QTH and the amount of charge induced by the incident electron beam EB are set to allow a logical addition of FIG. 10. Only the electron beam EB is emitted from the electron beam source E232 and incident on the electron beam detecting means D231.

Figure 32B:
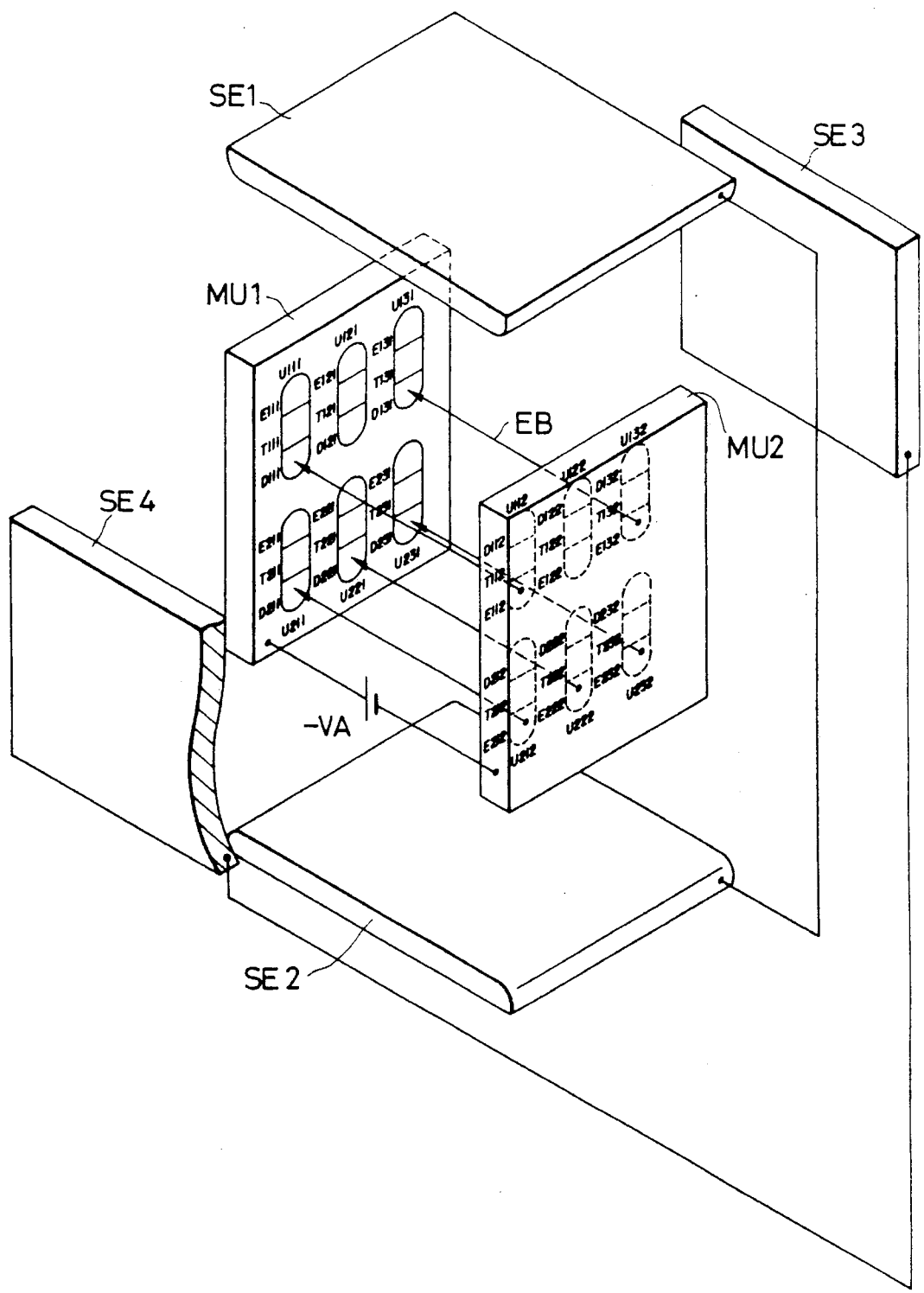

FIG. 32B shows a state wherein the threshold value and the actual accumulative amount of charge by the electron beam are set to allow a logical multiplication. In this case, the electron beams EB are emitted from the electron beam sources E112, E132, E212, E222, and E232 and incident on the electron beam detecting means D111, D131, D211, D221, and D231.

Figure 33A:
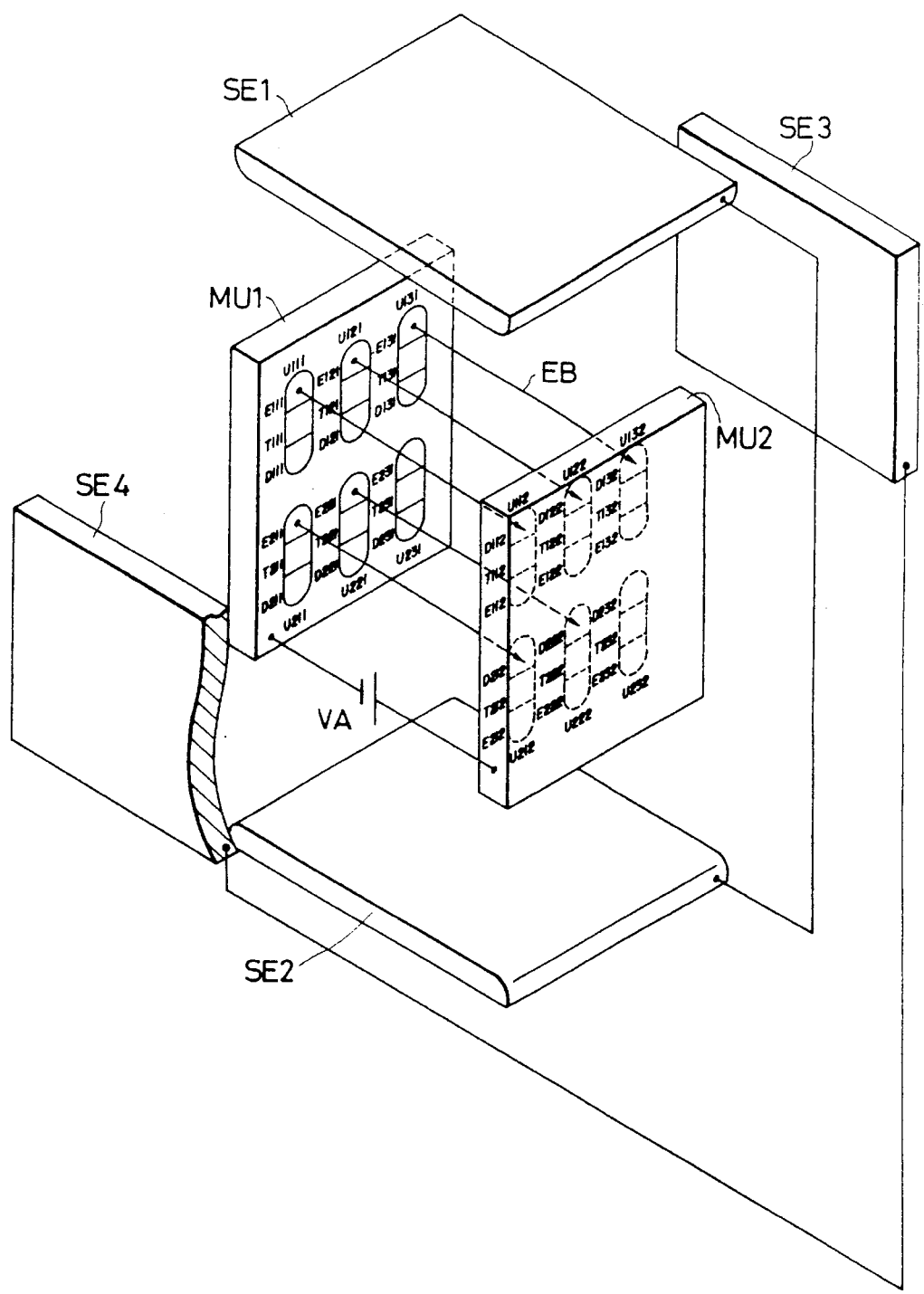
Figure 33B:
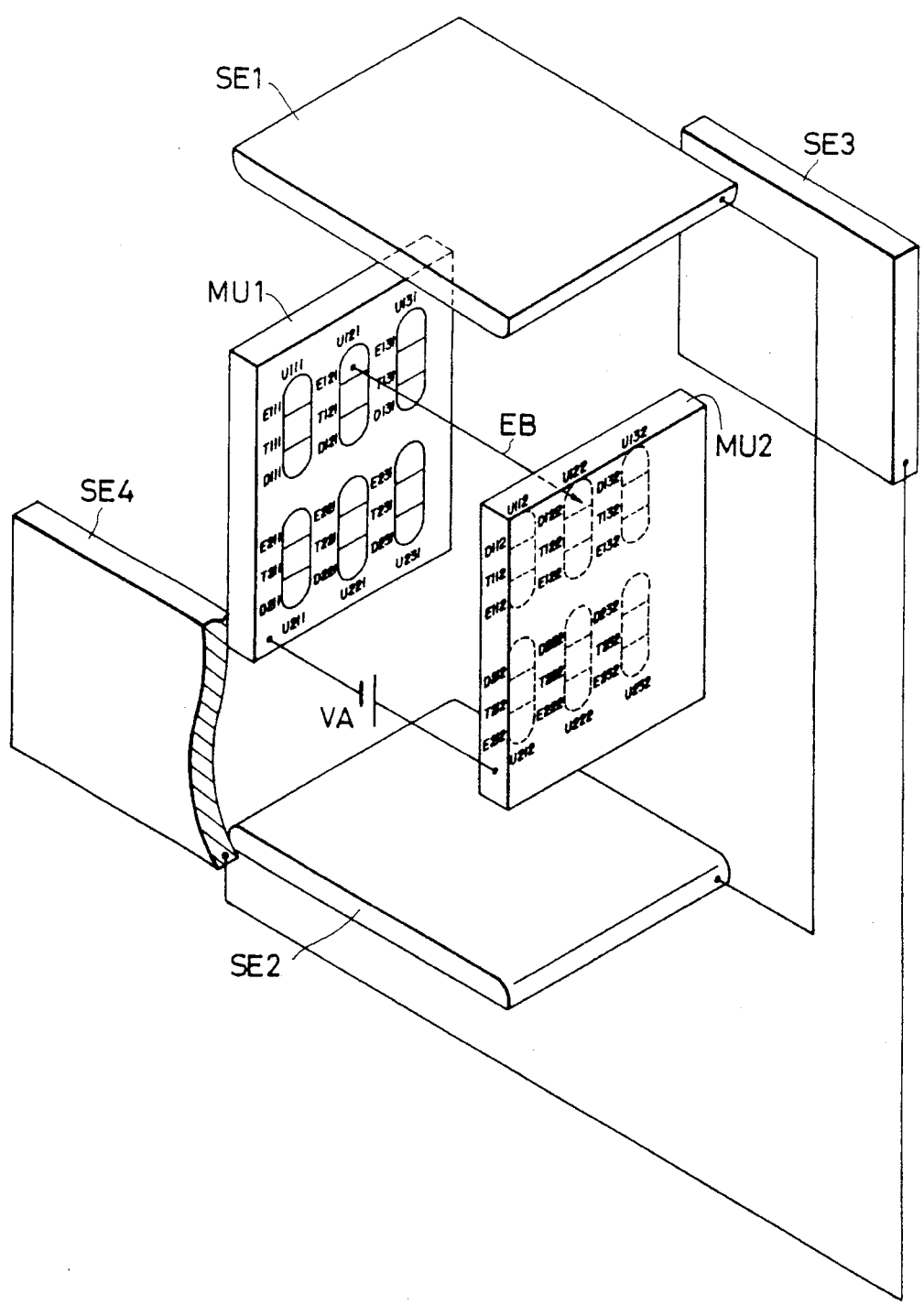

FIGS. 33A and 33B show a state wherein the memory unit MU1 is set in the G mode in the next NOP cycle of FIGS. 32A and 32B. Referring to FIGS. 31A and 31B, the logical additions or multiplications between the unit element pairs of U111 and U121, U121 and U131, U211 and U221, and U221 and U222 are accumulated in the unit elements U121, U131, U221, and U231 of FIGS. 33A and 33B, respectively.

Figure 34:
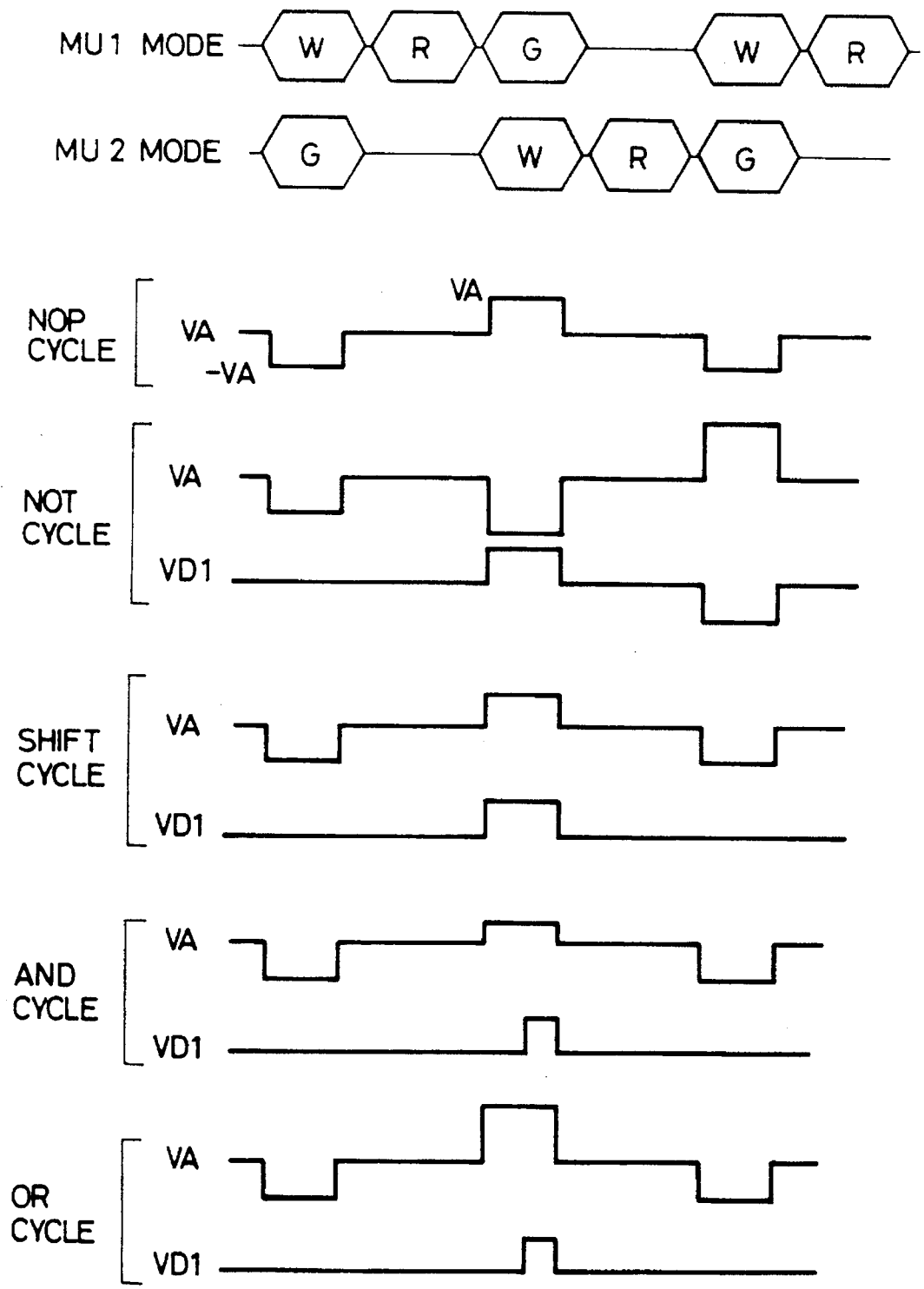
FIG. 34 is a timing chart for explaining the operations of the memory device shown in FIGS. 29A and 29B.

FIG. 34 is a timing chart showing the modes of the memory units MU1 and MU2, the acceleration voltage VA, and the deflection voltage VD in the NOP, NOT, SHIFT, AND, and OR cycles. Referring to FIG. 34, the AND and OR modes are selectively set such that the acceleration voltage VA is changed and a means whose transmittance varies according to changes in acceleration voltage is arranged on the incident surface of each electron beam detecting means D. As shown in FIG. 34, by properly controlling the modes of the memory unit MU1 and MU2, application timings of the acceleration and deflection voltage VA and VD, and the voltage values, the logical operations in the five modes can be performed.

The operations have been described with reference to the modification of FIGS. 29A and 29B. However, various changes and modifications may be made within the spirit and scope of the invention. In the SHIFT, AND, and OR cycles, the voltage is applied between the deflection electrodes SE3 and SE4 to deflect the electron beams EB in the y direction. However, the deflection direction is not limited to the y direction. A voltage may be applied to the deflection electrodes SE1 and SE2 to deflect the electron beams in the z direction. If the polarity of the deflection voltage VD is reversed, the electron beams can be deflected in a direction opposite to the illustrated direction. In addition, the beams from the unit elements in one memory unit are deflected and incident on unit elements (of the other memory unit) adjacent to the elements opposite to those in one memory unit. However, by properly selecting the deflection voltage, the electron beams from one memory unit can be incident on unit elements offset by two or more columns in the other memory unit.

In the above cycles, the memory unit MU1 is set in the G mode and the memory unit MU2 is set in the W mode. However, deflection need not be performed in these modes. In this case, deflection is performed when the memory unit MU1 is set in the W mode and the memory unit MU2 is set in the G mode.

When the AND or OR cycle is selected, the threshold value of the accumulative amount of charge for the output of the electron beam detecting means D is fixed, and the accumulative amount of charge is changed to select the logical addition or multiplication. However, the amount of current of the incident electron beam EB and the amount of charge induced thereby may be fixed, and the threshold value may be changed to select the logical addition or multiplication. In this case, a discriminator may be added to the driving means T shown in FIG. 2 to change the threshold value according to external electrical control with semiconductor techniques.

In the initial state of the NOP cycle, logical information has already accumulated in the memory unit. However, such information may be written by the following means. Information is forcibly written in each unit of the memory unit MU using the input terminal IN in FIG. 24. In this case, an information write/read electrode must be formed on the unit element U on the substrate of the memory unit MU. Another logic information writing technique is to drive end column elements U out of the unit elements two-dimensionally arranged on the memory unit MU. Information is written in one unit element column and is shifted by using the above-mentioned shift function, and the next information is written in the end unit element column. By repeating the above operations, two-dimensional information can be input to the memory unit MU.

In the modification of FIGS. 29A and 29B, the electron beams EB are deflected by an electric field. However, the electron beams may be deflected by a magnetic field within the scope of the invention.

According to the memory device having the logical operation function as described above, when the electron beams emitted according to the two-dimensional parallel information are incident on the electron beams detecting means, the deflection direction and angle and the threshold value are properly utilized to simultaneously perform operations such as charge accumulation, maintenance logical inversion, shifting, logical addition, and logical multiplication of the two-dimensional parallel information can be performed in parallel at high speed.

An application of the information transfer method and apparatus according to the present invention will be described. This application exemplifies an image forming apparatus for transferring image information by utilizing a plurality of electron beams and for forming an image according to image information.

Typical examples of conventional image forming apparatus utilizing electron beams are a vacuum tube (e.g., a CRT) and an X-Y addressing fluorescent display tube having a matrix electrode structure.

However, the CRT is driven with a single electron beam according to dot sequential driving, and brightness is unsatisfactory.

Although satisfactory brightness can be obtained in the X-Y addressing fluorescent display tube by increasing the acceleration voltage, its driver is undesirably complicated.

In the following application, the complicated X-Y matrix driver is not required to obtain an image forming apparatus with satisfactory brightness.

When the electron beams are incident on the electron beam detecting means, the charge is temporarily accumulated therein. The charge is transferred to the driving means and the driving means are turned on, thereby driving the electron beam sources. The electron beam sources emit the electron beams corresponding to the charge accumulated in the electron bee detecting means.

Two memory units are arranged in the same manner as in the previous embodiments, and the electron beams are deflected by an electric or magnetic field and are incident on different areas of the electron beam detecting means of different memory units, thereby two-dimensionally transferring the image information. The paths of the electron beams depend on the intensity of the magnetic field. The intensity of the magnetic field is properly selected to transfer the electron beams to the predetermined memory units. The above-mentioned shift operations have the same function as the X-Y matrix driver.

Figure 35:
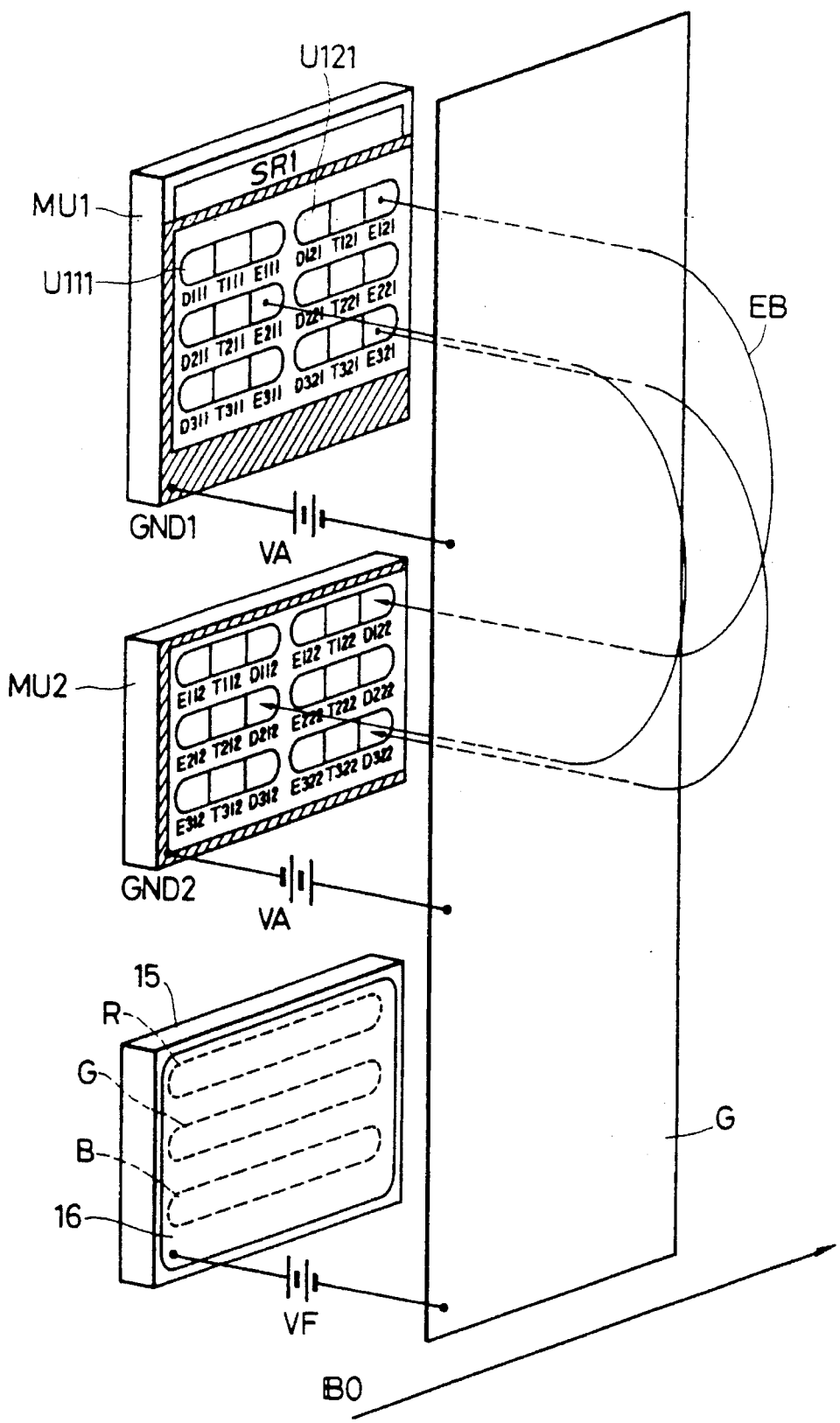
FIGS. 35 to 37 are views for explaining an image forming apparatus for transferring information with an electron beam according to still another application of the method of the present invention.
Figure 36:
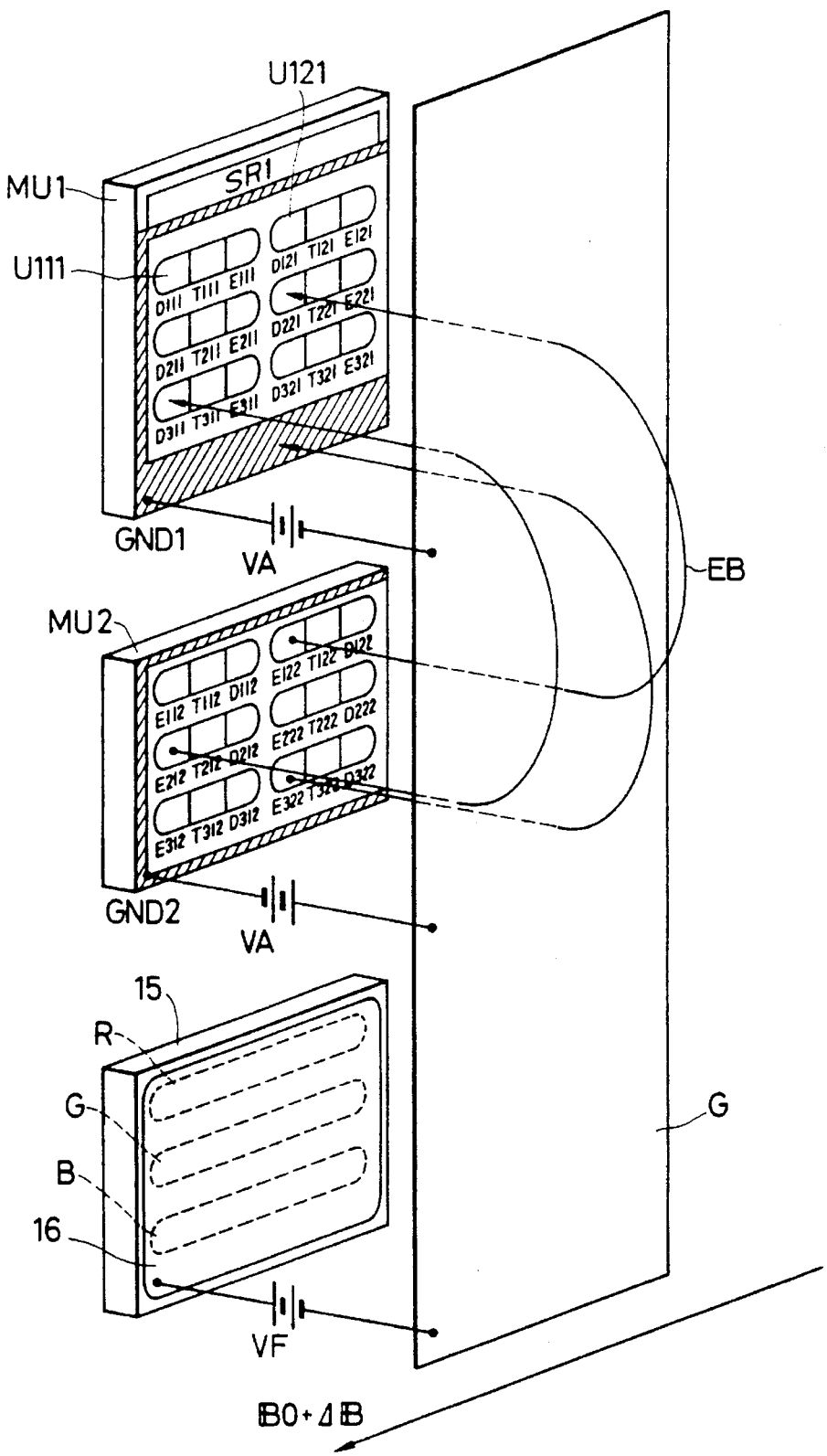
Figure 37:
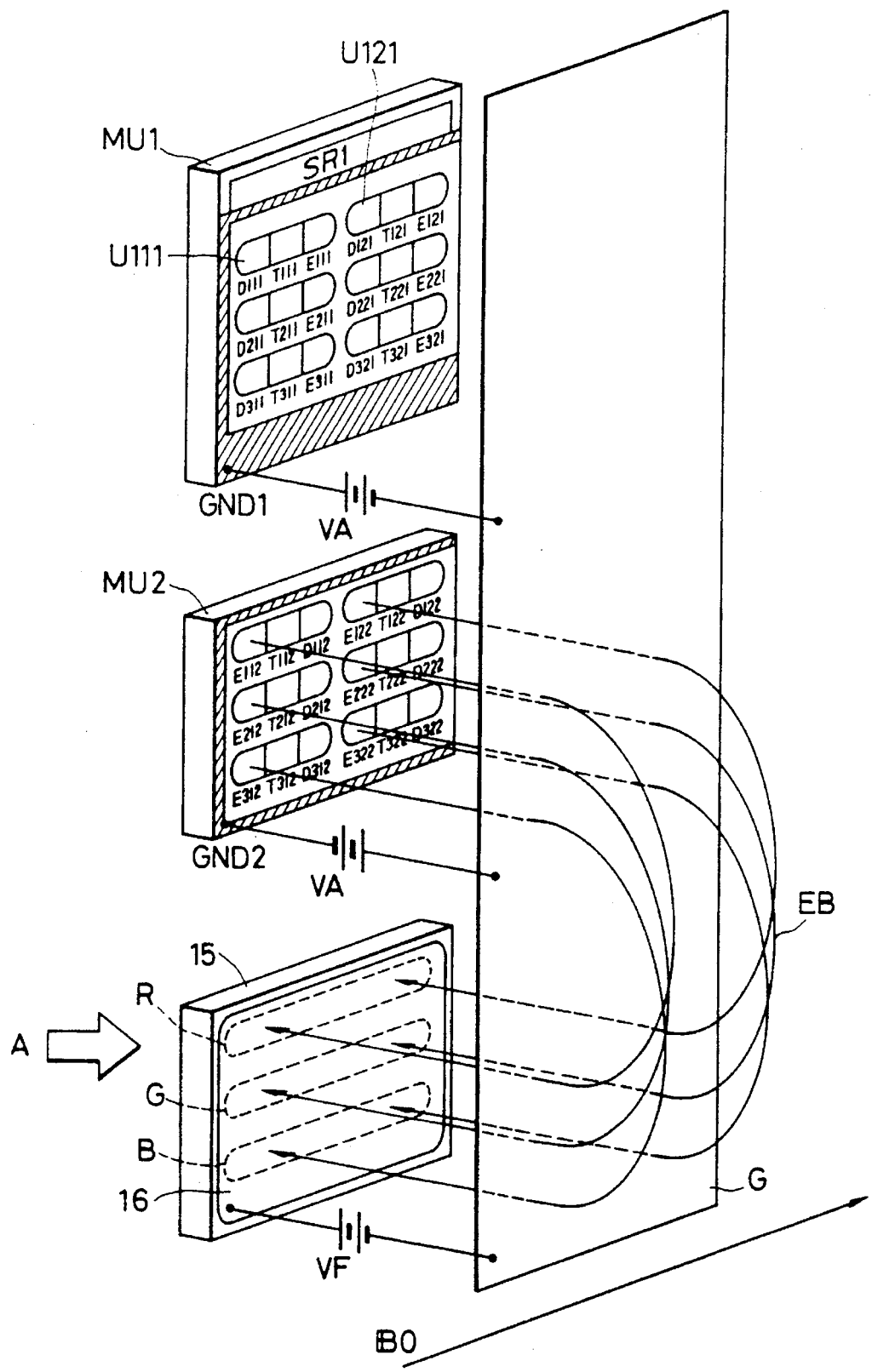

FIGS. 35 to 37 are views for explaining the image forming apparatus using the above memory units.

The structure and function of unit elements (e.g., U111) of the memory units MU1 and MU2 used in the image forming apparatus are the same as those described with reference to FIGS. 2 and 3.

Referring to FIG. 35, memory units MU1 and MU2 respectively comprise 2 (row)×3 (column) matrix memory units including unit elements U111, U121, . . . formed by semiconductor techniques such as epitaxial growth and photolithography. The unit elements can have a high density of about 1,000×1,000 pixels required for a display device. A shift register arranged in the memory unit MU1 is designed to input/output data with respect to external devices and to write information in input terminals IN of the element units U111, U112, . . . This shift register can be formed by conventional electrical circuit on a semiconductor substrate. A grid G is designed to accelerate electrons. The acceleration effect can be obtained by a lead electrode EG of the electron beam source. However, a relatively high acceleration voltage is applied, the grid G is preferred. A large number of apertures are formed in the grid G so that the electron beams EB can easily transmit therethrough. A magnetic generating means (not shown) generates a magnetic field $B0$. The intensity of the magnetic field $B0$ is set such that the electron beam EB emitted from the electron beam source E121 in the unit element U121 is incident on the electron beam detecting means D122 of the memory unit MU2.

The operation of the image forming apparatus having the arrangement described above will be described below.

Assume that charge information is accumulated in electron beam detecting means D121, D211, and D321, and is not accumulated in the remaining electron beam detecting means. In this case, the memory unit MU1 is set in the R mode, and the memory unit MU2 is set in the W mode. Electron beams EB emitted from electron beam sources E121, E211, and E321 corresponding to the information stored in the memory unit MU1 are accelerated by an electric field mainly generated by a voltage VA applied between the grid G and a ground terminal GND1. The accelerated electron beams pass through the grid G. The electron beams are rotated by the magnetic field $B0$ and pass through the grid G again. The electron beams are then accelerated again by an electric field generated by a voltage applied between a ground terminal GND2 and the grid G. The electron beams are finally incident on electron beam detecting means D122, D212, and D322. In this case, since a substantial electric field is not present on the grid G side opposite to the memory units MU1 and MU2. Therefore, the correspondence between the electron beam source E and the electron beam detecting means D primarily depends on the intensity of the magnetic field $B0$.

An operation will be described wherein information accumulated in the memory unit MU2 is transferred again to the memory unit MU1.

As shown in FIG. 36, the voltage VA between the grid G and the memory units MU1 and MU2 is reversed, the memory unit MU1 is set in the W mode, and the MU2 is set in the R mode. Under these conditions, when a magnetic field having the same intensity as that of the magnetic field $B0$ but a direction opposite to that shown in FIG. 35 is applied, the electron beams EB emitted from the electron beam sources E122, E212, and E322 are respectively incident on the electron beam detecting means D121, D211, and D321. However, if the magnetic field $B0$ is selected to be $B0+\Delta B$, the beams are shifted by one row and are incident on the electron beam detecting means D221 and D311. By controlling the intensity of the electric field, information shifting can be performed. The electron beam EB from the electron beam source E322 is incident on the area of the ground terminal GND1 and is lost in the operation of FIG. 36.

By using the above shift function, external information is received from the shift register SR1 and is continuously shifted to two-dimensionally expand information in the memory units MU1 and MU2.

The information expanded in the memory units MU2 by the above-mentioned shift function will be transferred to the faceplate 15 hereinafter.

Referring to FIG. 37, the faceplate 15 comprises a phosphor screen of stripe phosphors, i.e., R (red), G (green), and B (blue), and a metallized layer 16. As is apparent from the above description shown in FIGS. 35 and 36, information expanded in the memory unit MU2 is incident on the faceplate 15 by the voltages VA and VF and the magnetic field B0. Image information sequentially input from the shift register SR1 reaches the phosphors R, G, and B on the faceplate 15. The phosphors are excited with the electron beams EB, an image is displayed. The displayed image can be visually observed from a direction A indicated by an arrow. In this manner, according to the present invention, information is transferred between the units, and these pieces of information are properly shifted to obtain the same function as the conventional X-Y matrix driver.

Figure 38:
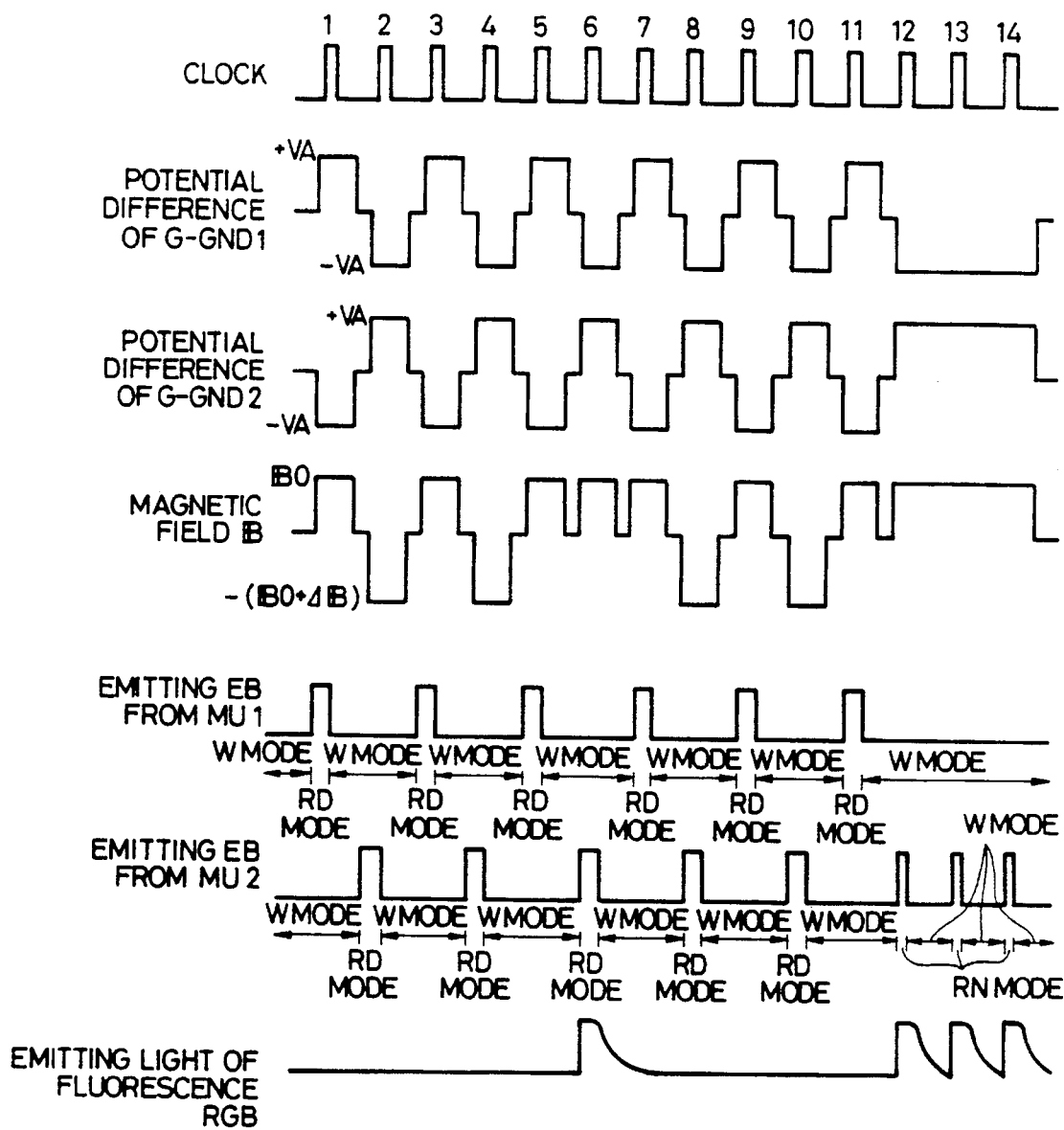
FIG. 38 is a timing chart for explaining the operation of the image forming apparatus shown in FIGS. 35 to 37.

The above operation will be described with reference to a timing chart of drive waveforms shown in FIG. 38. Referring to FIG. 38, information including new information written from the shift register SR1 to the unit elements U111 and U121 is transferred from the memory unit MU1 to the memory unit MU2 at every odd clock from the first to fifth clocks. Information is transferred from the memory unit MU2 to the memory unit MU1 at every even clock. However, since the magnetic field B is set to be B0+ΔB), one-row shifting is performed. In this case, the read mode is preferably set to be the perfect read mode RD.

Image information from the memory unit MU2 is incident as the electron beam EB onto the phosphors R, G, and B in response to the sixth clock, thereby displaying an image. The operation from the seventh clock to the 11th clock is the same as that of the first to fifth clocks.

The information can be read out in the perfect destructive read mode RD in response to the 12th clock in the same manner as in the sixth clock. As shown in the 12th, 13th, and 14th clocks of FIG. 38, the phosphors R, G, and B may be continuously excited in the partial destructive read mode RN.

Figure 39:
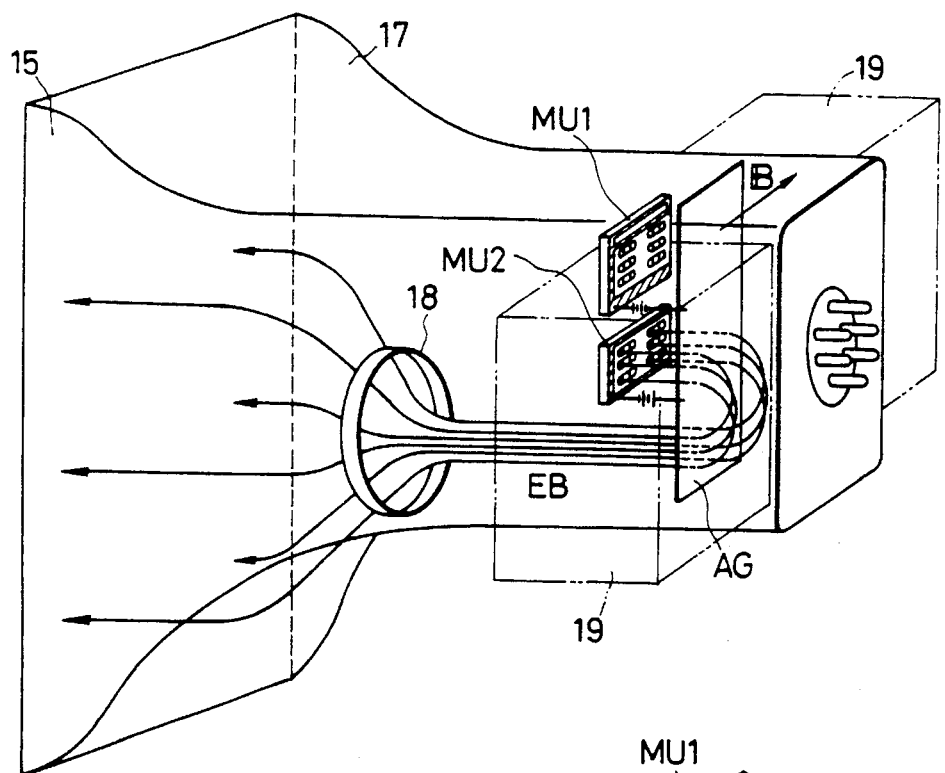
FIG. 39 is a schematic view showing another image forming apparatus utilizing the method of the present invention.

In the above application, the size of the phosphor screen is substantially the same as that of each element unit of the memory unit. However, an electronic enlargement optical system 18 may be used, as shown in FIG. 39. Referring to FIG. 39, the memory units MU1 and MU2 are arranged in a vacuum tube 17. The electron beams EB emitted from the memory unit MU2 are focused on the faceplate 15 by the electronic enlargement optical system 18.

The arrangement in FIG. 39 includes a magnetic field generating means 19 indicated by the alternate long and two short dashed line for illustrative convenience.

According to the present invention as described above, image information can be transferred and shifted between the memory units each having the electron beam source, the electron beam detecting means, and the driving means. A plurality of electron beams can simultaneously land on the phosphor screen without using a complicated matrix driver, thereby obtaining a display device with excellent brightness. In addition, by using an electronic enlargement optical system, the present invention can be applied to a large-screen display.

What is claimed is:

1. A method of performing a logical operation with an electron beam, said method including the steps of:

directing at least one of a first electron beam and a second electron beam to an electron beam detector; and performing a logical operation on the basis of an amount of charge accumulated in the electron beam detector.

2. A method according to claim 1, wherein the first electron beam is emitted from a first electron beam source and the second electron beam is emitted from a second electron beam source.

* * * * *